US009879152B2

(12) United States Patent
Arellano et al.

(10) Patent No.: US 9,879,152 B2
(45) Date of Patent: *Jan. 30, 2018

(54) BLOCK COPOLYMERS FOR DIRECTED SELF-ASSEMBLY APPLICATIONS

(71) Applicant: International Business Machines Corporation, Armonk, NY (US)

(72) Inventors: Noel Arellano, Fremont, CA (US); Joy Cheng, Taipei (TW); Teddie P. Magbitang, San Jose, CA (US); Jed W. Pitera, Portola Valley, CA (US); Daniel P. Sanders, San Jose, CA (US); Kristin Schmidt, Mountain View, CA (US); Hoa D. Truong, San Jose, CA (US); Ankit Vora, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 117 days.

This patent is subject to a terminal disclaimer.

(21) Appl. No.: 14/919,070

(22) Filed: Oct. 21, 2015

(65) Prior Publication Data

US 2017/0114246 A1    Apr. 27, 2017

(51) Int. Cl.
| | |
|---|---|
| C09D 153/00 | (2006.01) |
| C09D 169/00 | (2006.01) |
| C09D 167/04 | (2006.01) |
| C09D 125/08 | (2006.01) |
| C08G 63/64 | (2006.01) |
| C08G 63/08 | (2006.01) |
| C08J 7/04 | (2006.01) |
| C08G 64/18 | (2006.01) |
| C08F 212/08 | (2006.01) |
| G03F 7/00 | (2006.01) |

(52) U.S. Cl.
CPC ........ *C09D 169/005* (2013.01); *C08F 212/08* (2013.01); *C08G 63/08* (2013.01); *C08G 63/64* (2013.01); *C08G 64/18* (2013.01); *C08J 7/047* (2013.01); *C09D 125/08* (2013.01); *C09D 153/00* (2013.01); *C09D 167/04* (2013.01); *C09D 169/00* (2013.01); *G03F 7/0002* (2013.01); *C08J 2333/12* (2013.01); *C08J 2467/04* (2013.01); *C08J 2469/00* (2013.01)

(58) Field of Classification Search
None
See application file for complete search history.

(56) References Cited

U.S. PATENT DOCUMENTS

| | | | |
|---|---|---|---|
| 3,547,861 A | 12/1970 | Anello | |
| 5,071,921 A * | 12/1991 | Eichenauer | C08G 63/08 525/186 |
| 5,391,667 A | 2/1995 | Dellinger | |
| 6,403,744 B1 | 6/2002 | Akama et al. | |
| 8,778,201 B2 | 7/2014 | Asakawa et al. | |
| 8,822,588 B2 | 9/2014 | Terui et al. | |
| 8,900,467 B1 | 12/2014 | Chapuis et al. | |
| 8,900,562 B2 | 12/2014 | Mecozzi et al. | |
| 2004/0092686 A1 | 5/2004 | Feiring et al. | |
| 2011/0151566 A1 | 6/2011 | Hedrick et al. | |
| 2014/0148012 A1 | 5/2014 | Guillorn et al. | |
| 2015/0018476 A1 | 1/2015 | Thomson et al. | |
| 2015/0197594 A1 | 7/2015 | Xu et al. | |
| 2015/0197607 A1 | 7/2015 | Montarnal et al. | |

FOREIGN PATENT DOCUMENTS

WO    WO-2013146112    * 10/2013

OTHER PUBLICATIONS

Adhikari, Effect of Chain Extender Structure on the Properties and Morphology of Polyurethane . . . Journal of Applied Polymer Science 74(12), 1999, pp. 2979-2989.*
Balsara, et al., "Thrust 2—Cooperative Assemblies of Functional Materials", Stanford University (CPIMA), 2008, downloaded from the web Oct. 21, 2015 at http://cpima.stanford.edu/irgs/irg-1/thrust-2/.
F. Hansen, "The Measurement of Surface Energy of Polymers by Means of Contact Angles of Liquids on Solid Surfaces", copyright 2004, Finn Knut Hansen, University of Oslo.
Hexemer, et al., "A SAXS/WAXS/GISAXS Beamline with Multilayer Monochromator", J. of Physics: Conference Series 247 (2010) 012007, pp. 1-11.
J. Ilavsky, et al., "Irena: tool suite for modeling and analysis of small-angle scattering", J. Applied Crystallography, 2009, 42, 347-353.
Liu, et al., "Chemical Patterns for Directed Self-Assembly of Lamellae-Forming Block Copolymers with Density Multiplication of Features", 2013, 46, 1415-1424.
Mugemana, et al., "Metallo-supramolecular diblock copolymers based on heteroleptic cobalt(III) and nickel(II) bis-terpyridine complexes", Chem. Comm., 2010, 46, 1296-1298.
Rathore, et al., "A Photocurable, Photoluminescent, Polycarbosilane Obtained by Acyclic Diene Metathesis (ADMET) Polymerization", Macromolecules, 2009, 42, 4614-4621.
Satoh, et al., "A facile synthesis of clickable and acid-cleavable PEO for acid-degradable block copolymers", Polym. Chem., 2012, 3, 1890-1898.

(Continued)

*Primary Examiner* — David Buttner
(74) *Attorney, Agent, or Firm* — Michael R. Roberts

(57) ABSTRACT

Block copolymers (BCPs) for self-assembly applications comprise a linear fluorinated linking group L' joining a pair of adjacent blocks. A film layer comprising a BCP, which is disposed on an underlayer and in contact with an atmosphere, is capable of forming a perpendicularly oriented domain pattern when the underlayer is preferentially wetted by one domain of an otherwise identical self-assembled BCP in which all fluorines of L' are replaced by hydrogen. The BCP can be a low-chi or high-chi BCP. In a preferred embodiment, the BCP comprises a styrene-based first block, and a second block comprises a carbonate and/or ester repeat unit formed by ring opening polymerization of a cyclic carbonate and/or cyclic ester monomer. The linking group L' has a lower surface energy than each of the polymer blocks.

46 Claims, 47 Drawing Sheets

(56) References Cited

OTHER PUBLICATIONS

Schumers, et al., "A versatile strategy for the synthesis of block copolymers bearing a photocleavable junction", Polym. Chem., 2010, 1, 161-163.
Tonhauser, et al., "Stimuli-Responsive Y-Shaped Polymer Brushes Based on Junction-Point-Reactive Block Copolymers", Adv. Mater. 2012, 24, 5559-5563.
Zhao, et al., "Highly Ordered Nanoporous Thin Films from Photocleavable Block Copolymers", Macromolecules 2011, 44, 6433-644.
Zhou, et al., "Synthesis and properties of novel biodegradable triblock copolymers of poly(5-methyl-5-methoxycarbonyl-1,3-dioxan-2-one) and poly(ethylene glycol)", Polymer 45 (2004) 5459-5463.

\* cited by examiner

1. Coat
2. Optional PAB

1. Coat
2. Optional PAB

Self-Assemble

Selective domain removal

Coat

Self-assemble

Selective Domain Removal

Transfer

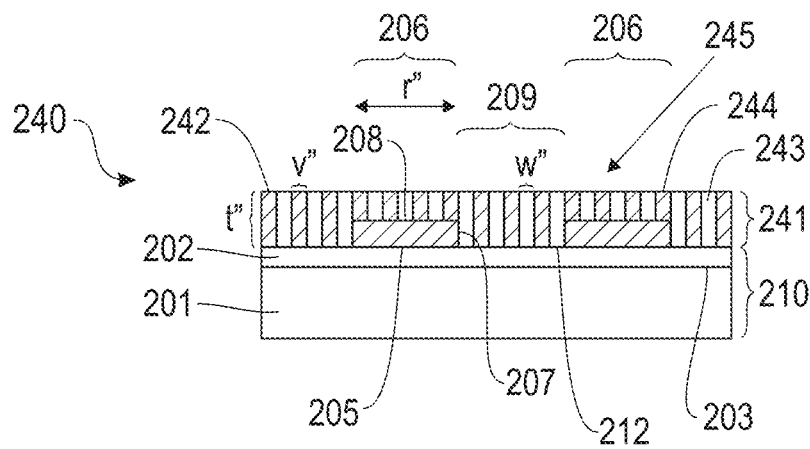
FIG. 7C
Selective Domain Removal
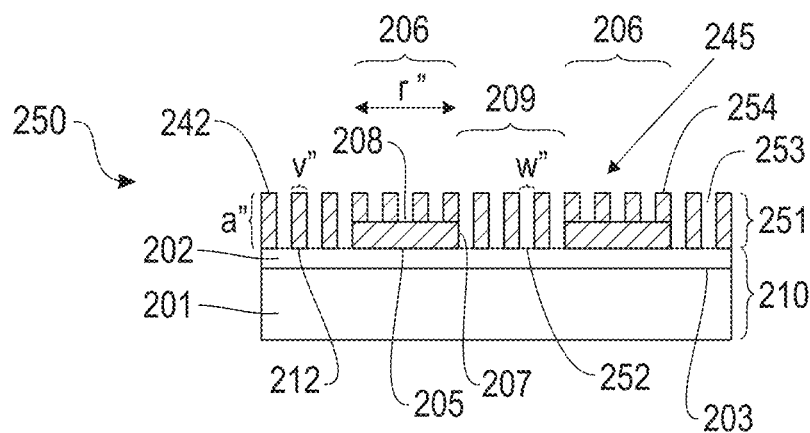
FIG. 7D
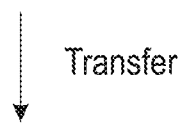
Transfer

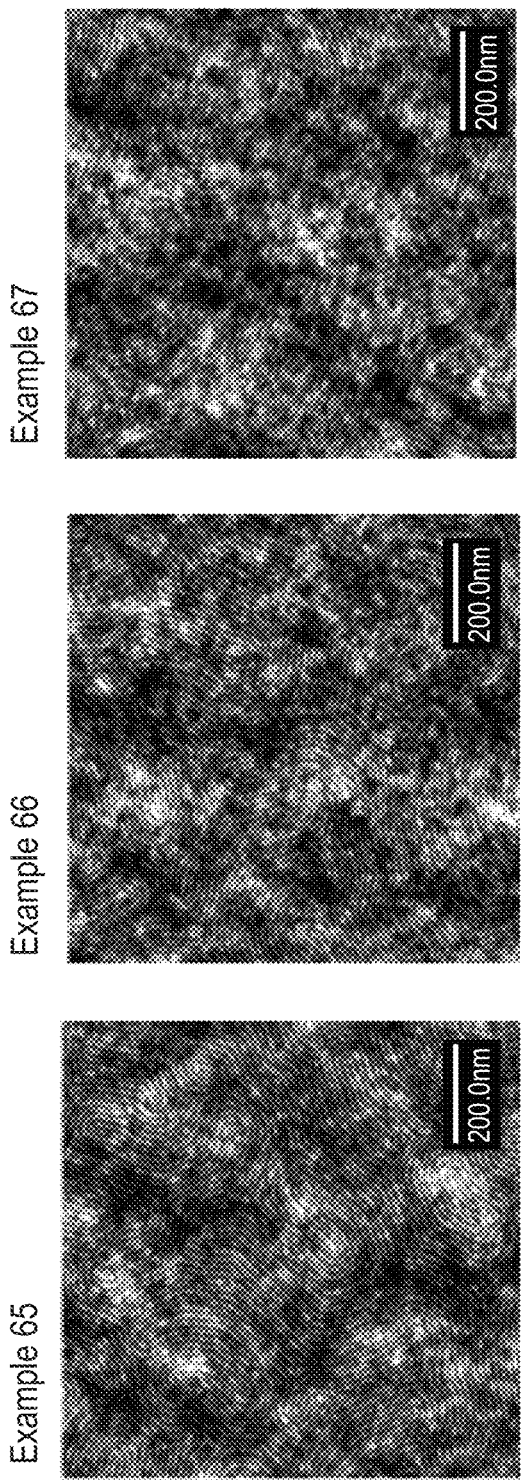

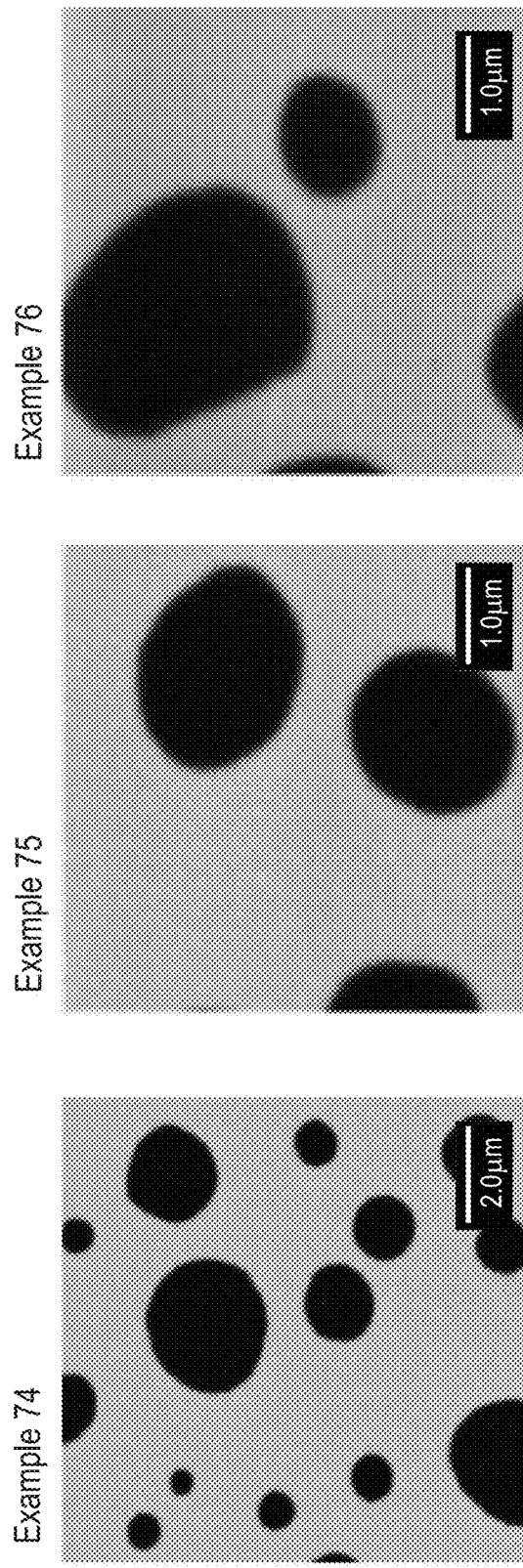

Example 117

BLOCK COPOLYMERS FOR DIRECTED SELF-ASSEMBLY APPLICATIONS

BACKGROUND

The present invention relates to block copolymers for directed self-assembly applications, and more specifically to high-chi ($\chi$) block copolymers comprising a surface active fluorinated linking group joining the polymer blocks.

Block copolymers (BCPs) find many applications in solution, bulk and thin films. Thin film applications of BCPs are particularly attractive for nanolithography and patterning due to the ability of some BCPs to form periodic self-assembled structures ranging in feature size from 5 nm to 50 nm. The thin-film self-assembly property of BCPs can be utilized with existing photolithographic techniques to provide a unique approach to long range order for semiconductor applications. This approach, called directed self-assembly (DSA) of block copolymers, promises to extend the patterning capabilities of conventional lithography.

BCPs for directed self-assembly (DSA) applications comprise two or three polymer blocks that can phase segregate into domains characterized by ordered nanoscopic arrays of spheres, cylinders, gyroids, and lamellae. The ability of a BCP to phase segregate depends on the Flory Huggins interaction parameter chi ($\chi$). Poly(styrene)-block-poly (methyl methacrylate), abbreviated as PS-b-PMMA, is the most widely used block copolymer for DSA. However, the minimum half-pitch of PS-b-PMMA is limited to about 10 nm because of lower interaction and interaction parameter ($\chi$) between the PS and PMMA blocks. To enable further feature miniaturization, a block copolymer with higher interaction parameter between two blocks (higher chi) is highly desirable.

For lithography applications, orientation of the block copolymer domains perpendicular to the substrate is typically desired. For PS-b-PMMA this is achieved by coating and thermally annealing the block copolymer layer, which is disposed on an underlayer of non-preferential or neutral material. The underlayer can be grafted to or crosslinked with the underlying substrate layer. Due to a larger difference in the interaction parameter between the domains of higher-$\chi$ block copolymers, it is important to control both BCP-air and BCP-substrate interactions. Many orientation control strategies for generating perpendicularly oriented BCP domains have been implemented using higher-$\chi$ BCPs. For example, solvent vapor annealing has been used for orientation control of poly(styrene)-b-poly(ethylene oxide) (PS-b-PEO), poly(styrene)-b-poly(dimethylsiloxane) (PS-b-PDMS), poly(styrene)-b-poly(2-vinyl pyridine) (PS-b-P2VP), poly(lactide)-b-poly(4-trimethylsilylstyrene) (PLA-b-PTMSS) and poly(alpha-methylstyrene)-b-poly(4-hydroxystyrene) (P$\alpha$MS-b-PHOST). Introducing a solvent vapor chamber and kinetics of solvent vapor annealing may complicate DSA processing. Alternatively, a combination of non-preferential wetting underlayer and topcoat has been used with PS-b-P2VP, PS-b-PTMSS and PLA-b-PTMSS block copolymers to achieve perpendicular orientation of the polymer domains during annealing. However, the additional topcoat materials may increase the process cost and complexity.

A need exists for high-$\chi$ block copolymers whose topcoat-free thin films self-assemble using thermal annealing to form perpendicularly oriented domain structures on preferential and non-preferential underlayers.

SUMMARY

Accordingly, a block copolymer is disclosed, comprising:
a first polymer block (block A);
a second polymer block (block B) having a chemical structure different from block A and capable of phase-segregating from block A; and
a divalent linking group L' covalently joining an end repeat unit of block A to an end repeat unit of block B, wherein L' comprises 1-24 fluorines, wherein each of the fluorines of L' is linked to a backbone carbon of the block copolymer.

Also disclosed is a composition, comprising:
a solvent; and
an above-described block copolymer;
wherein
the composition is capable of forming a film layer comprising the block copolymer, wherein the film layer is capable of self-assembling spontaneously and/or when thermally treated, thereby forming a pattern of phase-segregated alternating domains comprising respective chemically distinct blocks of the block copolymer.

Also disclosed is a method, comprising:
providing a first layered structure comprising a top layer (underlayer);
forming a film layer comprising an above-described block copolymer disposed on the underlayer, wherein the film layer has a top surface in contact with an atmosphere interface; and
allowing or inducing the block copolymer of the film layer to self-assemble using a thermal treatment, thereby forming a second layered structure comprising a phase-segregated domain pattern having a characteristic pitch (Lo), the domain pattern comprising perpendicularly oriented alternating domains comprising respective chemically distinct blocks of the block copolymer.

Another method is disclosed, comprising:
providing a first multi-layered structure comprising a top surface having a pre-pattern for directing self-assembly of an above-described block copolymer;
forming a film layer comprising the block copolymer disposed on the top surface of pre-pattern, the film layer comprising a top surface in contact with an atmosphere interface, and the film layer comprising a bottom surface in contact with the top surface of the pre-pattern; and
allowing or inducing the block copolymer to self-assemble using a thermal treatment, thereby forming a second multi-layered structure comprising a pattern of phase-segregated domains (domain pattern) of the block copolymer, the domain pattern disposed on the top surface of the pre-pattern.

Further disclosed is a diblock copolymer of formula (D-1):

wherein
$E^1$ is a monovalent first end group,
$E^2$ is a monovalent second end group,
P' is a first polymer chain representing a first block (block A) of the block copolymer,
P" is a second polymer chain representing a second block (block B) of the block copolymer, and
L' is a divalent linking group joining an end repeat unit of P' to an end repeat unit of P", wherein L' comprises 1-24 fluorines, and each of the fluorines of L' is linked to a backbone carbon of the block copolymer.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIGS. 7A to 7E are cross-sectional layer diagrams showing a process of forming a perpendicularly oriented lamellar domain pattern with the disclosed BCPs comprising a fluorinated linking group L' using a chemoepitaxial pre-pattern.

FIGS. 22-26 are AFM height images of the self-assembled block copolymer films of Examples 64-68, respectively.

FIGS. 32-36 are AFM height images of the self-assembled block copolymer films of Examples 74-78, respectively.

FIG. 60A is a top-down view SEM of the remaining PS domain pattern after an oxygen plasma etch to selectively remove the polycarbonate domain. FIG. 60B is a top-down view SEM of the PS domain after partially etching a $TiO_2$ film that was vapor deposited on the PS domain pattern. The etch exposed the top surface of the PS pattern, leaving $TiO_2$ in the trench areas of the PS pattern. FIG. 60C is a top-down view SEM of the $TiO_2$ pattern remaining after oxygen plasma etching to selectively remove the PS domain and brush layer beneath, uncovering the silicon nitride layer in the bottom of the trench. The resulting $TiO_2$ pattern was the inverse of the PS domain pattern. FIG. 60D is a top-down view SEM of the $TiO_2$ pattern remaining after selectively etching the silicon nitride in the trench, uncovering the amorphous carbon layer. FIG. 60E is a top down view SEM of the $TiO_2$ pattern remaining after selectively etching the amorphous carbon in the trench. FIG. 60F is a cross-sectional view SEM of the $TiO_2$ pattern of FIG. 60E.

DETAILED DESCRIPTION

Figure 1:
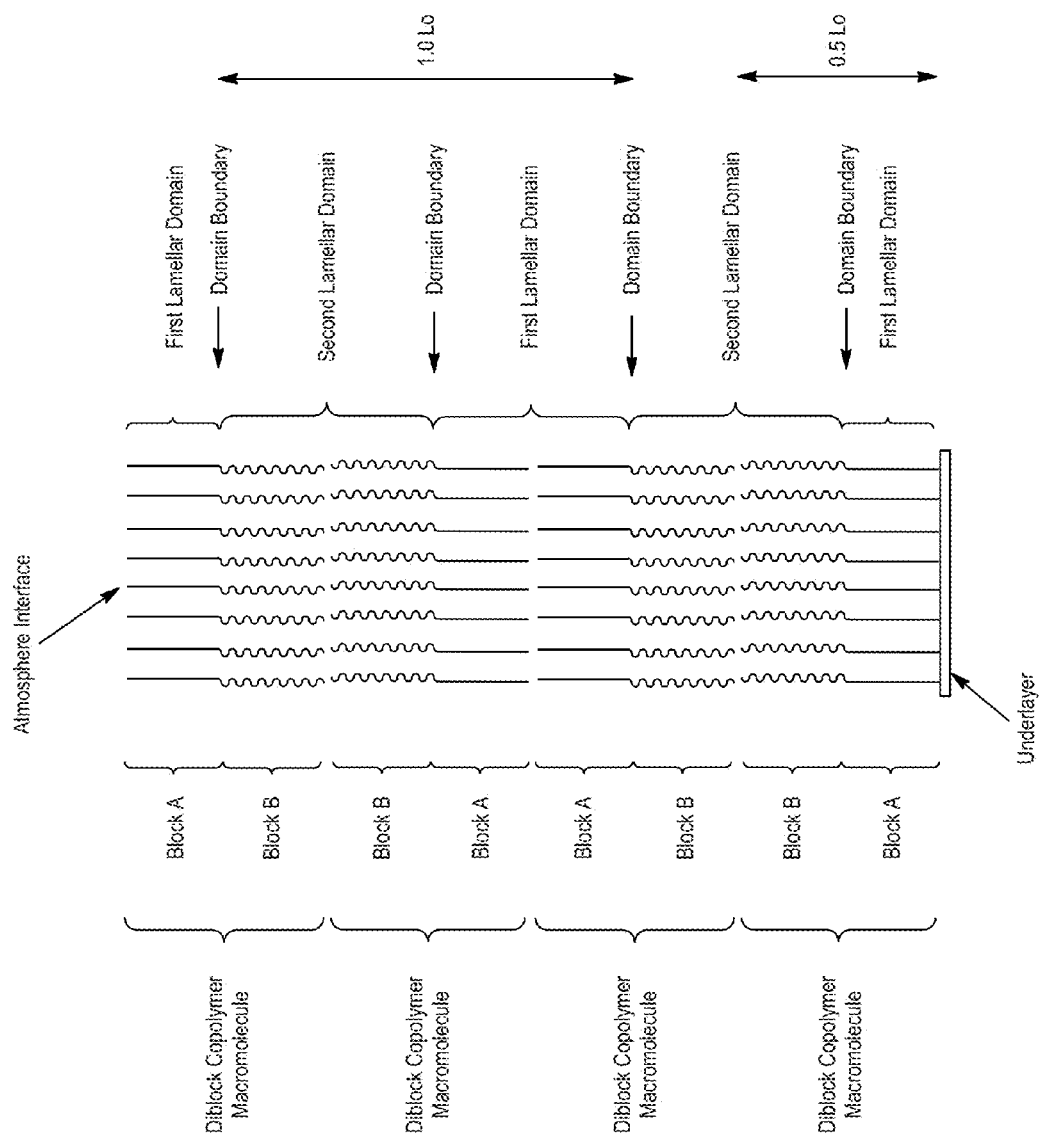
FIG. 1 is a schematic cross-sectional representation of parallel oriented lamellar domains of a self-assembled diblock copolymer. The main plane of each lamellar domain is parallel to the main plane of the underlayer surface.

Disclosed are block copolymers having improved self-assembly properties in a lithographic process that utilizes only a thermal treatment to induce phase-segregation. The block copolymers (BCPs) comprise two or more chemically distinct blocks. One or more pairs of adjacent blocks are covalently joined by respective independent divalent linking groups L', which are low surface energy groups comprising 1-24 fluorines. Each L' is covalently linked to respective end repeat units of a respective pair of adjacent blocks. Each of the fluorines of aL' is linked to a backbone carbon of the block copolymer. In an embodiment, each L' independently comprises 1-12 difluoromethylene groups (*—$CF_2$—*), wherein each of the carbons of the difluoromethylene groups is a backbone carbon of the block copolymer. The block copolymers are linear polymers, meaning the block copolymers have one polymer branch rather than intersecting polymer branches, and the one polymer branch has two peripheral dangling ends (i.e., the polymer backbone is not a macrocycle). Preferably, L' is a non-charged group that provides orientation control of phase-segregated domains formed during self-assembly of the block copolymer. L' has a lower surface energy than each block of the block copolymer. More particularly, L' has a surface energy between 0 and 30 mN/m.

Preferably, the L' groups comprise 6-24 fluorines, more preferably 8-24 fluorines, or most preferably 10-24 fluorines. The BCPs can have 2-4 blocks, more preferably 2 or 3 blocks.

The following discussion is directed to diblock copolymers (A-B) but can be applied to block copolymers having additional blocks unless otherwise stated. Diblock copolymers comprise a first block A and a second block B. L' has a lower surface energy than block A, and L' has a lower surface energy than block B.

A thin film layer (5-100 nm thickness) of a disclosed BCP, which is disposed on an underlayer of a multi-layered substrate and has a top surface in contact with an atmosphere, is capable of self-assembling to form a phase-segregated domain pattern. The domain pattern comprises a first domain comprising a first block (block A) and a second domain comprising a second block (block B). The first and second domains preferably comprise a lamellar or cylindrical morphology.

Preferably, the atmosphere is air. Air is composed of about 21% oxygen ($O_2$) and 78% nitrogen ($N_2$) by volume. In an embodiment, the atmosphere excludes organic gases comprising a C—H bond.

No restriction is placed on the block compositions, with the proviso that block A and block B cannot be equivalent in chemical structure. The BCP can be a conventional low-chi BCP (e.g., poly(styrene)-b-poly(methyl methacrylate) (PS-b-PMMA)) or a high-chi BCP (e.g., poly(styrene)-b-poly(trimethylene carbonate) (PS-b-PTMC)). At least one pair of adjacent blocks of the BCP is covalently linked by an L' group (e.g., PS-L'-PTMC). Preferably, the BCP is a high-chi BCP.

Herein, a surface and/or an atmosphere interface is said to be "non-preferential to", or "non-preferentially wetted by", the domains of an SA material if each domain of the self-assembled SA material has contact with the surface and/or the atmosphere interface after self-assembly. Otherwise, the surface and/or atmosphere interface is said to be "preferential to", or "preferentially wetted by", one of the domains of the self-assembled SA material. For example, an underlayer surface is preferential to a first domain of a block copolymer if after self-assembly of the block copolymer the first domain has contact with the underlayer surface and a second domain has substantially no contact with the underlayer surface. It should be understood that a given underlayer surface can be non-preferential to the domains of a disclosed block copolymer comprising the L' group, and be preferential to one domain of an otherwise identical self-assembled block copolymer in which all fluorines of L' are replaced by hydrogen. That is, the fluorinated L' group allows both block A and block B to wet an underlayer surface that would otherwise be wettable only by block A or only by block B if the fluorines of L' were replaced by hydrogens.

Herein, a high-chi" (high-$\chi$) BCP is one in which adjacent blocks have a Flory-Huggins interaction parameter chi ($\chi$) greater than that for a poly(styrene)-b-poly(methyl methacrylate) diblock copolymer (PS-b-PMMA) that self-assembles to form the same domain morphology (i.e., lamellae, cylinders, and so on). The higher the chi parameter, the poorer the miscibility of the different BCP blocks with one another, and the sharper the phase boundaries separating the phase domains containing the different blocks after self-assembly of the BCP. The atmosphere interface is generally preferential to one domain of a high-chi BCP lacking a suitable L' group. When a suitable L' group is present, the atmosphere interface can be non-preferential to the domains of the BCP.

When thermally annealed, a film layer comprising a disclosed BCP can form perpendicularly oriented domain patterns without employing a separate surface active agent in the BCP film layer for orientation control, without utilizing an underlayer having a chemo-epitaxial or grapho-epitaxial pre-pattern for orientation control, and without applying a topcoat on the BCP film layer prior to self-assembly. Perpendicularly oriented line patterns can be obtained without solvent annealing, without thermo-solvent annealing (i.e., a combination of thermal and solvent vapor annealing), without electric field alignment, and without shear-induced alignment of the film layer. Film layers comprising a disclosed high-chi BCP in contact with an atmosphere are capable of forming perpendicularly oriented line patterns having a characteristic pitch (Lo) less than 20 nm.

Herein, "non-fluorinated" means the chemical formula of a referenced material contains no fluorine. The referenced material can be a sub-structure of a polymer such as a repeat unit, functional group, linking group, and so on. A material is "fluorinated" if the chemical formula of the material contains one or more fluorine groups. A material described as containing one or more "fluorines", "fluorine groups", or "fluoride groups" herein means the material has a chemical structure in which one or more monovalent fluorine atoms are covalently bound to carbon(s) of the chemical structure.

An "SA material" is a material capable of self-assembling into compositionally different phase-segregated domains. Self-assembly (SA) refers to a process in which the SA material undergoes phase-segregation to produce a pattern of immiscible solid phase domains under suitable conditions. Self-assembly can be spontaneous upon formation of the SA layer and/or be induced by thermally treating (i.e., annealing) an SA layer comprising an SA material at an elevated temperature for a suitable period of time. Herein, the SA material is a block copolymer (BCP).

A block copolymer for self-assembly comprises at least two blocks that are immiscible with one another. Self-assembly of the block copolymer occurs by phase-segregation of the blocks to form a pattern of solid phase domains. Depending on the volume fraction of the blocks, the domain morphology can be lamellar, spherical, cylindrical, and/or gyroidal. As an example, self-assembly of a diblock copolymer can produce a domain pattern comprising a first lamellar domain containing substantially a first block A of the diblock copolymer and a second lamellar domain containing substantially a second block B of the diblock copolymer. Without being bound by theory, it is believed L' can be miscible with the domain formed by the block having higher surface energy (e.g., polycarbonate block), or L' can be immiscible with each domain (i.e., L' can reside at the interface of the domains after self-assembly).

The block copolymer has a polymer backbone. Herein, the polymer backbone consists of the covalently linked atomic centers that represent the shortest path of covalent bonds from a first repeat unit at a first end of the block copolymer chain to a last repeat unit at an opposing end of the block copolymer chain, including atomic centers of linking groups L' joining adjacent blocks. The block copolymer backbone can include carbon atomic centers (backbone carbons), oxygen atomic centers (backbone oxygens), nitrogen atomic centers (backbone nitrogens), silicon atomic centers (backbone silicons), and so on.

As an example, the block copolymer DBP1, which is used as a comparative polymer in the examples further below, has the following structure.

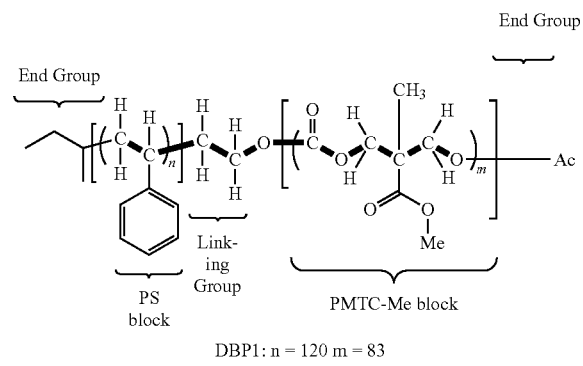

DBP1: n = 120 m = 83

DBP1 has a poly(styrene) block (PS block) and a polycarbonate block (PMTC-Me block) linked by an ethylene oxide linking group. The backbone carbons and oxygens of of DBP1 are shown in bold font and are linked with bold bonds. The carbons and oxygen of the linking group of DBP1 are backbone atoms. The hydrogens of the linking group are not backbone atoms.

Another example is BCP-1 comprising a disclosed linking group L'. The backbone carbons and oxygens of BCP-1 are shown in bold font linked with bold bonds. The fluorine groups of L' are linked to respective backbone carbons. The fluorines, hydrogens, oxygen of the carbonyl group, and methyl carbons of L' are not backbone atoms.

Herein, an "SA layer" is a layer comprising an SA material. The SA layer is disposed on a top surface of a substrate. The SA layer can comprise one or more of the disclosed BCPs for self-assembly. The SA layer can further comprise additives (e.g., surfactants, auxiliary polymers, thermal acid generators, photo-acid generators) with the proviso that the additives do not adversely affect phase-segregation and orientation of the BCP domains. It should be understood that an SA layer containing only a disclosed BCP is capable of forming perpendicularly oriented lamellar and/or cylindrical domains when the top (e.g., atmosphere) and/or bottom (e.g. underlayer) interfaces of the SA layer are non-preferential to the domains, or preferential to one of the domains, of an otherwise identical self-assembled block copolymer in which all fluorines of L' are replaced by hydrogen.

Herein, any material of the top surface of the substrate that has contact with the bottom of the SA layer is referred to generally as "underlayer material". A layer comprising underlayer material is an "underlayer". The underlayer surface can influence self-assembly of an SA material of the SA layer. Each domain of a self-assembled disclosed BCP containing an L' group can wet the underlayer surface.

Herein, an "atmosphere" is a gas, which can include air and/or one or more other gases at any suitable pressure in contact with the top surface of the SA layer.

The substrate is the layered structure on which the SA layer is disposed. The substrate has a main plane, which is parallel to the bottom-most layer of the substrate (e.g., a silicon wafer). The substrate can comprise one or more layers of materials arranged in a stack, more specifically materials used in the fabrication of semiconductor devices. As non-limiting examples, the substrate can include a bottom layer (e.g., silicon wafer, metal foil), hard mask layer, dielectric layer, metal oxide layer, silicon oxide layer, silicon nitride, titanium nitride, hafnium oxide, anti-reflection layer (ARC), and/or underlayer for self-assembly. The SA layer is disposed on the top surface of the substrate, which is typically the top surface of the underlayer. When a resist pattern is formed on the substrate, the substrate includes the resist pattern. In this instance, the SA layer can be disposed in the trenches of the resist pattern and optionally on the top surface of the resist features.

Optionally, the top surface of the substrate can comprise a "grapho-epitaxial pre-pattern" or a "chemo-epitaxial pre-pattern" for directing self-assembly. Each of these pre-patterns can be composed of topographical features (e.g., a resist pattern). A grapho-epitaxial pre-pattern influences

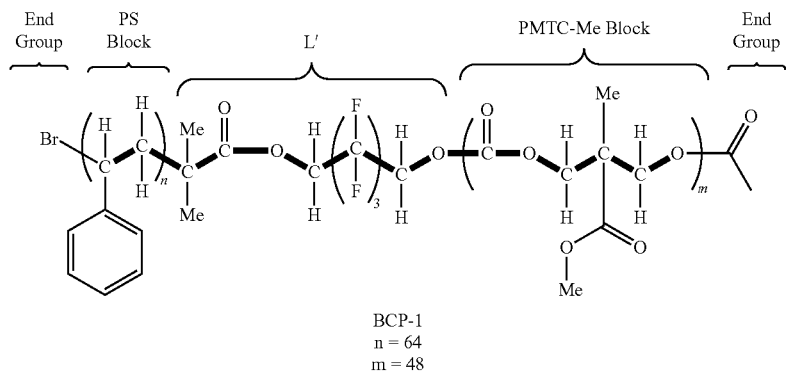

BCP-1
n = 64
m = 48 self-assembly by the topography and surface properties of the pre-pattern. A chemo-epitaxial pre-pattern can influence self-assembly predominantly by way of the surface properties of different regions of the pre-pattern. No sharp dimensional limits exist between these two pre-pattern categories because the extent of topographical influence on self-assembly is also dependent on the thickness of the SA layer in relation to the underlying relief surface, as well as the annealing conditions (time and temperature) used for self-assembly. In general, when grapho-epitaxial pre-patterns are used, the thickness of the SA layer is less than or equal to the height of the topographical features of the pre-pattern. When chemo-epitaxial pre-patterns are used, the SA layer thickness is greater than any height of the underlying topographical features of the pre-pattern. That is, the SA layer is disposed on the top-most and bottom-most surfaces of the chemical pre-pattern.

The term "interface" refers to a contact boundary between two substantially immiscible phases. Each phase can, independently, be a solid, a liquid, or a gas.

A lamellar or cylindrical domain can be oriented parallel (FIG. 1) or perpendicular (FIG. 2) to the main plane of a reference layer (e.g., the main plane of the SA layer, underlayer, bottom layer of the substrate, or another layer). A lamellar domain has a parallel orientation when the main plane or plate of the lamella is oriented parallel to the main plane of the reference layer. A lamellar domain has a perpendicular orientation when the main plane or plate of the lamella is oriented perpendicular to the main plane of the reference layer. A cylindrical domain has a parallel orientation when the cylinder axis is oriented parallel to the main plane of the reference layer. A cylindrical domain has a perpendicular orientation when the cylinder axis is oriented perpendicular to the main plane of the reference layer.

Perpendicular orientation of lamellar domains is desirable for forming high resolution line patterns by selective etching of a given lamellar domain. Parallel orientation is not desirable for forming high resolution line patterns.

The term "disposed" refers to a layer in contact with a surface of another layer. "Disposing" or "applying" refer to forming a layer to be in contact with a surface of another layer, without limitation as to the method employed unless otherwise stated, with the proviso that the desirable characteristics of the disposed or applied layer are obtained, such as uniformity and thickness.

The term "casting" refers to forming a layer of a material by disposing on a surface a solution of the material dissolved in a solvent, and removing the solvent.

Random copolymers are indicated by "-co-", or "-r-" in the name. Block copolymers are indicated by "-b-" or "-block-" in the name. Alternating block copolymers are indicated by "-alt-" in the name. Herein, the block copolymers can be represented also by "-L'-" between named blocks of the block copolymer, indicating that the blocks are joined by the disclosed L' group.

Herein, "symmetrical" wetting means the underlayer surface and the atmosphere interface are wetted by the same domain(s) of the self-assembled SA material. "Non-symmetrical" wetting means the underlayer surface and the atmosphere interface are wetted by different domain(s) of the self-assembled SA material.

For typical SA materials (e.g., PS-b-PMMA lacking an L' group) that are thermally annealed for self-assembly, the underlayer surface and the atmosphere interface must be non-preferential to the self-assembled domains in order to achieve perpendicularly oriented lamellar domains, when no other means of influencing orientation are available during self-assembly (e.g., incorporating a separate surface active agent in the SA layer, using a chemical or topographical pre-pattern, applying a topcoat to the SA layer before self-assembly, solvent vapor annealing, thermo-solvent annealing). For these SA materials, when only one interface is non-preferential to the SA material, the lamellar domains tend to orient parallel to the underlayer surface, forming an island/hole morphology having 0.5Lo ("L nought") step height. "Step height" refers to height difference relative to the surrounding SA material. Lo is the characteristic pitch (bulk periodicity) of the domains of the self-assembled SA material. The islands and holes of parallel oriented lamellar domains are detectable in atomic force microscopy (AFM) height images.

The higher the chi parameter of the block copolymer, the smaller the potential Lo of the domain pattern, and the greater the mismatch in wetting properties of the underlayer and atmosphere interface with respect to the block copolymer domains. For a typical high-chi block copolymer lacking the L' group (e.g., PS-b-PTMC) only one domain (e.g., the PS domain) of the self-assembled BCP is capable of "wetting" the atmosphere interface, resulting in morphological structures (i.e., lamellae, cylinders, and so on) having a parallel orientation with respect to the main plane of the SA layer (or the main plane of the bottom layer of the substrate).

The following discussion is focused on lamellar domain patterns formed by self-assembly of a diblock copolymer, but is applicable to other block copolymers (e.g., triblock copolymers) and other domain morphologies (e.g., cylindrical domains). It should be understood that the layer diagrams are intended for illustration purposes and are not drawn to scale or meant to be limiting with respect to the possible structures that can be produced using the below-described processes.

Parallel oriented lamellae are illustrated in the layer diagram of FIG. 1. For typical block copolymers lacking an L' group, if only the underlayer surface is non-preferential to the domains, both domains initially wet the underlayer surface with 0.5Lo perpendicular lamellae, but eventually form parallel morphology due to the atmosphere (e.g., air) being preferentially wetted by one domain. The resulting island/holes comprising parallel lamellae have 0.5Lo step height. FIG. 1 shows parallel morphology without the islands and holes. The main plate of each lamella is parallel to the main plane of the underlayer surface. In this example, the underlayer and atmosphere interface are preferentially wetted by the domain containing block A. The first lamellar domain comprises block A, and the second lamellar domain comprises block B. The bulk periodicity Lo of the domains is indicated by 1.0Lo (1.0 times Lo). The individual diblock copolymer macromolecules, domain boundaries, and 0.5Lo are also indicated. It should be understood that within a given lamellar domain (e.g., the second lamellar domain) blocks from different polymer macromolecules (e.g., B blocks) can be arranged end-to-end (shown) and/or interwoven (not shown). Each block can have a backbone that is rigid, non-rigid, or of intermediate rigidity. Each block can have any suitable coiling, rotational and/or flexural capability.

Figure 2:
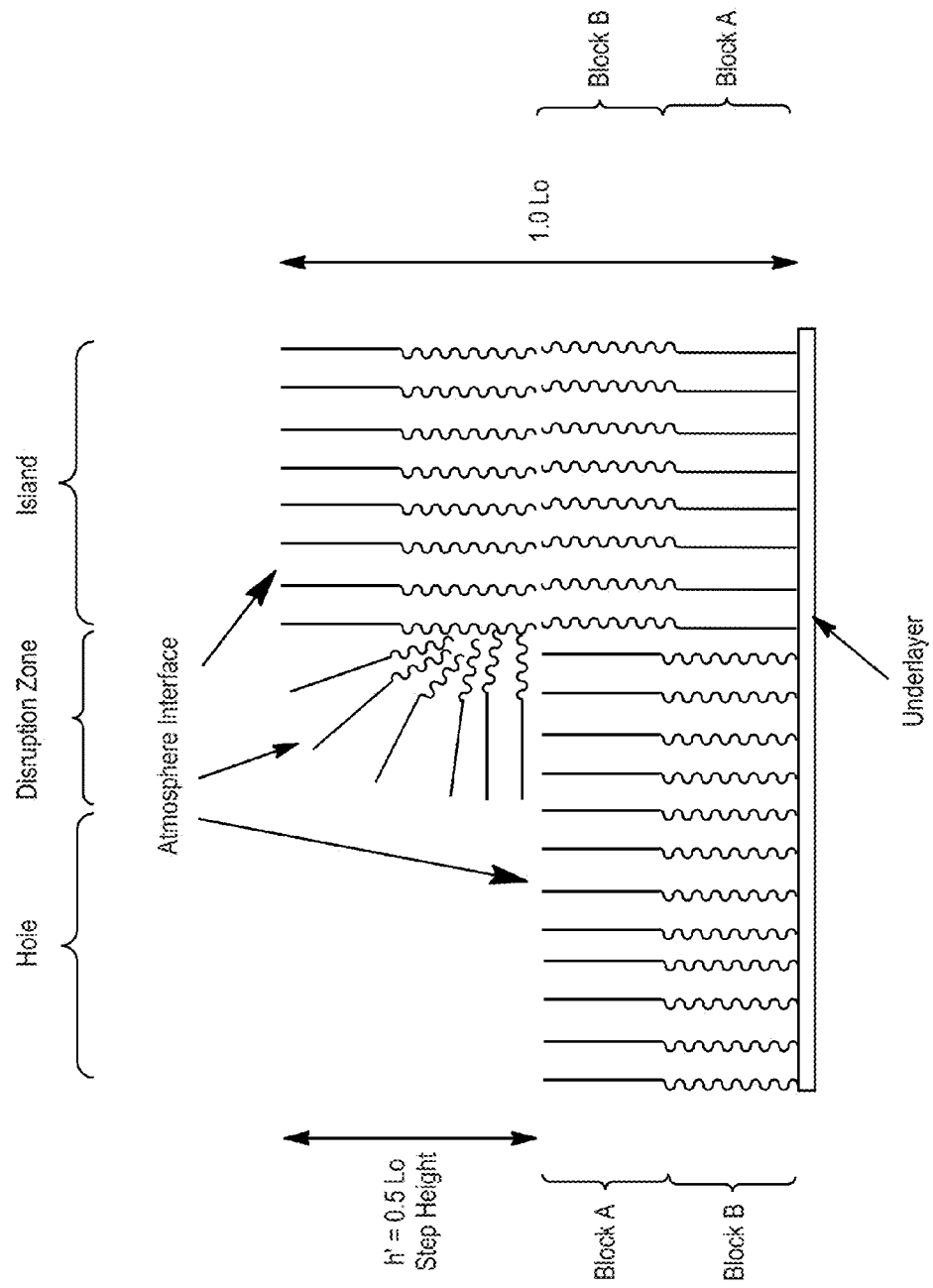
FIG. 2 is a schematic cross-sectional representation of parallel oriented lamellar domains of a self-assembled BCP when the self-assembled layer has islands and holes.

The layer diagram of FIG. 2 illustrates islands and holes formed by a typical high-chi BCP when a planar underlayer is non-preferential to the domains of the BCP and the atmosphere is preferential to one domain of the BCP. The underlayer surface is in contact with each of the domains containing block A and block B, but only the block A domain has contact with the atmosphere. The non-preferential wetting properties of the underlayer surface cause disruptions in the parallel oriented lamellar domains, resulting in formation of islands and holes having a step height h' by AFM of about 0.5Lo. It should be understood that block A phase-segregates to retain contact with the atmosphere. The disruption zone (the boundary of the hole and the island) can have perpendicular lamellae (not shown).

Figure 3:
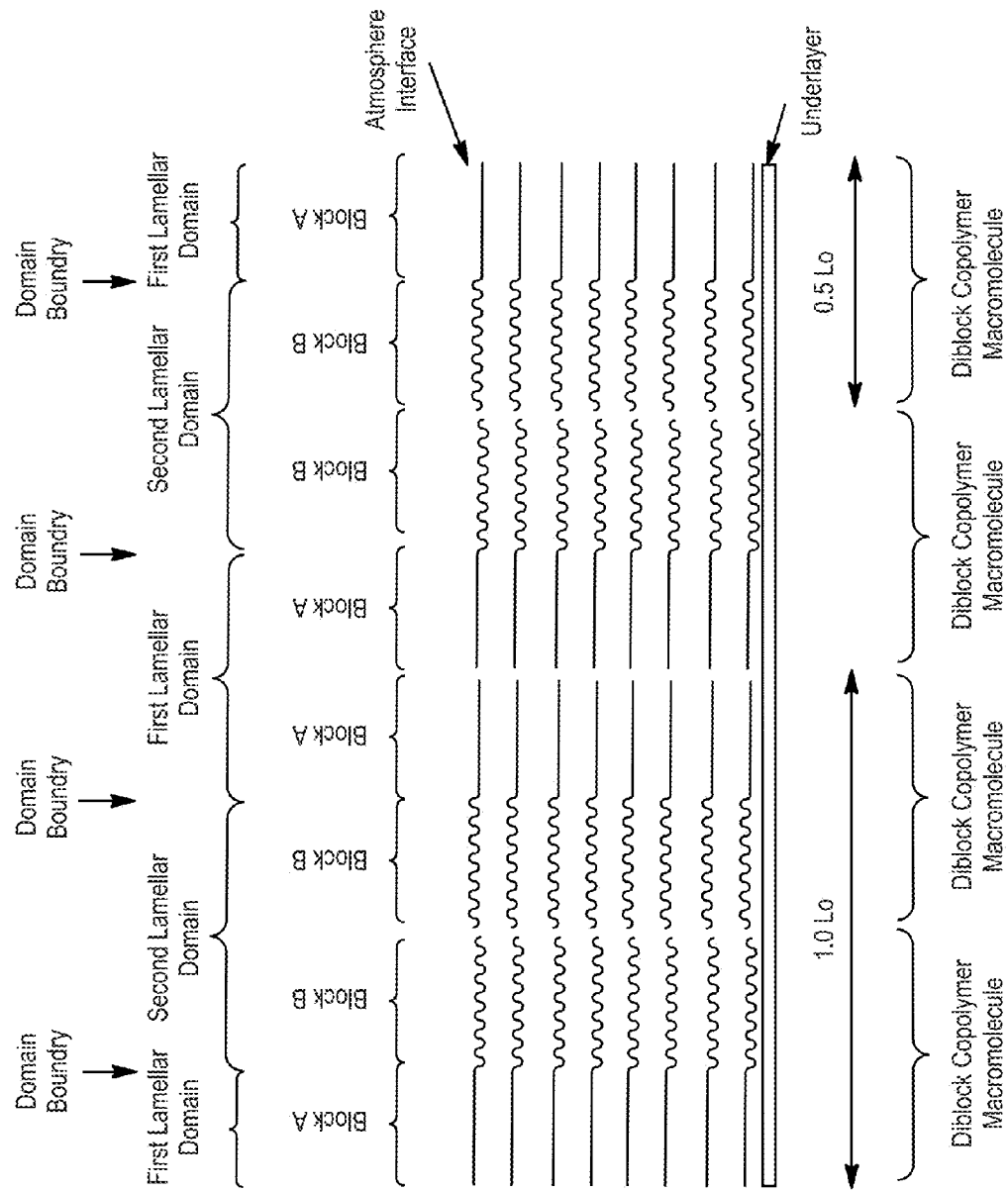
FIG. 3 is a schematic cross-sectional representation of perpendicularly oriented lamellar domains of a self-assembled BCP in which the atmosphere interface and underlayer are non-preferentially wetting to the BCP domains.

FIG. 3 illustrates perpendicularly oriented lamellar domains of a typical self-assembled low-chi BCP when the planar underlayer and the atmosphere interface are both non-preferential to the BCP domains. The main planes of the lamellae are oriented perpendicular to the plane of the underlayer surface, and also to the main plane of the SA layer. The lamellae of each domain are in contact with the atmosphere and underlayer surface. The bulk periodicity, Lo, is indicated, as well as 0.5Lo. In this example, the underlayer surface has contact with block A and block B of the self-assembled diblock copolymer.

Figure 4:
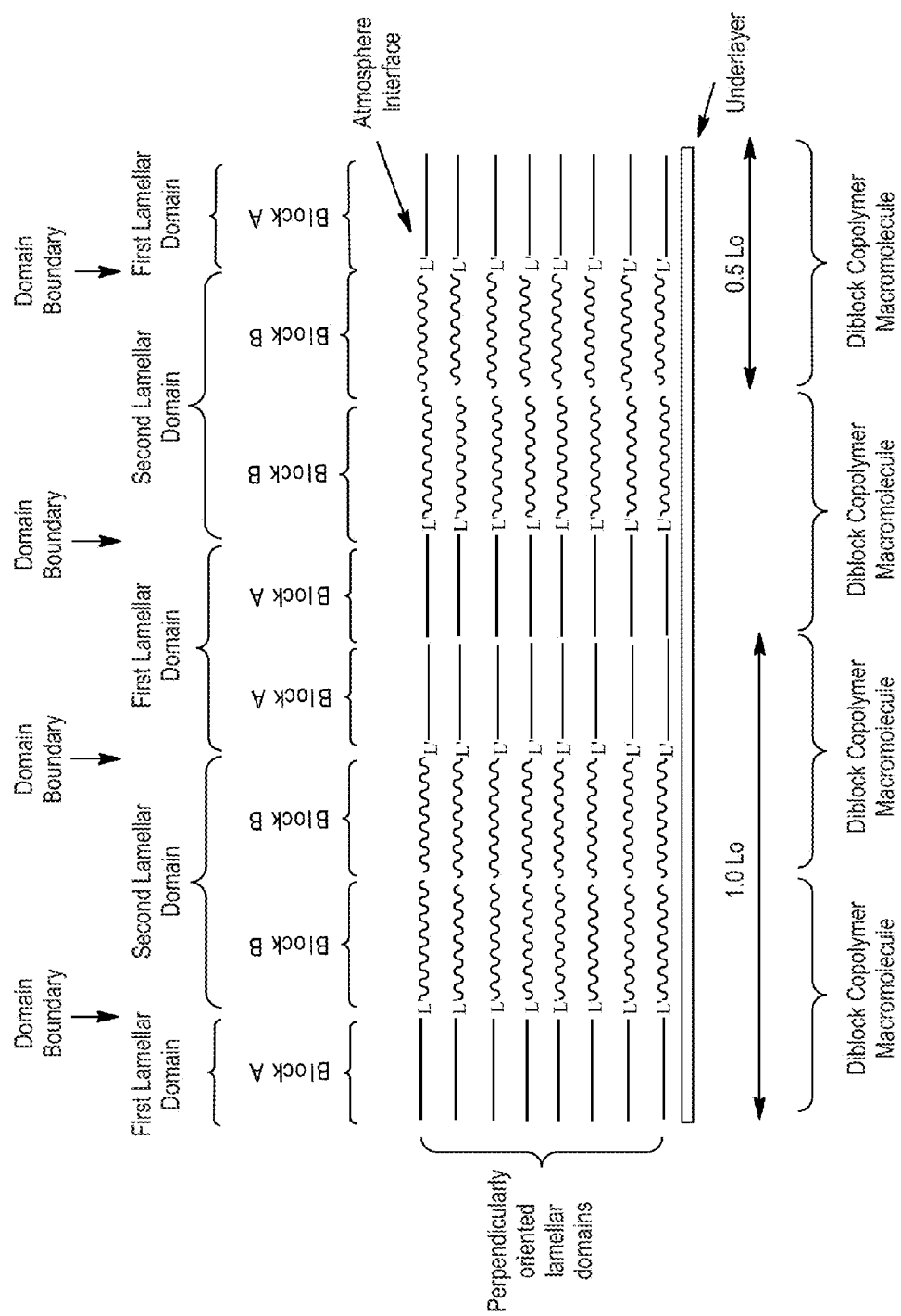
FIG. 4 is a schematic cross-sectional representation of perpendicularly oriented lamellar domains formed with the disclosed BCPs comprising a fluorinated linking group L'. The atmosphere interface and underlayer can be preferentially wetting to one domain of an otherwise identical self-assembled BCP wherein all fluorines of L' are replaced by hydrogen.

Without being bound by theory, FIG. 4 illustrates a non-limiting schematic cross-sectional representation of perpendicularly oriented lamellar domain pattern. The domain pattern is formed using a disclosed high-chi BCP comprising a suitable L' group. The underlayer surface and the atmosphere interface are both preferential to one of the domains of an otherwise identical self-assembled BCP in which all fluorines of L' are replaced by hydrogen. In this example, the atmosphere interface is preferential to the domain of lower surface energy (e.g., PS domain, block A), whereas the underlayer is preferential to the domain of higher surface energy (e.g., polycarbonate domain). Nevertheless, self-assembly of the BCP comprising the L' group generates a perpendicularly oriented lamellar domain pattern. Without being bound by theory, each domain is believed to be in contact with the atmosphere interface and underlayer, with linking group L' residing at the boundary of the two domains as shown.

The high-chi BCP preferably comprises an aliphatic polycarbonate block, aliphatic polyester block, and/or aliphatic polyether block. Additionally, the high-chi BCP preferably has a chemical structure favoring formation of lamellar domains or cylindrical domains during self-assembly. That is, the volume fractions of the blocks of the block copolymer are preferably in a range favorable to formation of lamellar domains or cylindrical domains. The SA layer can be formed on the underlayer surface that is preferential to or non-preferential to the domains of an otherwise identical self-assembled BCP in which all fluorines of L' are replaced by hydrogen. Preferably, the SA layer has a top surface in contact with an atmosphere. The atmosphere interface is always considered a preferential interface with respect to the domains of a high-chi BCP lacking the disclosed L' group.

The lamellar domain patterns can have a bulk periodicity (i.e., characteristic pitch (Lo)) in a range of about 4 nm to about 80 nm, which is useful for producing line features having a half-pitch of about 2 nm to about 40 nm, respectively, more particularly a half pitch of about 2 nm to about 20 nm, a half pitch of about 2 nm to about 15 nm, a half pitch of about 2 nm to about 10 nm, and even more particularly a half pitch between about 2 nm and about 9 nm.

Block Copolymers for Self-Assembly

The disclosed BCPs can have two or more independent chemically distinct blocks and one or more independent L' groups linking respective pairs of adjacent blocks. Preferably, the block copolymer has two or three chemically distinct blocks in the form of a linear polymer chain (i.e., not macrocyclic or branched polymer). Each block is an independent polymer chain that can be a homopolymer or copolymer chain.

As one example, the block copolymer can comprise one poly(styrene) (PS) block (block A) and one aliphatic polycarbonate (PC) block (block B) joined by a linking group L', represented by the block notation A-L'-B. As another example, the block copolymer can comprise two PS blocks (designated A and A) and one aliphatic PC block (designated B) linked together by one or two independent L' groups. The variations in this triblock copolymer structure can be represented as A-B-L'-A, A-L'-B-A, and A-L'-B-L'-A. As another example, the block copolymer can comprise two PS blocks (designated A and A) and two PC blocks (designated B and B) joined by one to three linking groups L', whose variants can be represented as A-B-L'-A-B, A-L'-B-L'-A-B, A-L'-B-A-L'-B, A-B-L'-A-L'-B, A-L'-B-L'-A-L'-B. It should be understood that when L' is not specified as joining two blocks, the two blocks can be joined by a single bond or a linking group other than L'. Non-L' linking groups can be any suitable structure, with the proviso that the self-assembly properties of the block copolymer are not adversely affected.

It should also be understood that the block copolymers comprise two independent end groups linked to the terminal repeat units of the two most peripheral blocks of the BCP. The end groups can be any suitable structure, with the proviso that the film forming properties and self-assembly properties of the block copolymer are not adversely affected.

A film layer of the diblock copolymer disposed on an underlayer of a substrate and having a top surface in contact with an atmosphere is capable of self-assembly to form a phase segregated domain pattern having a characteristic pitch (Lo). The domain pattern comprises a first domain comprising the first block, and a second domain comprises the second block. The structural units (e.g., lamellae, cylinders) of the first domain and the second domain have a perpendicular orientation with respect to a main plane of the substrate in a given lithographic process.

The first block and the second block are selected so as to be substantially immiscible with each other. In an embodiment, the first block and the second block have the following solubility properties with respect to a solvent mixture used to precipitate the block copolymer: i) the first block and the second block are substantially insoluble in a first solvent of the solvent mixture, ii) the first block is substantially insoluble in a second solvent of the solvent mixture, and iii) the second block is soluble in a second solvent of the solvent mixture. That is, the first solvent is a non-solvent for the first block and the second block, the second solvent is a non-solvent for the first block, and the second solvent is a solvent for the second block.

The first block of the block copolymer preferably comprises an ethylenic repeat unit comprising an aromatic ring linked to a backbone carbon. In an embodiment, the first block comprises a styrene and/or substituted styrene repeating units. The first block can be a random copolymer comprising one or more other chemically distinct repeat units as would be obtained from polymerization of one or more vinyl polymerizable monomers.

The second block can comprise any repeat unit that allows a film layer of the block copolymer to self-assemble when thermally treated in a lithographic process, forming a desired phase-segregated domain pattern. For example, the second block can comprise a polyethylenic backbone as obtained by polymerization of a suitable vinyl monomer (e.g., of vinyl pyridine, vinyl acetate, vinyl ether, acrylates, methacrylates). As another example, the second block can comprise an aliphatic polycarbonate backbone composed of aliphatic carbonate repeat units, which can be formed by ring opening polymerization of aliphatic cyclic carbonate monomers. As another example, the second block can comprise a polyester backbone composed of aliphatic ester repeat units, which can be formed by ring opening polymerization of aliphatic cyclic esters (lactones). As another example, the second block can comprise an aliphatic polyether backbone formed by ring opening polymerization of cyclic ethers (e.g., ethylene oxide, propylene oxide, glycidyl monomers). As another example, the second block can comprise a polyamide backbone formed by ring opening polymerization of a lactam. Preferably, the second block B comprises a repeat unit that renders the block copolymer a high-chi block copolymer capable of self-assembly, wherein the chi parameter of the block copolymer is greater than the chi parameter of PS-b-PMMA in a given lithographic process. More specifically, the second block preferably comprises a repeating unit that renders the block copolymer capable of forming a self-assembled domain pattern having a characteristic pitch (Lo) of 4 nm to less than 20 nm. PS-b-PMMA has a characteristic pitch having a lower limit of about 20 nm in a self-assembly process. In an embodiment, the second block comprises a repeat unit comprising a backbone functional group selected from the group consisting of aliphatic carbonate groups, aliphatic ester groups, and aliphatic ether groups. The carbonate repeat units, ester repeat units, and ether repeat units can be used singularly or in combination.

Other non-limiting examples of diblock copolymers for self-assembly that comprise an L' group, where the term "poly(vinyl aromatic)" refers to a block derived from styrene, 4-methyl styrene, 4-t-butyl styrene; 4-hydroxy styrene (HOST), 4-methoxy styrene (MOST), or a combination of any of the foregoing monomers, include:

i) poly(vinyl aromatic)-L'-polycarbonate diblock copolymers, where the polycarbonate can be any polycarbonate, more particularly a polycarbonate derived from trimethylene carbonate (TMC) and/or cyclic carbonates comprising a pendent ester group;
ii) poly(vinyl aromatic)-L'-polyester diblock copolymers, more particularly those having a polyester portion derived from D-lactide, L-lactide, D,L-lactide, caprolactone, valerolactone, and/or another lactone;
iii) poly(vinyl aromatic)-L'-polyether diblock copolymers, more particularly those having a polyether portion derived from ethylene oxide, propylene oxide, glycidyl ethers, and/or oxetanes;
iv) poly(vinyl aromatic)-L'-poly(2-vinyl pyridine) diblock copolymers;
v) poly(vinyl aromatic)-L'-poly(4-vinyl pyridine) diblock copolymers;
vi) poly(vinyl aromatic)-L'-polymethacrylate diblock copolymers, more particularly those having a polymethacrylate portion derived from hydroxyethyl methacrylate (HEMA) and/or methyl methacrylate (MMA);
vii) poly(vinyl aromatic)-L'-poly(isoprene) diblock copolymers;
viii) poly(vinyl aromatic)-L'-poly(butadiene) diblock copolymers;
ix) any of the foregoing block copolymers wherein one of the blocks is replaced with a polymer block derived from cyclohexylethylene (CHE) such as, for example, poly(cyclohexylethylene)-L'-poly(methyl methacrylate) (PCHE-L'-PMMA); and
xi) any of the foregoing block copolymers wherein one of the blocks is replaced with a polymer block derived from methyl trimethyl silyl methacrylate (MTMSM) such as, for example, poly(styrene)-L'-poly(methyl trimethyl silyl methacrylate) (PS-L'-PMTMSM), poly(4-methoxy styrene)-L'-poly(methyl trimethyl silyl methacrylate) (PMOST-L'-PMTMSM), poly(2-vinyl pyridine)-L'-poly(methyl trimethyl silyl methacrylate) (P2VP-L'-PMTMSM), poly(4-vinyl pyridine)-L'-poly(methyl trimethyl silyl methacrylate) (P4VP-L'-PMTMSM), poly(4-hydroxy styrene)-L'-poly(methyl trimethyl silyl methacrylate) (PHOST-L'-PMTMSM).

The specific structural units formed by self-assembly of the block copolymer are determined by the volume ratio of the first block to the second block. The volume of a given block means the volume occupied by the block, which depends on molecular mass of the block. For example, when the volume ratio of the first block A to the second block B is greater than about 80:20, the block copolymer can form an ordered array of spheres composed of the second block in a matrix composed of the first block. When the volume ratio of the first block to the second block is in a range of about 20:80 to about 10:90, the block copolymer can form an ordered array of spheres of the second block in a matrix composed of the first block. When the volume ratio of the first block to the second block is in a range of about 20:80 to about 40:60, the block copolymer can form an ordered array of cylinders composed of the second block in a matrix composed of the first block. When the volume ratio of the first block to the second block is about 40:60 to about 60:40, the block copolymer can form alternating lamellae (i.e., an array of lamellae composed of the first block alternating with lamellae composed of the second block). As an example, a poly(styrene)-b-poly(methyl methacrylate) block copolymer (PS-b-PMMA) comprising 20% or less by volume of the polystyrene (PS) block can self-assemble to form PS spheres in a poly(methyl methacrylate) (PMMA) matrix. As another example, a PS-b-PMMA block copolymer comprising about 20% to about 40% PS by volume can self-assemble to form PS cylinders in a PMMA matrix. The volume ratio between the first block and the second block can be adjusted by controlling the average molecular weight of each block.

More specifically, the volume ratio of the first block to the second block can be about 15:85 to about 85:15, based on the average total volume of the block copolymer macromolecule. For alternating lamellae formation, the volume ratio of the first block to the second block is preferably 45:55 to 55:45, and more preferably 48:52 to 52:48. For cylinder formation, the volume ratio of the first block to second block is preferably about 74:26 to about 63:37, and more preferably about 72:28 to about 65:35.

One of the blocks of the block copolymer can be selectively removed (e.g., by etching techniques) relative to the other block to form structural features composed of the remaining block using known dry and/or wet etching techniques. The structural features can have any suitable form such as, for example, a line pattern, a hole pattern, and/or other patterns.

In an embodiment, the block copolymer comprises:
a first block (block A) comprising an ethylenic repeat unit of formula (A-1):

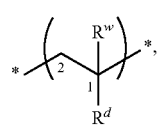

(A-1)

wherein i) $R^w$ is a monovalent radical selected from the group consisting of H, F, methyl, ethyl, and trifluoromethyl (*—$CF_3$) and ii) $R^d$ is a monovalent radical comprising an aromatic ring linked to carbon 1;

a second block (block B); and a divalent fluorinated linking group L' covalently linking an end repeat unit of block A to an end repeat unit of block B, wherein L' comprises 1-24 fluorines, wherein each of the 1-24 fluorines of L' is linked to a backbone carbon of the block copolymer;

wherein the block copolymer is capable of self-assembly in a lithographic process.

Depending on the method of polymerization used to prepare the block copolymer, an end group of block A can be linked to carbon 1 or carbon 2 of formula (A-1). For example, if the block copolymer is formed by preparing block A prior to linking block A to an L' group (or an L' precursor), then the block copolymer can comprise an end group of block A that is linked to backbone carbon 2 of formula (A-1) and an L' group that is linked to backbone carbon 1 of formula (A-1). On the other hand, if the block copolymer is prepared by growing block A from an L' precursor compound or a pre-formed macroinitiator comprising block B and an L' precursor group, then the resulting block copolymer can comprise an L' group linked to backbone carbon 2 of formula (A-1) and an end group of block A linked to backbone carbon 1 of formula (A-1).

Non-limiting $R^d$ groups of formula (A-1) include substituted and unsubstituted aryl groups. Exemplary $R^d$ groups are listed in Scheme 1, where the aromatic ring carbon shown linked to an asterisk (starred bond) is covalently bound to carbon 1 of formula (A-1).

Scheme 1.

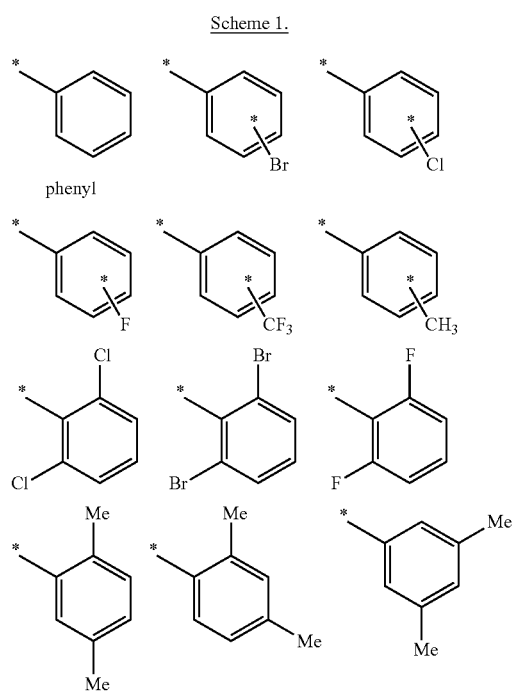

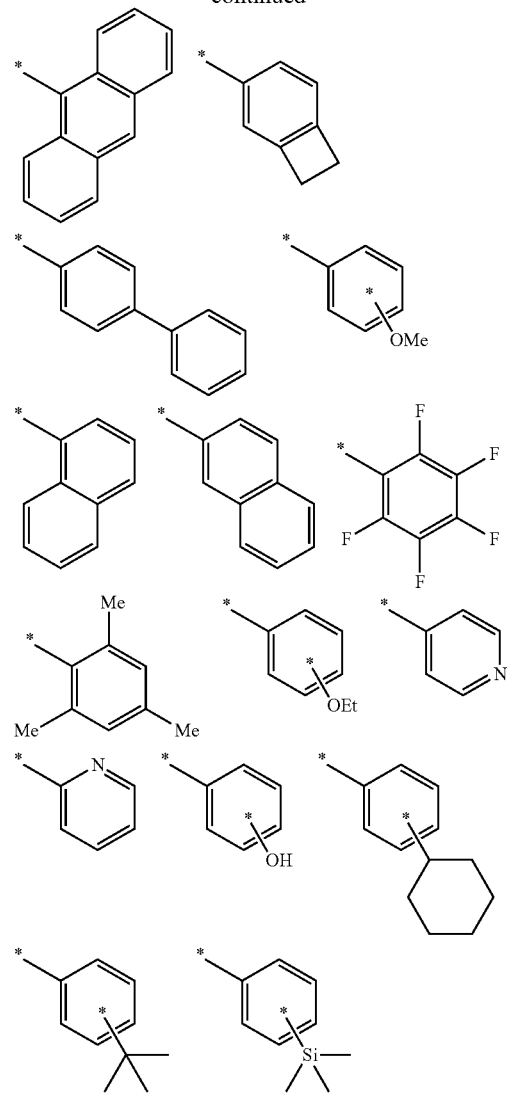

In an embodiment, $R^w$ of formula (A-1) is hydrogen, and $R^d$ is selected from the group consisting of phenyl, trimethylsilyl phenyl, fluorophenyl, pentafluorophenyl, and t-butylphenyl. Repeat units of formula (A-1) can be present singularly or in combination. The first block can be a homopolymer of a repeat unit of formula (A-1) or a random copolymer chain comprising a combination of repeat units of formula (A-1) and/or another repeat unit.

The second block (block B) can comprise a repeat unit comprising an aliphatic carbonate backbone functional group, referred to herein as carbonate repeat units. The carbonate repeat units can have formula (B-1):

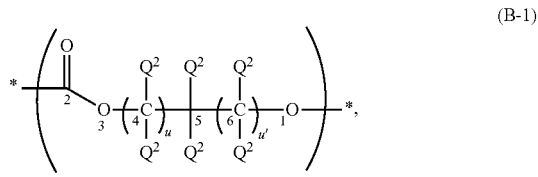

(B-1)

wherein
backbone atoms of the block copolymer are numbered,
u and u' are independent integers having a value of 0 to 6, wherein u and u' cannot both be zero; and
each $Q^2$ is an independent monovalent radical selected from the group consisting of hydrogen, halides, hydrocarbyl groups comprising 1 to 20 carbons (*—$R^1$), alkoxy groups (*—$OR^2$), aryloxy groups (*—$OR^3$), ester groups (*—C(=O)$OR^4$), and amide groups (*—C(=O)N($R^5$)$_2$), wherein $R^1$, $R^2$, $R^3$, and $R^4$ comprise 1-10 carbons, and each $R^5$ is hydrogen or a hydrocarbyl group comprising at 1-10 carbons.

Non-limiting hydrocarbyl groups (*—$R^1$) include methyl, ethyl, n-propyl, iso-propyl, n-butyl, t-butyl, sec-butyl, n-pentyl, 1-methyl-butyl, 1,1-dimethyl propyl, neo-pentyl, n-hexyl, cyclohexyl, phenyl, 2-methyl phenyl, benzyl, 2,6-dimethyl phenyl, n-heptyl, n-octyl, n-nonyl, n-decyl, propargyl, allyl, and the like.

Non-limiting alkoxy groups (*—$OR^2$) include those wherein $R^2$ is ethyl, n-propyl, iso-propyl, n-butyl, t-butyl, sec-butyl, n-pentyl, 1-methyl-butyl, 1,1-dimethyl propyl, neo-pentyl, n-hexyl, cyclohexyl, phenyl, 2-methyl phenyl, benzyl, 2,6-dimethyl phenyl, n-heptyl, n-octyl, n-nonyl, n-decyl, methoxyethyl, propargyl, allyl, and the like.

Non-limiting aryloxy groups (*—$OR^3$) include those wherein $R^3$ is phenyl, 4-methyl phenyl, benzyl, naphthyl, and the like.

Non-limiting ester groups (*—C(=O)$OR^4$) include those wherein $R^4$ is methyl, ethyl, n-propyl, iso-propyl, n-butyl, t-butyl, phenyl, benzyl, fluorophenyl, methyl phenyl, cyclopentyl, norbornyl, cyclohexyl, adamantyl, and the like.

Non-limiting amide groups (*—C(=O)N($R^5$)$_2$) include those wherein each $R^5$ is independently hydrogen, methyl, ethyl, n-propyl, iso-propyl, n-butyl, t-butyl, phenyl, benzyl, fluorophenyl, methyl phenyl, and the like.

Each $Q^2$ group can be branched or non-branched. Each $Q^2$ group can be stereospecific or non-stereospecific.

In an embodiment, u' and u of are each 1, and each $Q^2$ is hydrogen.

More specific carbonate repeat units have formula (B-2):

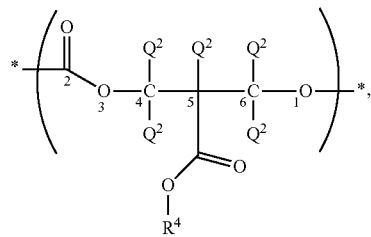

(B-2)

wherein
backbone atoms of the block copolymer are numbered, $R^4$ is a group comprising at least one carbon, and
each $Q^2$ is an independent monovalent radical selected from the group consisting of hydrogen, halides, hydrocarbyl groups comprising 1 to 20 carbons (*—$R^1$), alkoxy groups (*—$OR^2$), aryloxy groups (*—$OR^3$), ester groups (*—C(=O)$OR^4$), and amide groups (*—C(=O)N($R^5$)$_2$).

$R^1$, $R^2$, $R^3$, $R^4$ and $R^5$ have the meaning described further above. Groups of formula (B-2) include methyl, ethyl, n-propyl, iso-propyl, n-butyl, t-butyl, phenyl, benzyl, fluorophenyl, methyl phenyl, cyclopentyl, norbornyl, cyclohexyl, adamantyl, and the like.

Other carbonate repeat units have structures according to formula (B-3):

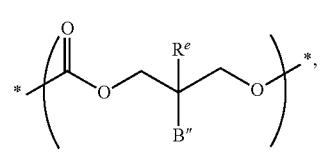

(B-3)

wherein
$R^e$ is an independent monovalent radical selected from the group consisting of hydrogen, methyl, and ethyl, and
B" is an independent monovalent radical selected from the group consisting of hydrogen, hydrocarbyl groups comprising 1 to 20 carbons, and ester groups *—$CO_2R^f$ wherein $R^f$ is a monovalent hydrocarbyl group comprising 1 to 20 carbons.

More specific $R^f$ groups include methyl, ethyl, n-propyl, iso-propyl, n-butyl, sec-butyl, tert-butyl, n-pentyl, neo-pentyl, iso-pentyl, cyclopentyl, norbornyl, cyclohexyl, phenyl, fluorophenyl, methyl phenyl, benzyl, adamantyl, and the like.

In an embodiment, $R^e$ is hydrogen and each B" is hydrogen. In another embodiment, each $R^e$ is methyl and each B" is *—$CO_2Me$, *—$CO_2Et$, *—$CO_2Pr$ (propyl ester), or *—$CO_2Bn$ (benzyl ester).

Other more specific aliphatic carbonate repeat units have structures according to formula (B-4):

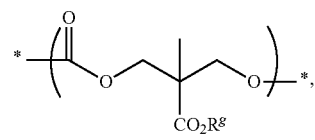

(B-4)

wherein $R^g$ is monovalent hydrocarbyl group comprising 1-20 carbons.

More specific $R^g$ groups include methyl, ethyl, n-propyl, iso-propyl, n-butyl, sec-butyl, tert-butyl, n-pentyl, neo-pentyl, iso-pentyl, cyclopentyl, norbornyl, cyclohexyl, phenyl, fluorophenyl, methyl phenyl, benzyl, adamantyl, and the like. In an embodiment, $R^g$ is selected from the group consisting of methyl, ethyl, propyl, butyl, pentyl, hexyl, and benzyl.

Non-limiting exemplary carbonate repeat units include those of Scheme 2.

Scheme 2.

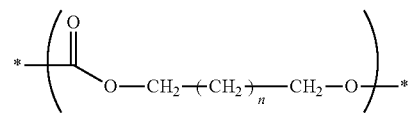

n = 0, 1, 2, 3, 4

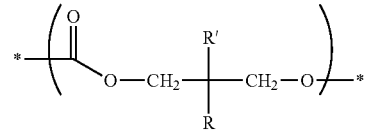

R' = Me, Et, n-Propyl
R = H, Me

-continued

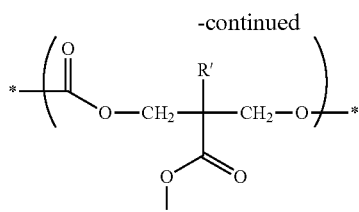

R' = Me, Et, n-Propyl
R = Me, Et, t-Butyl, Benzyl

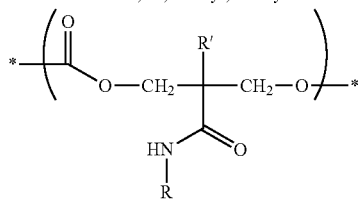

R' = Me, Et, n-Propyl
R = Me, Et, t-Butyl, Benzyl, Phenyl

The second block can comprise a repeat unit having an aliphatic ester backbone functional group, referred to herein as an ester repeat unit. The ester repeat units can have a structure according to formula (B-5):

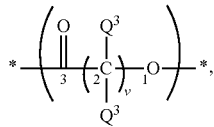

(B-5)

wherein
atoms of the block copolymer backbone of the second block are numbered,
v is an integer having a value of 1 to 6; and
each $Q^3$ is an independent monovalent radical selected from the group consisting of hydrogen and hydrocarbyl groups comprising 1 to 20 carbons.

More specific $Q^3$ hydrocarbyl groups include methyl, ethyl, n-propyl, iso-propyl, n-butyl, sec-butyl, tert-butyl, n-pentyl, neo-pentyl, iso-pentyl, cyclopentyl, norbornyl, cyclohexyl, phenyl, fluorophenyl, methyl phenyl, benzyl, adamantyl, and the like.

More specific ester repeat units include those of Scheme 3.

Scheme 3.

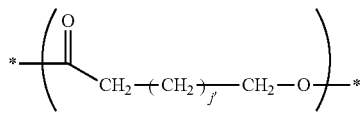

j' = 0, 1, 2, 3, 4

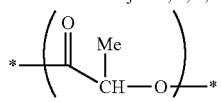

In an embodiment, the second block of the diblock copolymer comprises an ester repeat unit of structure:

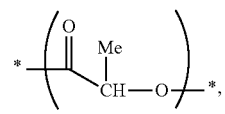

which can be formed by ring opening polymerization a lactide. The ester repeat units can be stereospecific or non-stereospecific (e.g., an ester repeat unit derived from the ring opening of L-lactide, D-lactide, or a combination thereof).

More specific L' groups comprise a linear divalent fluorinated alkylene group of formula (C-1):

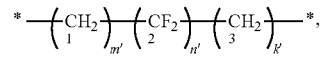

(C-1)

wherein
each carbon linked to a fluorine is a backbone carbon of the block copolymer,
n' is an integer having a value of 1-12,
m' is an integer having a value of 1-5, and
k' is an integer having a value of 1-5.
In an embodiment, m' is 1, k' is 1, and n' is 2 to 12.
Other L' groups comprise a divalent linear fluorinated ethylene oxide group in accordance with formula (C-2):

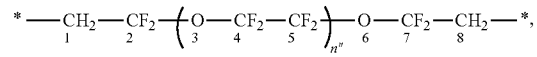

(C-2)

wherein
each carbon linked to a fluorine is a backbone carbon of the block copolymer, and
n" is an integer having a value of 1-5.
More specific L' groups have a structure of formula (C-3):

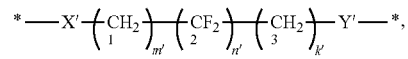

(C-3)

wherein
each carbon linked to a fluorine is a backbone carbon of the block copolymer,
n' is an integer having a value of 1-12,
m' is an integer having a value of 1-5,
k' is an integer having a value of 1-5,
X' is a non-fluorinated functional group capable of linking the L' group to an end repeat unit of block A of the block copolymer,
Y' is a non-fluorinated functional group capable of linking the L' group to an end repeat unit of block B of the block copolymer.

X' and/or Y' can independently be a single bond, a heteroatom of the polymer backbone (e.g., *—O—*, *—S—*), or another functional group. Other non-limiting X' and Y' groups include: *—R—*, *—C(=O)—*, *—O—C(=O)—*, *—O—C(=O)—O—*), and *—R—C(=O)—O—*, wherein R is a hydrocarbyl comprising 1-20 carbons. Non-limiting examples of *—R—* groups are structures

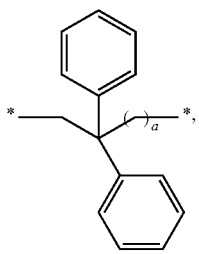

wherein a is an integer having a value of 0 to 5.

A non-limiting example of *—R—C(=O)—O—* is the structure

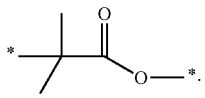

In an embodiment, Y' is *—O—*. In another embodiment, X' is:

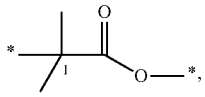

wherein carbon 1 is linked to block A and the oxygen is linked carbon 1 of formula (C-3).

Other L' groups have a structure according to formula (C-4):

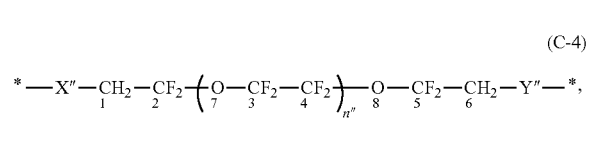

wherein
each carbon linked to a fluorine is a backbone carbon of the block copolymer, and
$n''$ is an integer having a value of 1-5,
X" is a non-fluorinated functional group capable of linking the L' group to an end repeat unit of block A of the block copolymer,
Y" is a non-fluorinated functional group capable of linking the L' group to an end repeat unit of block B of the block copolymer.

X" and/or Y" can independently be a single bond, a heteroatom of the polymer backbone (e.g., *—O—*, *—S—*), or another functional group. Other non-limiting X" and Y" groups include: *—R—*, *—C(=O)—*, *—O—C(=O)—*, *—O—C(=O)—O—*), and *—R—C(=O)—O—*, wherein *—R—* is a hydrocarbyl comprising 1-20 carbons. Non-limiting examples of *—R—* groups are structures

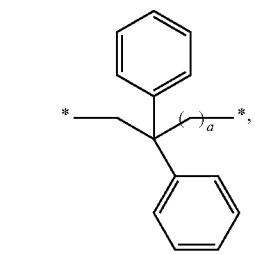

wherein a is an integer having a value of 0 to 5.

A non-limiting example of *—R—C(=O)—O—* is the structure

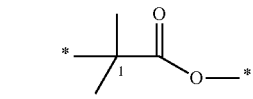

In an embodiment, Y" is *—O—*. In another embodiment, X" is:

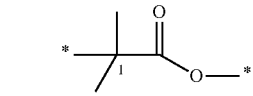

wherein carbon 1 is linked to block A and the oxygen is linked carbon 1 of formula (C-4).

More particular L' groups include those of Scheme 4.

Scheme 4.

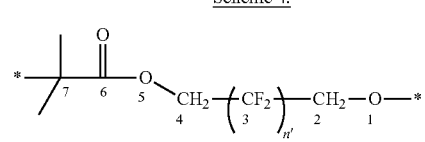

$n' = 1\text{-}12$

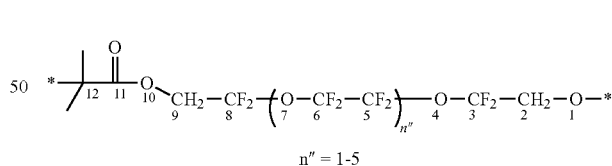

$n'' = 1\text{-}5$

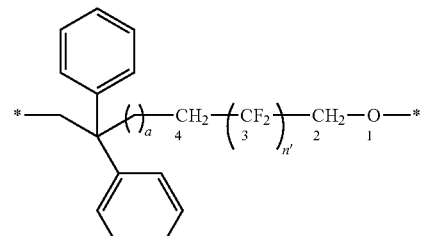

$n' = 1\text{-}12$
$a = 0.5$

-continued

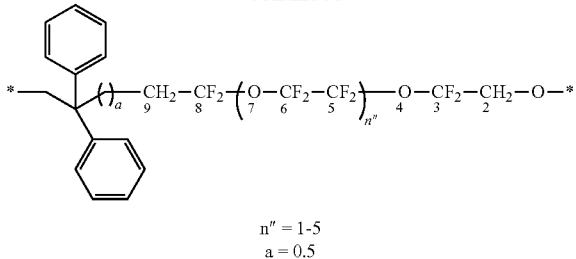

n″ = 1-5
a = 0.5

In another embodiment, the diblock copolymer has a structure according to formula (D-1):

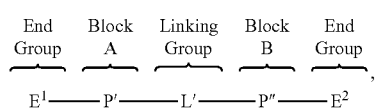

(D-1)

wherein
$E^1$ is a monovalent first end group,
$E^2$ is a monovalent second end group,
P' is a first polymer chain representing a first block (block A) of the block copolymer,
P″ is a second polymer chain representing a second block (block B) of the block copolymer, and
L' is a divalent fluorinated linking group joining an end repeat unit of P' to an end repeat unit of P″, wherein L' comprises 1-24 fluorines, and each of the 1-24 fluorines of L' is linked to a backbone carbon of the block copolymer,
a film layer comprising the block copolymer is capable of self-assembly in a lithographic process.

In an embodiment, P' comprises an ethylenic repeat unit comprising an aromatic ring linked to a backbone carbon of the block copolymer. The ethylenic repeat unit is preferably selected from the group consisting of

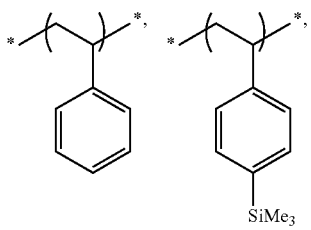

and combinations thereof. In another embodiment, L' comprises 1-12 difluoromethylene groups, wherein each of the carbons of the difluoromethylene groups is a backbone carbon of the block copolymer.

End groups $E^1$ and $E^2$ can be any suitable end groups. For example, $E^1$ and/or $E^2$ can be a hydrogen, a halide (e.g., fluoride, chloride, bromide, iodide), a hydroxyl group, a hydrocarbyl group, an ester group, an ether group, or another carbon bearing group.

In an embodiment, P″ comprises a polymer chain selected from the group consisting of aliphatic polycarbonate chain, aliphatic polyester chain, aliphatic polyestercarbonate chain, and aliphatic polyether chain. The polycarbonate chain can be a homopolymer or copolymer chain comprising aliphatic carbonate repeat units. The polyester chain can be a homopolymer or copolymer chain comprising aliphatic ester repeat units. The polyestercarbonate comprises aliphatic carbonate repeat units and aliphatic ester repeat units. The polyether chain can comprise a homopolymer or copolymer chain comprising aliphatic alkylene oxide repeat units, preferably repeat units formed by ring opening polymerization ethylene oxide, propylene oxide, and/or glycidyl ethers.

Other more specific diblock copolymers have a structure according to formula (D-2), wherein the square brackets represent separate blocks A and B of the block copolymer:

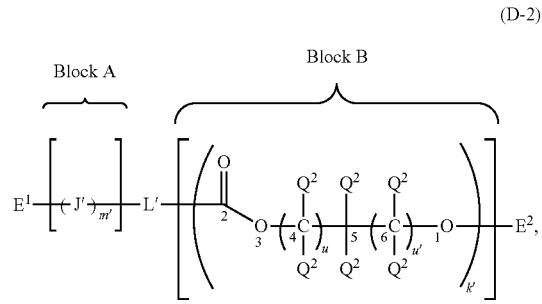

(D-2)

m' represents the average number of respective repeat units enclosed in parentheses, and m' has an average value greater than 1,
k' represents the average number of respective repeat units enclosed in parentheses, and k' has an average value greater than 1,
u and u' are independent integers having a value of 0 to 6, wherein u and u' cannot both be zero,
$E^1$ is a monovalent first end group,
$E^2$ is a monovalent second end group,
L' is a divalent linking group comprising 1-24 fluorines, wherein each of the 1-24 fluorines is linked to a backbone carbon of the block copolymer,
each $Q^2$ is an independent monovalent radical selected from the group consisting of hydrogen, halides, hydrocarbyl groups comprising 1 to 20 carbons (*—$R^1$), alkoxy groups (*—$OR^2$), aryloxy groups (*—$OR^3$), ester groups (*—$C(=O)OR^4$), and amide groups (*—$C(=O)N(R^5)_2$), wherein $R^1$, $R^2$, $R^3$, and $R^4$ comprise 1-10 carbons, and each $R^5$ is hydrogen or a hydrocarbyl group comprising at 1-10 carbons, and
each J' is an ethylenic repeat unit of formula (A-1):

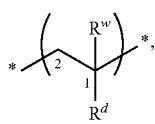

(A-1)

wherein i) $R^d$ is an independent monovalent radical comprising an aromatic ring linked to a backbone carbon of the block copolymer, and ii) $R^w$ is an independent monovalent radical selected from the group consisting of H, F, methyl, ethyl, and trifluoromethyl (*—$CF_3$).

In the above structure and those that follow, depending on the method of preparation, the block copolymer can comprise $E^1$ linked to backbone carbon 2 of a first ethylenic repeat unit of formula (A-1), with L' being correspondingly linked to backbone carbon 1 of another ethylenic repeat unit of formula (A-1). This scenario is feasible by forming block A prior to linking block A to an L' precursor group (e.g., by anionic polymerization of styrene to form a polystyrene (PS) block A having a living anionic end unit, and then linking the anionic end unit to an L' precursor group). Alternatively, the block copolymer can comprise $E^1$ linked to backbone carbon 1 of a first ethylenic repeat unit of formula (A-1), with L' being correspondingly linked to backbone carbon 2 of another ethylenic repeat unit of formula (A-1). This scenario is feasible by growing block A from an L' precursor compound that initiates the polymerization or using a polymeric initiator comprising block B, $E^2$ and an L' precursor group, and initiating the polymerization of block A from the L' precursor group. The examples further below demonstrate this latter approach.

Other more specific diblock copolymers have a structure according to formula (D-3), wherein the square brackets represent separate blocks A and B of the block copolymer:

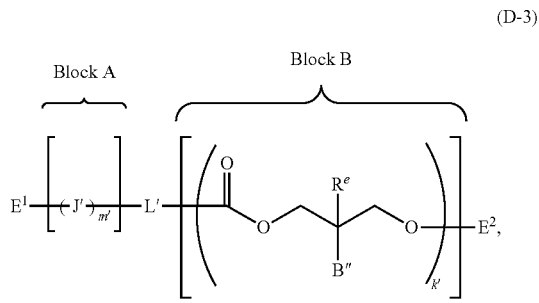

(D-3)

m' represents the average number of respective repeat units enclosed in parentheses, and m' has an average value greater than 1, k' represents the average number of respective repeat units enclosed in parentheses, and k' has an average value greater than 1, B" is an independent monovalent radical selected from the group consisting of hydrogen, hydrocarbyl groups comprising 1 to 20 carbons, and ester groups *—$CO_2K$ wherein $R^f$ is a monovalent hydrocarbyl group comprising 1 to 20 carbons, $E^1$ is a monovalent first end group, $E^2$ is a monovalent second end group, each J' is an ethylenic repeat unit of formula (A-1):

(A-1)

wherein i) $R^d$ is an independent monovalent radical comprising an aromatic ring linked to a backbone carbon of the block copolymer, and ii) $R^w$ is an independent monovalent radical selected from the group consisting of H, F, methyl, ethyl, and trifluoromethyl (*—$CF_3$), L' is a divalent linking group comprising 1-24 fluorines, wherein each of the 1-24 fluorines is linked to a backbone carbon of the block copolymer, and $R^e$ is an independent monovalent radical selected from the group consisting of hydrogen, methyl, and ethyl.

In an embodiment, each $R^w$ is hydrogen, and each $R^d$ is selected from the group consisting of phenyl and 4-trimethylsilylphenyl. In another embodiment each B" is hydrogen and each $R^e$ is hydrogen. In another embodiment, each B" is selected from the group consisting of *—$CO_2Me$ and *—$CO_2Et$, and each $R^e$ is methyl. In another embodiment, $E^1$ is bromide and $E^2$ is acetyl.

Other diblock copolymers have a structure according to formula (D-4), wherein the square brackets represent separate blocks A and B of the block copolymer:

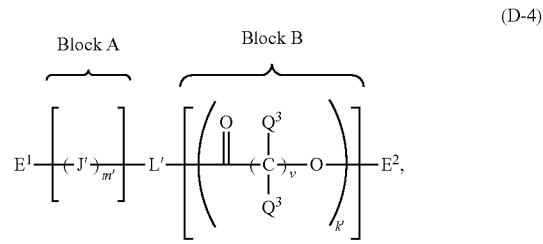

(D-4)

m' represents the average number of respective repeat units enclosed in parentheses, and m' has an average value greater than 1, k' represents the average number of respective repeat units enclosed in parentheses, and k' has an average value greater than 1, v is an integer having a value of 1 to 6, $E^1$ is a monovalent first end group, $E^2$ is a monovalent second end group, L' is a divalent linking group comprising 1-24 fluorines, wherein each of the 1-24 fluorines is linked to a backbone carbon of the block copolymer, each $Q^3$ is an independent monovalent radical selected from the group consisting of hydrogen, and alkyl groups comprising 1 to 20 carbons, and each J' is an ethylenic repeat unit of formula (A-1):

(A-1)

wherein i) $R^d$ is an independent monovalent radical comprising an aromatic ring linked to a backbone carbon of the block copolymer, and ii) $R^w$ is an independent monovalent radical selected from the group consisting of H, F, methyl, ethyl, and trifluoromethyl (*—$CF_3$).

In an embodiment, each $R^w$ is hydrogen, v is 4 or 5, each $Q^3$ is hydrogen, and each $R^d$ is selected from the group consisting of phenyl and 4-trimethylsilylphenyl. In another embodiment, v is 1, one $Q^3$ is methyl and another $Q^3$ is hydrogen.

Non-limiting examples of the disclosed diblock copolymers for self-assembly include those of Scheme 5. In these examples, L' is linked to backbone carbon 2 of a PS repeat unit, and the bromide end group is linked to carbon 1 of another PS repeat unit.

Scheme 5.
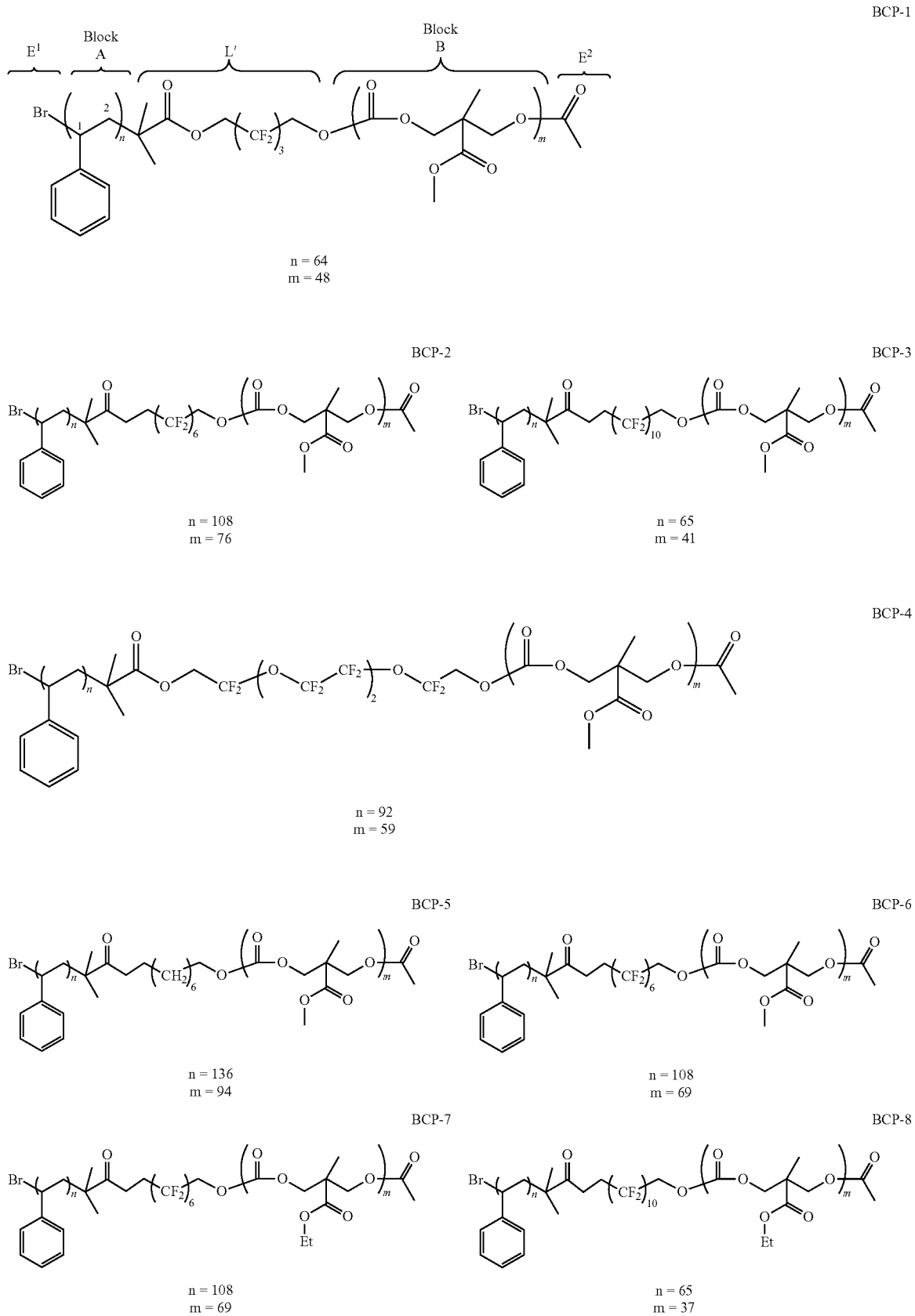

-continued

BCP-9

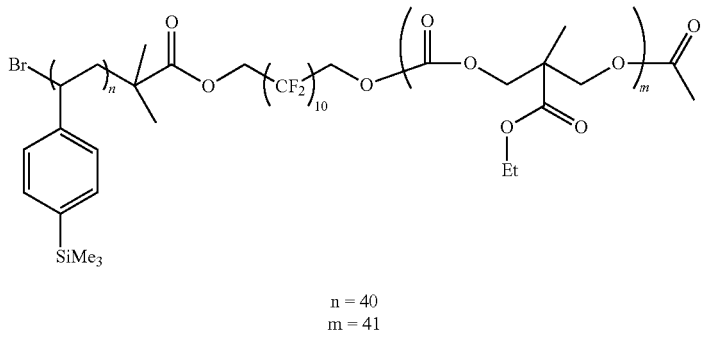

n = 40
m = 41

The BCPs can have a number average molecular weight (Mn) of about 1500 to about 100000, more particularly 4000 to about 50,000, and even more particularly about 4000 to about 40000. The BCPs can have a polydispersity index (PDI) generally from 1.0 to 3.0, more particularly 1.0 to 2.0, and even more particularly 1.0 to 1.5.

In the examples further below, the number average molecular weight (Mn) of the BCP is in a range of 22,400 to 30,300 (Table 4).

Herein, block A of the BCP is the low surface energy block (e.g., poly(styrene) block (PS)), and block B is the high surface energy block (e.g., polycarbonate, polyester, polyether). In the examples further below (Table 4), the number average molecular weight (Mn) of the low surface energy block A is in a range of 6800 to 14200, and the high surface energy block B (PMTC-Me, PLA, PMTC-Et) is in a range of 7000 to 16400.

Preparation of the Block Copolymers for Self-assembly

The BCP can be produced using any suitable polymerization technique, including but not limited to free radical polymerization, anionic polymerization, cationic polymerization, atom transfer radical polymerization (ATRP), nitroxide mediated polymerization (NMP), reversible addition-fragmentation chain transfer (RAFT) polymerization, and/or ring opening polymerizations.

In a preferred embodiment, the BCP comprises a block B comprising an aliphatic carbonate repeat unit, aliphatic ester repeat unit, aliphatic ether repeat unit, or a combination thereof. These BCPs can be prepared by a ring opening polymerization (ROP) of a cyclic carbonate monomer, cyclic ester monomer, and/or cyclic ether monomer, respectively, using a ROP polymeric initiator.

Initiators for ring opening polymerizations generally include nucleophilic groups such as alcohols, primary amines, secondary amines, and thiols. The ROP polymeric initiator comprises i) the first block of the block copolymer, ii) an L' precursor group comprising nucleophilic group (e.g., an alcohol group) capable of initiating a ROP of a cyclic carbonate monomer, cyclic ester monomer, and/or cyclic ether monomer.

The ROP polymeric initiator can be produced using any suitable polymerization technique, including but not limited to free radical polymerization, anionic polymerization, cationic polymerization, atom transfer radical polymerization (ATRP), nitroxide mediated polymerization (NMP), and/or reversible addition-fragmentation chain transfer (RAFT) polymerization.

Scheme 6 illustrates the formation of ROP polymeric initiator HPS-1 using ATRP initiator MH-1 (an L' precursor compound), catalyst CuBr/PMDETA, and styrene monomer.

Scheme 6.

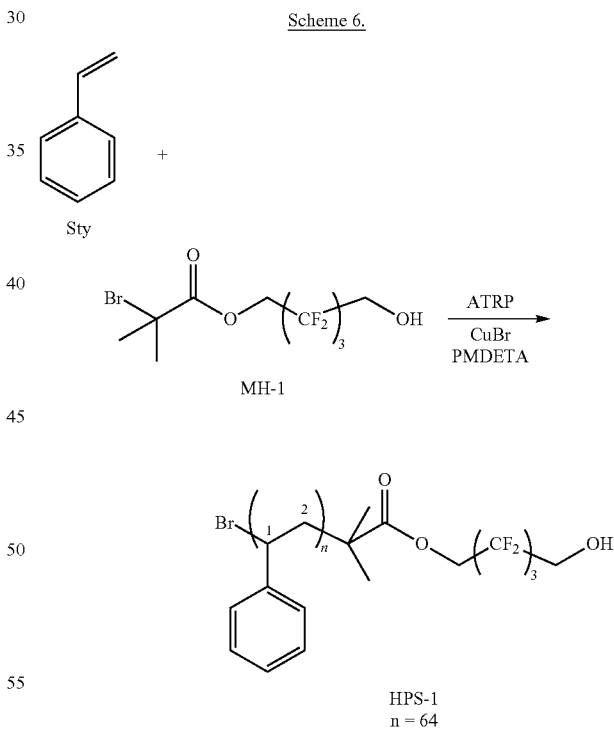

HPS-1
n = 64

Non-limiting vinyl polymerizable monomers for ATRP polymerizations include styrenes, vinyl pyridines, methacrylates, methacrylic acid, acrylates, acrylic acid, acrylamides, methacrylamides, and acrylonitrile. Vinyl polymerizable monomers can be used singularly or in combination to form the ROP polymeric initiator.

Other ATRP initiators (L' precursor compounds) include those of Scheme 7.

Scheme 7.

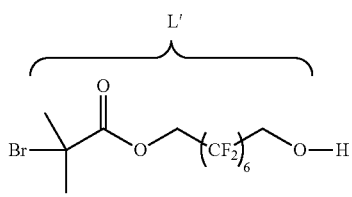

MH-2

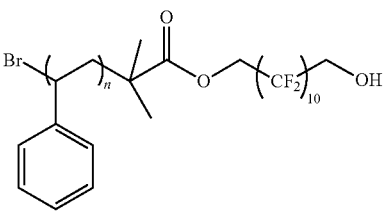

HPS-3 n = 65

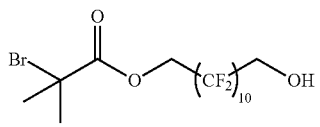

MH-3

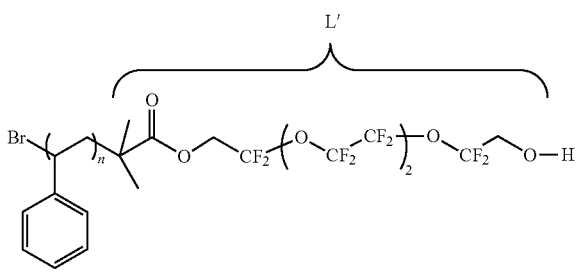

HPS-4 n = 60

MH-4

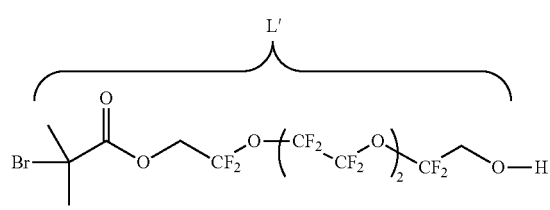

HPS-6

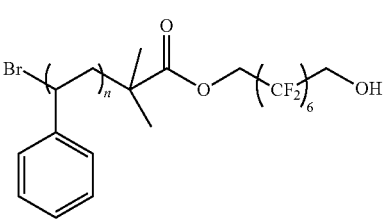

n = 136

The above ATRP initiators can be prepared by the reaction of the corresponding fluorinated diol compound with 2-bromo-isobutyryl bromide, as shown in the examples further below.

Other non-limiting ROP polymeric initiators that can be prepared by ATRP are shown in Scheme 8.

Scheme 8.

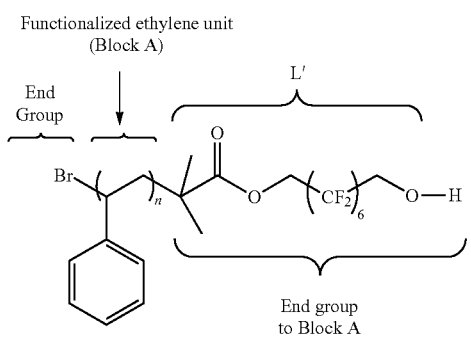

HPS-2
n = 108

HPS-7

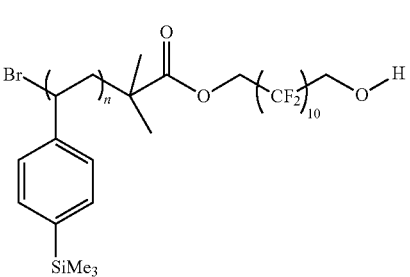

n = 40

Other ROP polymeric initiators can be prepared by anionic polymerization of a vinyl polymerizable monomer as shown in Scheme 9. Diphenylethylene is an optional chain terminating agent in the polymerization.

Scheme 9.
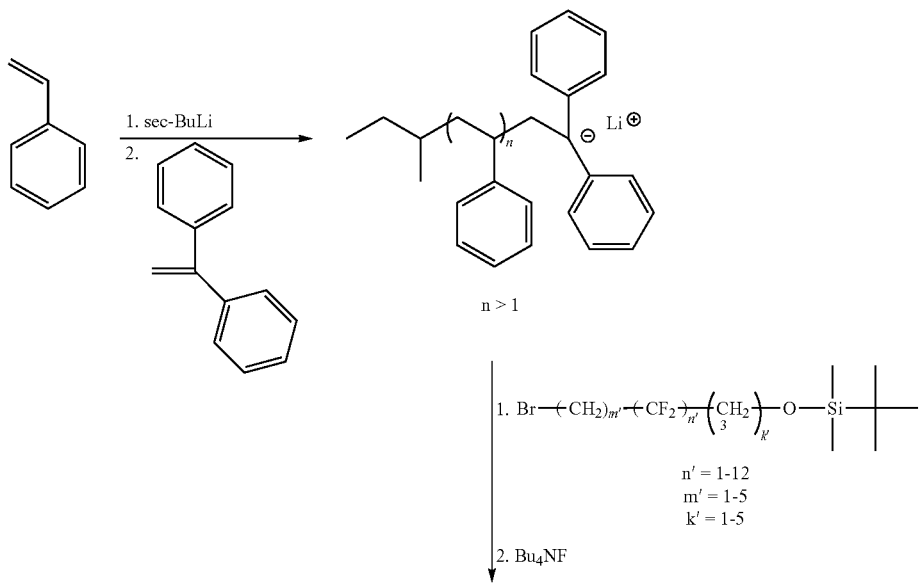
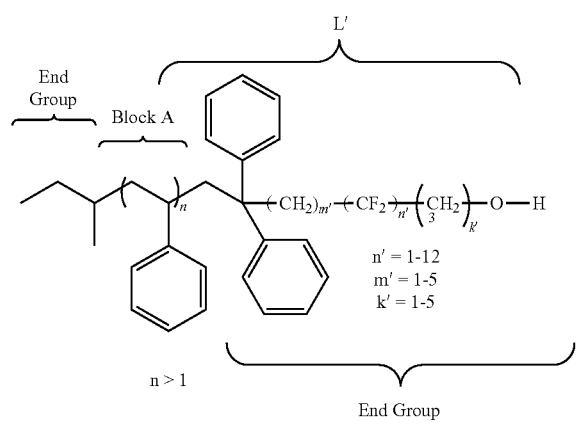
The ROP polymeric initiators can comprise a silicon, as illustrated in Scheme 10.
Scheme 10.
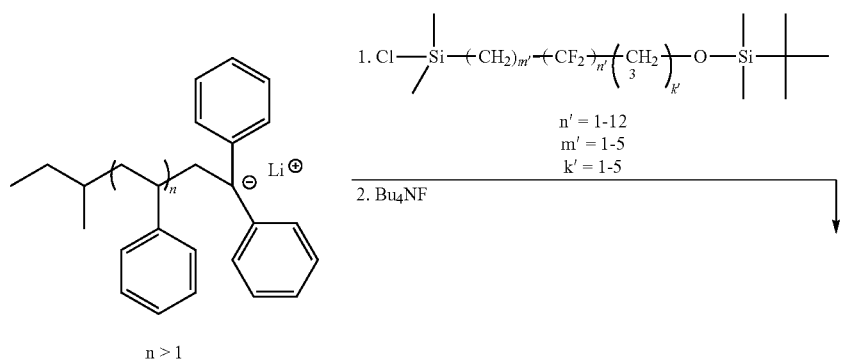

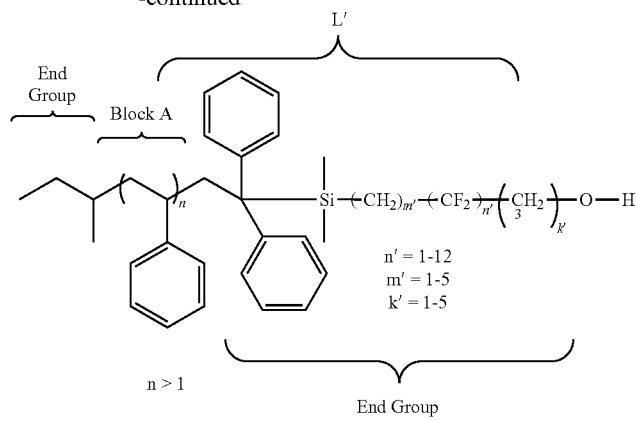

The number average molecular weight Mn of the ROP polymeric initiator can be about 500 to about 50,000, more specifically about 1000 to about 35,000.

The ROP reaction mixture comprises a cyclic carbonyl monomer, a ROP catalyst, a solvent, and a ROP polymeric initiator. The ROP catalyst can be a base or acid catalyst (e.g., DBU, diphenyl phosphate). Scheme 11 illustrates the preparation BCP-1 using ROP polymeric initiator HPS-1, cyclic carbonate monomer MTC-Me, and ROP base catalyst 1,8-diazabicyclo[5.4.0]undec-7-ene (DBU). In this example, the initial block copolymer formed is endcapped with an acetyl group using acetyl chloride (AcCl)/triethylamine (TEA) following the ROP.

does not adversely affect self-assembly. The halogen group can be removed using known standard techniques if desired.

The following methods of preparing and purifying a diblock copolymer comprising a carbonate and/or ester repeat units can be applied to the preparations of triblock and other block copolymers. The methods provide a block copolymer that is substantially free of any polycarbonate/polyester homopolymer and/or polycarbonate/polyester random copolymer.

Ring Opening Polymerizations (ROP)

The following is a general description of methods, conditions and materials for ring opening polymerizations of cyclic carbonates and cyclic esters.

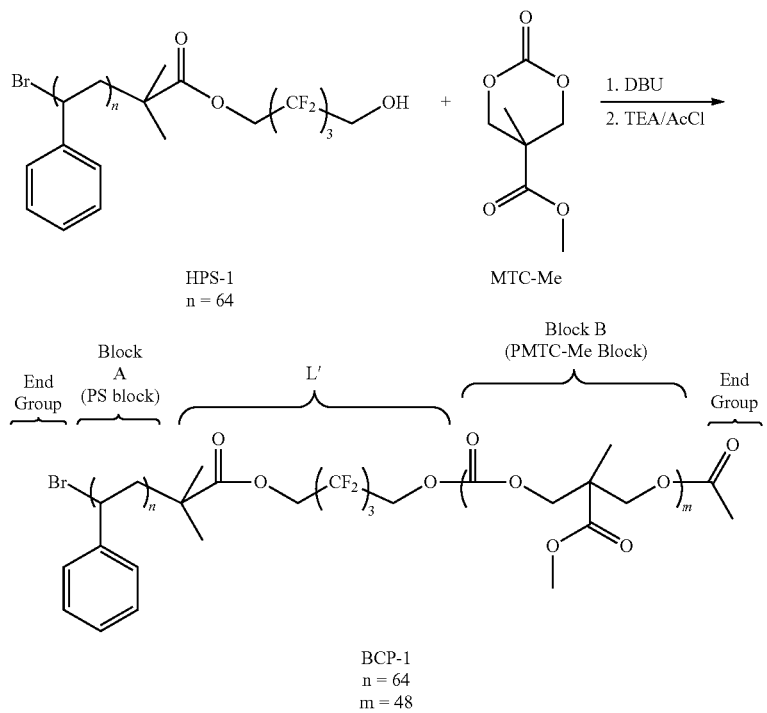

The initial block copolymer chain can be endcapped using any suitable end group, with the proviso the endcap group The ring-opening polymerization can be performed at a temperature that is about ambient temperature or higher, 15°

C. to 100° C., and more specifically ambient temperature. Reaction times vary with solvent, temperature, agitation rate, pressure, and equipment, but in general the polymerizations are complete within about 1 hour to about 48 hours.

The ROP reaction can be performed with or without the use of a solvent, preferably with a solvent. Exemplary solvents include dichloromethane, chloroform, benzene, toluene, xylene, chlorobenzene, dichlorobenzene, benzotrifluoride, petroleum ether, acetonitrile, pentane, hexane, heptane, 2,2,4-trimethylpentane, cyclohexane, diethyl ether, t-butyl methyl ether, diisopropyl ether, dioxane, tetrahydrofuran, or a combination comprising one of the foregoing solvents. When a solvent is present, a suitable monomer concentration is about 0.1 to 5 moles per liter, and more particularly about 0.2 to 4 moles per liter.

The ROP polymerizations are conducted using an inert (i.e., dry) atmosphere, such as nitrogen or argon, and at a pressure of from 100 to 500 MPa (1 to 5 atm), more typically at a pressure of 100 to 200 MPa (1 to 2 atm). At the completion of the reaction, the solvent can be removed using reduced pressure.

ROP Catalysts

No restriction is placed on the ROP catalyst. Less preferred catalysts for the ROP polymerization include metal oxides such as tetramethoxy zirconium, tetra-iso-propoxy zirconium, tetra-iso-butoxy zirconium, tetra-n-butoxy zirconium, tetra-t-butoxy zirconium, triethoxy aluminum, tri-n-propoxy aluminum, tri-iso-propoxy aluminum, tri-n-butoxy aluminum, tri-iso-butoxy aluminum, tri-sec-butoxy aluminum, mono-sec-butoxy-di-iso-propoxy aluminum, ethyl acetoacetate aluminum diisopropylate, aluminum tris(ethyl acetoacetate), tetraethoxy titanium, tetra-iso-propoxy titanium, tetra-n-propoxy titanium, tetra-n-butoxy titanium, tetra-sec-butoxy titanium, tetra-t-butoxy titanium, tri-iso-propoxy gallium, tri-iso-propoxy antimony, tri-iso-butoxy antimony, trimethoxy boron, triethoxy boron, tri-iso-propoxy boron, tri-n-propoxy boron, tri-iso-butoxy boron, tri-n-butoxy boron, tri-sec-butoxy boron, tri-t-butoxy boron, tri-iso-propoxy gallium, tetramethoxy germanium, tetraethoxy germanium, tetra-iso-propoxy germanium, tetra-n-propoxy germanium, tetra-iso-butoxy germanium, tetra-n-butoxy germanium, tetra-sec-butoxy germanium and tetra-t-butoxy germanium; halogenated compounds such as antimony pentachloride, zinc chloride, lithium bromide, tin(IV) chloride, cadmium chloride and boron trifluoride diethyl ether; alkyl aluminum such as trimethyl aluminum, triethyl aluminum, diethyl aluminum chloride, ethyl aluminum dichloride and tri-iso-butyl aluminum; alkyl zinc such as dimethyl zinc, diethyl zinc and diisopropyl zinc; tertiary amines such as triallylamine, triethylamine, tri-n-octylamine and benzyldimethylamine; heteropolyacids such as phosphotungstic acid, phosphomolybdic acid, silicotungstic acid and alkali metal salts thereof; zirconium compounds such as zirconium acid chloride, zirconium octanoate, zirconium stearate and zirconium nitrate. More particularly, the zirconium catalyst can be zirconium octanoate, tetraalkoxy zirconium or a trialkoxy aluminum compound.

Preferred ROP catalysts are organocatalysts whose chemical formulas contain no metal. Base organocatalysts for ROPs of cyclic carbonyl monomers include tertiary amines such as triallylamine, triethylamine, tri-n-octylamine and benzyldimethylamine 4-dimethylaminopyridine, phosphines, N-heterocyclic carbenes (NHC), bifunctional aminothioureas, phosphazenes, amidines, and guanidines.

Other ROP catalysts include thiourea organocatalysts N-(3,5-trifluoromethyl)phenyl-N'-cyclohexyl-thiourea (TU):

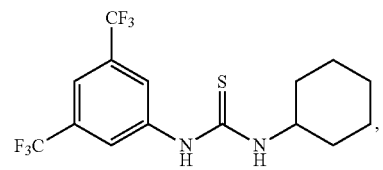

and bis-thiourea

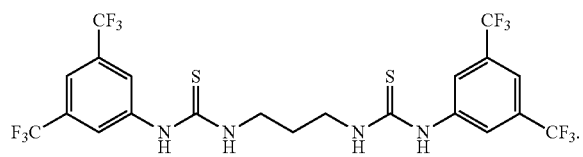 [SMILES: FC(F)(F)c1cc(NC(=S)NCCCNC(=S)Nc2cc(C(F)(F)F)cc(C(F)(F)F)c2)cc(C(F)(F)F)c1]

Other ROP organocatalysts comprise at least one 1,1,1,3,3,3-hexafluoropropan-2-ol-2-yl (HFA) group. Singly-donating hydrogen bond catalysts have the formula (E-1):

$$R^2-C(CF_3)_2OH \tag{E-1}$$

wherein $R^2$ represents a hydrogen or a monovalent radical having from 1 to 20 carbons, for example an alkyl group, substituted alkyl group, cycloalkyl group, substituted cycloalkyl group, heterocycloalkyl group, substituted heterocycloalklyl group, aryl group, substituted aryl group, or a combination thereof. Exemplary singly-donating hydrogen bonding catalysts are listed in Scheme 12.

Scheme 12.

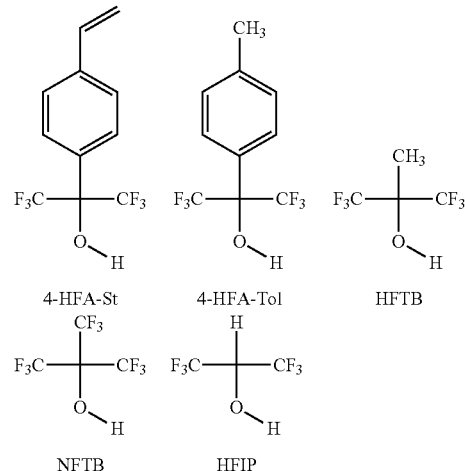

Doubly-donating hydrogen bonding catalysts have two HFA groups, represented by the general formula (E-2):

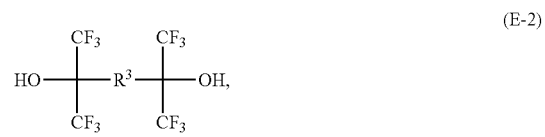

wherein $R^3$ is a divalent radical bridging group containing from 1 to 20 carbons, such as an alkylene group, a substituted alkylene group, a cycloalkylene group, substituted cycloalkylene group, a heterocycloalkylene group, substituted heterocycloalkylene group, an arylene group, a substituted arylene group, or a combination thereof. Representative double hydrogen bonding catalysts of formula (E-2) include those listed in Scheme 13. In a specific embodiment, $R^2$ is an arylene or substituted arylene group, and the HFA groups occupy positions meta to each other on the aromatic ring.

Scheme 13.

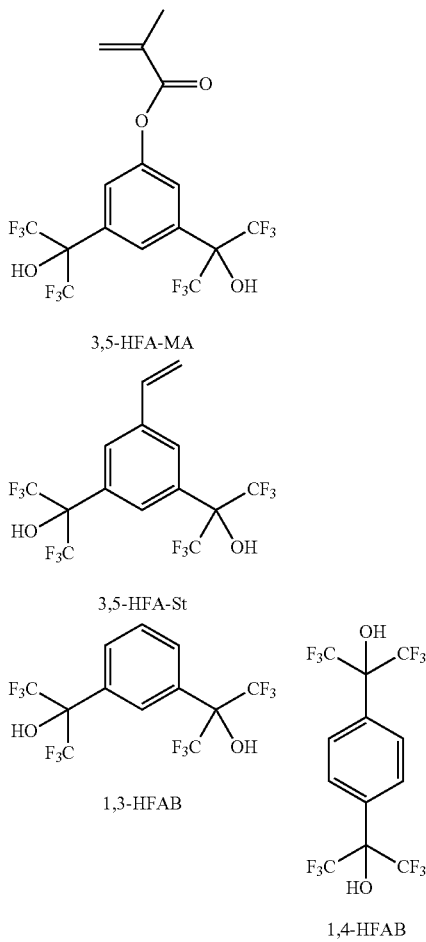

3,5-HFA-MA 3,5-HFA-St 1,3-HFAB 1,4-HFAB

Preferred hydrogen bonding catalysts include 4-HFA-St, 4-HFA-Tol, HFTB, NFTB, HPIP, 3,5-HFA-MA, 3,5-HFA-St, 1,3-HFAB, 1,4-HFAB, and combinations thereof.

The HFA catalyst can be bound to a support. In one embodiment, the support comprises a polymer, a crosslinked polymer bead, an inorganic particle, or a metallic particle. HFA-containing polymers can be formed by known methods including direct polymerization of an HFA-containing monomer (for example, the methacrylate monomer 3,5-HFA-MA or the styryl monomer 3,5-HFA-St). Functional groups in HFA-containing monomers that can undergo direct polymerization (or polymerization with a comonomer) include acrylate, methacrylate, alpha, alpha, alpha-trifluoromethacrylate, alpha-halomethacrylate, acrylamido, methacrylamido, norbornene, vinyl, vinyl ether, and other groups known in the art. Examples of linking groups include $C_1$-$C_{12}$ alkyl groups, $C_1$-$C_{12}$ heteroalkyl groups, ether groups, thioether groups, amino groups, ester groups, amide groups, and combinations thereof. Also contemplated are catalysts comprising charged HFA-containing groups bound by ionic association to oppositely charged sites on a polymer or a support surface.

Other ROP catalysts include acid organocatalysts (e.g., diphenylphosphate (DPP), triflic acid, and the like).

The ROP reaction mixture comprises at least one ROP catalyst and, when appropriate, several ROP catalysts together. The ROP catalyst is added in a proportion of 1/20 to 1/40,000 moles relative to the cyclic carbonyl monomers, and preferably in a proportion of 1/1,000 to 1/20,000 moles relative to the cyclic carbonyl monomers.

ROP Accelerators.

The ROP polymerization can be conducted in the presence of an optional accelerator, in particular a nitrogen base. Exemplary nitrogen base accelerators are listed below and include pyridine (Py), N,N-dimethylaminocyclohexane ($Me_2NCy$), 4-N,N-dimethylaminopyridine (DMAP), trans 1,2-bis(dimethylamino)cyclohexane (TMCHD), 1,8-diazabicyclo[5.4.0]undec-7-ene (DBU), 1,5,7-triazabicyclo[4.4.0]dec-5-ene (TBD), 7-methyl-1,5,7-triazabicyclo[4.4.0]dec-5-ene (MTBD), (–)-sparteine, (Sp) 1,3-bis(2-propyl)-4,5-dimethylimidazol-2-ylidene (Im-1), 1,3-bis(2,4,6-trimethylphenyl)imidazol-2-ylidene (Im-2), 1,3-bis(2,6-di-i-propylphenyl(imidazol-2-ylidene (Im-3), 1,3-bis(1-adamantyl)imidazol-2-ylidene (Im-4), 1,3-di-i-propylimidazol-2-ylidene (Im-5), 1,3-di-t-butylimidazol-2-ylidene (Im-6), 1,3-bis(2,4,6-trimethylphenyl)-4,5-dihydroimidazol-2-ylidene (Im-7), 1,3-bis(2,6-di-i-propylphenyl)-4,5-dihydroimidazol-2-ylidene, 1,3-bis(2,6-di-i-propylphenyl)-4,5-dihydroimidazol-2-ylidene (Im-8) or a combination thereof, shown in Scheme 14.

Scheme 14.

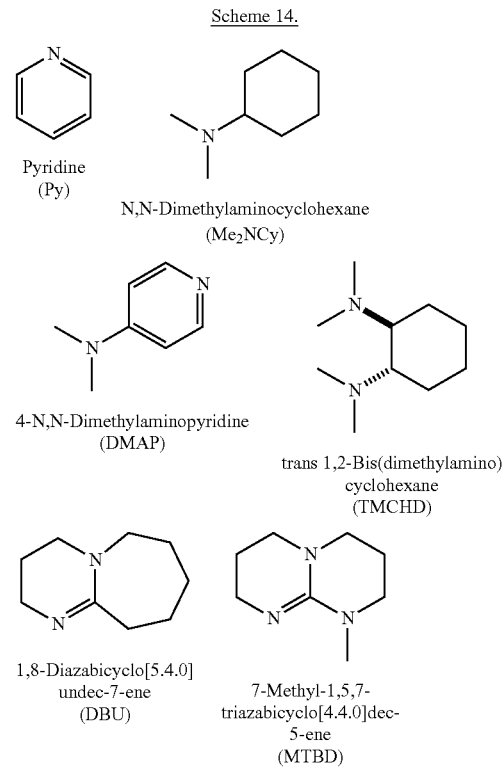

Pyridine (Py)

N,N-Dimethylaminocyclohexane ($Me_2NCy$)

4-N,N-Dimethylaminopyridine (DMAP)

trans 1,2-Bis(dimethylamino)cyclohexane (TMCHD)

1,8-Diazabicyclo[5.4.0]undec-7-ene (DBU)

7-Methyl-1,5,7-triazabicyclo[4.4.0]dec-5-ene (MTBD)

-continued

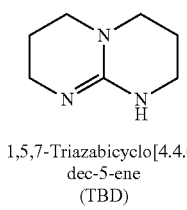

1,5,7-Triazabicyclo[4.4.0]
dec-5-ene
(TBD)

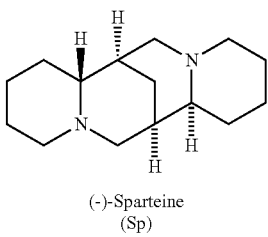

(−)-Sparteine
(Sp)

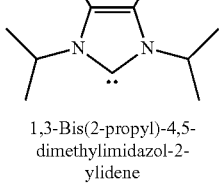

1,3-Bis(2-propyl)-4,5-
dimethylimidazol-2-
ylidene (Im-1)

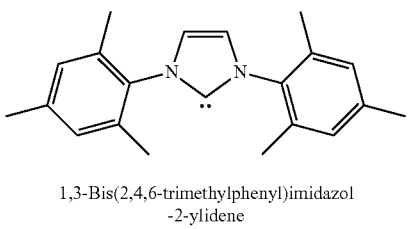

1,3-Bis(2,4,6-trimethylphenyl)imidazol
-2-ylidene (Im-2)

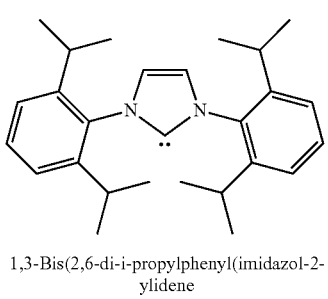

1,3-Bis(2,6-di-i-propylphenyl(imidazol-2-
ylidene (Im-3)

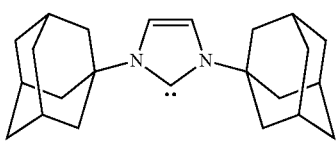

1,3-Bis(1-adamantyl)imidazol-2-yliden)

(Im-4)

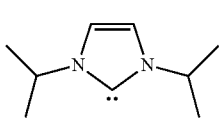

1,3-Di-i-propylimidazol-2-
ylidene (Im-5)

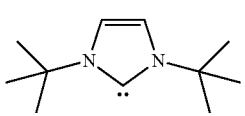

1,3-Di-t-butylimidazol-2-
ylidene (Im-6)

-continued

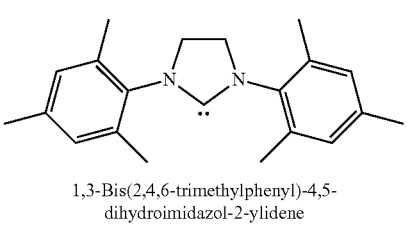

1,3-Bis(2,4,6-trimethylphenyl)-4,5-
dihydroimidazol-2-ylidene (Im-7)

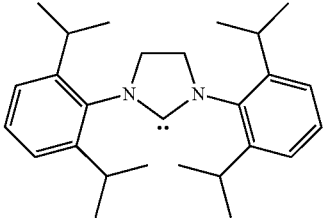

1,3-Bis(2,6-di-i-propylphenyl)-4,5-
dihydroimidazol-2-ylidene (Im-8)

In an embodiment, the accelerator has two or three nitrogens, each capable of participating as a Lewis base, as for example in the structure (−)-sparteine. Stronger bases generally improve the polymerization rate.

The catalyst and the accelerator can be the same material. For example, some ring opening polymerizations can be conducted using 1,8-diazabicyclo[5.4.0]undec-7-ene (DBU) alone, with no another catalyst or accelerator present.

The catalyst is preferably present in an amount of about 0.2 to 20 mol %, 0.5 to 10 mol %, 1 to 5 mol %, or 1 to 2.5 mol %, based on total moles of cyclic carbonyl monomer.

The nitrogen base accelerator, when used, is preferably present in an amount of 0.1 to 5.0 mol %, 0.1 to 2.5 mol %, 0.1 to 1.0 mol %, or 0.2 to 0.5 mol %, based on total moles of cyclic carbonyl monomer. As stated above, in some instances the catalyst and the nitrogen base accelerator can be the same compound, depending on the particular cyclic carbonyl monomer.

The amount of ROP initiator is calculated based on the equivalent molecular weight per nucleophilic initiator group in the nucleophilic initiator. The initiator groups are preferably present in an amount of 0.001 to 10.0 mol %, 0.1 to 2.5 mol %, 0.1 to 1.0 mol %, and 0.2 to 0.5 mol %, based on total moles of cyclic carbonyl monomer. For example, if the molecular weight of the initiator is 100 g/mole and the initiator has 2 hydroxyl groups, the equivalent molecular weight per hydroxyl group is 50 g/mole. If the polymerization calls for 5 mol % hydroxyl groups per mole of monomer, the amount of initiator is 0.05×50=2.5 g per mole of monomer.

In a specific embodiment, the catalyst is present in an amount of about 0.2 to 20 mol %, the nitrogen base accelerator is present in an amount of 0.1 to 5.0 mol %, and the nucleophilic initiator groups of the initiator are present in an amount of 0.1 to 5.0 mol % based on the equivalent molecular weight per nucleophilic initiator group of the initiator.

The catalysts can be removed by selective precipitation or in the case of the solid supported catalysts, simply by filtration. The block copolymer can comprise residual catalyst in an amount of 0 wt % (weight percent) or more, based on total weight of the block copolymer and the residual catalyst. The amount of residual catalyst can also be less than 20 wt %, less than 15 wt %, less than 10 wt %, less than 5 wt %, less than 1 wt %, or most specifically less than 0.5 wt % based on the total weight of the block copolymer and the residual catalyst.

Endcap Agents

An endcap agent can prevent further chain growth and stabilize the reactive end groups from unwanted side reactions, such as chain scission. Endcap agents include, for example, compounds for converting terminal hydroxyl groups to esters, such as acid anhydrides (e.g., acetic anhydride), acid chlorides (acetyl chloride), and/or active esters (e.g., p-nitrophenyl esters). Other endcap agents include alkyl and aryl isocyanates, which form carbamates (urethanes) with terminal hydroxy groups. Other endcap agents include alkylating agents capable of forming alkyl ethers, aromatic ethers including benzyl ethers, silyl ethers, acetals, ketals, and the like. Still other endcap agents include perhalogenated (e.g., perfluorinated) derivatives of any of the foregoing endcap agents. In an embodiment, the endcap agent is acetic anhydride, which converts reactive hydroxy end groups to acetate ester groups.

The following sections describe different methods of purification of the diblock polymer.

Method 1

This method utilizes a solvent mixture to fractionate an initial diblock copolymer formed when the ROP is conducted for a duration time corresponding to about 50% to 100%, more particularly about 85% to 100% consumption of a cyclic carbonate monomer and/or a cyclic ester monomer. For a given set of reaction conditions (e.g., temperature, solvent, type of atmosphere, relative molar amounts, and other reaction parameters), the consumption of the cyclic carbonate monomer and/or cyclic ester monomer can be monitored using any suitable analytical technique (e.g., proton nuclear magnetic resonance ($^1$H NMR)).

The ROP produces an initial block copolymer containing a living end group (e.g., hydroxy group), which is a nucleophilic group capable of undergoing further chain growth and/or initiating a ROP of a different cyclic carbonyl monomer. Preferably, the active living end group is deactivated by addition of an endcapping agent to the reaction mixture, thereby terminating the polymerization and forming an endcapped initial block copolymer containing a protected nucleophilic end group. The endcapped initial block copolymer is not capable of initiating a ROP. As an example, a polycarbonate formed by ROP of a cyclic carbonate monomer has a living end containing a nucleophilic hydroxy group, which can be deactivated by addition of a suitable acylating agent (e.g., acetyl chloride, acetic anhydride) to form a protected hydroxy group (e.g., as an acetyl ester) as described above.

The isolated initial block copolymer or the endcapped initial block copolymer ("crude block copolymer") can contain polymeric impurities derived from the cyclic carbonyl monomer that are not covalently linked to the polymeric initiator. Polymeric impurities can include polycarbonate and/or polyester homopolymer initiated by traces of water, cyclic polycarbonate and/or polyester formed by backbiting of the living hydroxy end group on the polycarbonate and/or polyester backbone of the initial block copolymer. These impurities can adversely affect the self-assembly properties of the initial block copolymer.

The polymeric impurities can be removed by the following fractionation process. A first solution is prepared containing the initial block copolymer dissolved in a minimal amount of a solvent (e.g., THF) capable of dissolving each block of the block copolymer. The first solution contains the initial block copolymer at a concentration of about 20 wt % based on total weight of the first solution. The first solution is then added to an excess amount (about 200 to 400 times the amount of crude polymer by weight) of a solvent mixture comprising a first solvent and a second solvent in a volume ratio of about 40:60 to about 60:40, respectively, wherein the first solvent is a non-solvent for the first block and the second block, and the second solvent is a non-solvent for the first block and a solvent for the second block. In an embodiment, the first solvent is MeOH and the second solvent is acetonitrile. The solvent mixture selectively dissolves the polymeric impurities, allowing the final block copolymer to precipitate as a solid that can be substantially free of the polymeric impurities. The fractionation procedure can be repeated one or more times as necessary to form the block copolymer used for self-assembly applications.

Method 2

In a second method, a trial ROP is performed using the given set of reaction conditions that includes the ROP polymeric initiator. The amount of consumed cyclic carbonyl monomer is monitored (e.g., % consumption) as a function of ROP duration time t as in Method 1, allowing the ROP to proceed to 85% to 100% consumption of the cyclic carbonyl monomer. A graph is plotted of the percent consumption of the cyclic carbonate as a function of ROP duration time t in minutes.

From the scatter plot of the collected data points, a second order polynomial function F(t) (i.e., a trendline) can be fitted to the plotted points, wherein F(t) expresses the amount of consumed cyclic carbonyl monomer as a function of ROP duration time t. The $R^2$ (R-squared) coefficient for F(t) preferably has a value of about 0.85 to 1.0, more preferably 0.9 to 1.0.

Using the expression of F(t), a time $t_1$ corresponding to 50% consumption of the cyclic carbonyl monomer can be calculated.

The first derivative of F(t), denoted F'(t), is then calculated for each measurement time t.

The value of F'(t) at 50% cyclic monomer conversion is then determined. Using the value of F'($t_1$) at 50% cyclic monomer conversion, ROP duration times $t_2$ and $t_3$ are determined corresponding to a slope change of −10% and −20% relative to the slope at 50% consumption of cyclic carbonyl monomer.

The ROP is then conducted using the given reaction conditions, stopping the ROP at duration time (t'), wherein $t_1 \leq t' \leq t_3$, and more preferably $t_2 \leq t' \leq t_3$. Using these modified reaction conditions, a block copolymer for self-assembly can be obtained directly that is free of, or substantially free of, polymer impurities that do not comprise a block derived from the polymeric initiator. Optionally, the block copolymer can be further treated with the solvent mixture as described above under Method 1 to remove any remaining polymeric impurities.

Method 3

In Method 3, the mathematical expression for F'(t) is obtained as described above under Method 2. The value of F'(t) is then calculated for each ROP duration time t. Using the values of F'(t), the change in F'(t) between adjacent ROP duration times is calculated for each ROP duration time greater than 0. For example, the change in F'(t) at duration time $t_n$, denoted as $\Delta F'(t_n)$, is equal to F'($t_n$)—F'($t_{n-1}$), where n is a positive integer and $t_n > 0$.

A second order polynomial trendline D(t) is obtained for a scatter plot of $\Delta F'(t)$ as a function of t having the shape of an inverted parabola. D(t) has a first derivative D'(t) equal to zero at some ROP duration time t">0 that is less than the duration time corresponding to 100% consumption of the cyclic carbonyl monomer.

The ROP is repeated using the given reaction conditions, terminating the ROP at 0.8t" to about t". The resulting final block copolymer can be free of, or substantially free of, polymer impurities that do not comprise a block derived from the polymeric initiator. Optionally, the block copolymer can be further treated with the solvent mixture as described above under Method 1 to remove any polymeric impurities present.

Cyclic Carbonyl Monomers

Exemplary cyclic carbonyl monomers include cyclic carbonate compounds of Scheme 15, which can be used, for example, to form a polycarbonate block of the initial block copolymer.

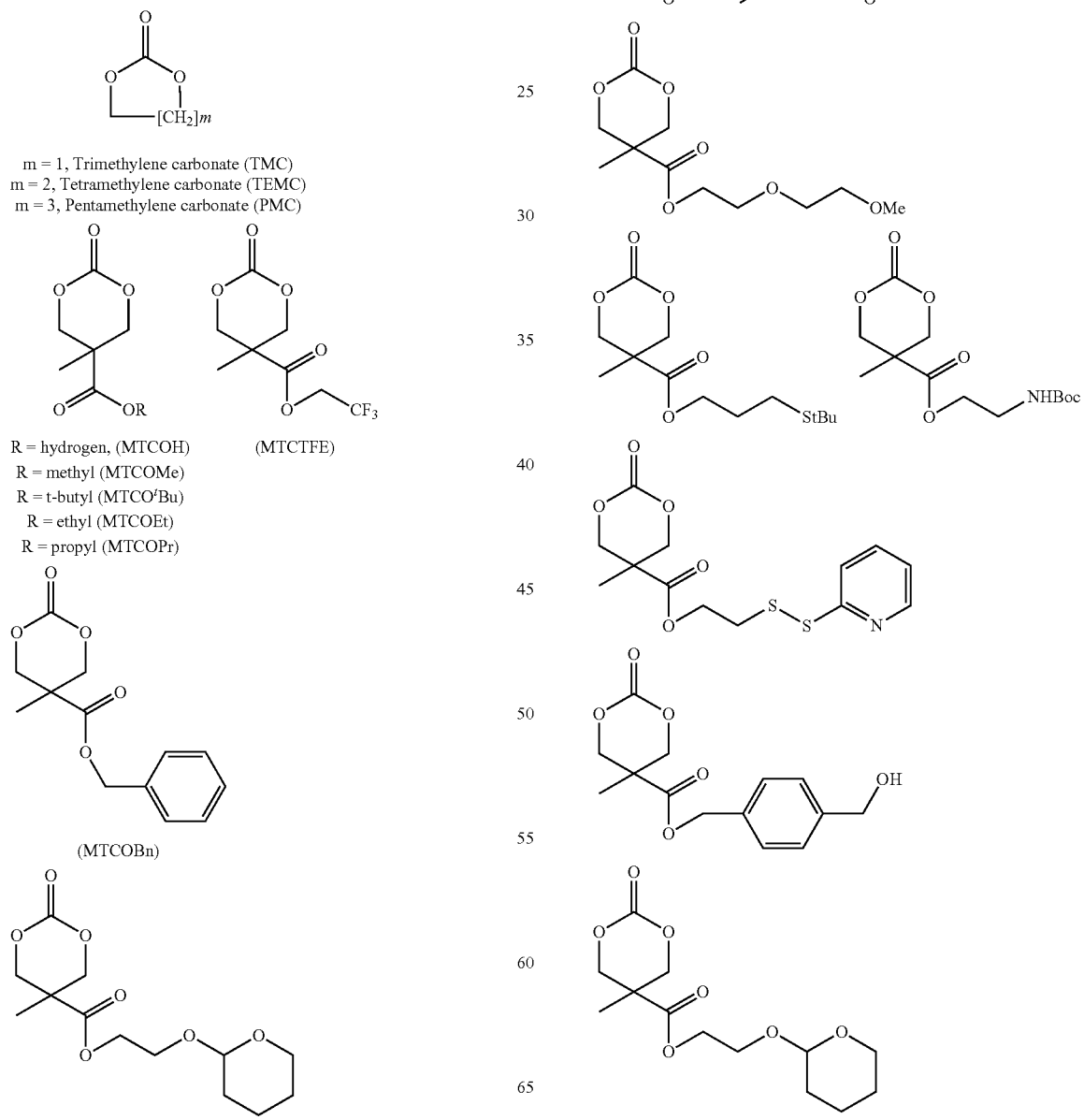

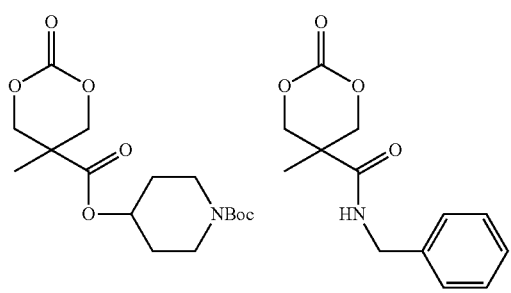

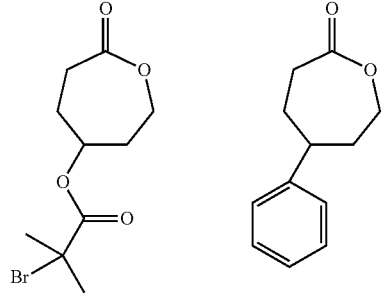

7-Oxooxepan-4-yl 2-bromo-2-methylpropanoate (BMP-XO)

5-Phenyloxepan-2-one (PXO)

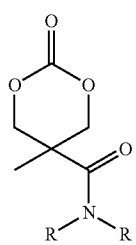

R = methyl
R = iso-propyl

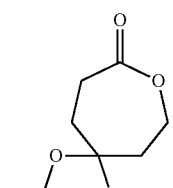

5-Methyloxepan-2-one (MXO)

1,4,8-Trioxa(4,6)spiro-9-undecane (TOSUO)

Other cyclic carbonyl monomers include cyclic esters (lactones), such as the compounds of Scheme 16.

Scheme 16.

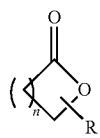

R = H, n = 1: beta-Propiolactone (b-PL)
R = H, n = 2: gamma-Butyrolactone (g-BL)
R = H, n = 3: delta-Valerolactone (d-VL)
R = H, n = 4: epsilon-Caprolactone (e-CL)
R = CH₃, n = 1: beta-Butyrolactone (b-BL)
R = CH₃, n = 2: gamma-Valerolactone (g-VL)

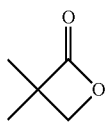

Pivalolactone (PVL)

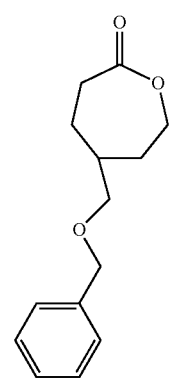

5-(Benzyloxymethyl)oxepan-2-one (BOMXO)

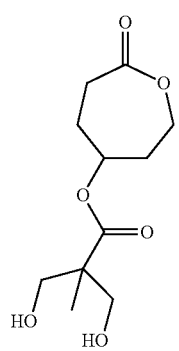

7-Oxooxepan-4-yl 3-hydroxy-2-(hydroxymethyl)-2-methylpropanoate (OX-BHMP)

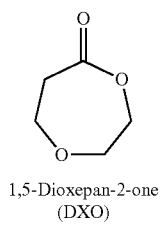

1,5-Dioxepan-2-one (DXO)

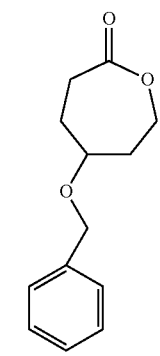

5-(Benzyloxy)oxepan-2-one (BXO)

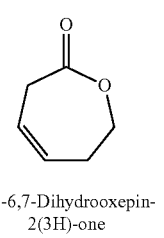

(Z)-6,7-Dihydrooxepin-2(3H)-one (DHXO)

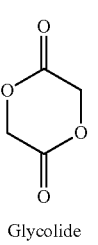

Glycolide (GLY)

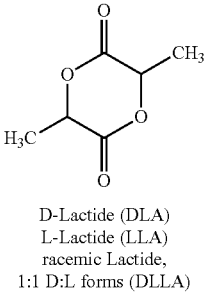

D-Lactide (DLA)
L-Lactide (LLA)
racemic Lactide, 1:1 D:L forms (DLLA)

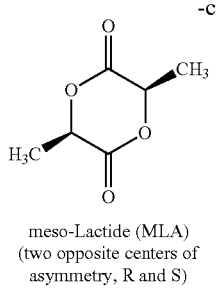

meso-Lactide (MLA)
(two opposite centers of
asymmetry, R and S)

The above cyclic carbonyl monomers can be purified by recrystallization from a solvent such as ethyl acetate or by other known methods of purification, with particular attention being paid to removing as much water as possible from the monomer.

Underlayer Materials

Herein, an underlayer is any layer having contact with the bottom of the SA layer. As non-limiting examples, an underlayer can be a non-preferential or preferential layer with respect to the SA material, a backfill layer, resist layer, surface modified resist layer, substrate layer, surface modified substrate layer, or etched substrate layer. Underlayer material is any material having contact with the bottom of the SA layer. The underlayer material can comprise organic material, inorganic material, organometallic material, or a combination of the foregoing materials. Preferably, the underlayer material is non-preferential to the domains a block copolymer comprising the L' group. The underlayer can be preferential or non-preferential to the domains of an otherwise identical self-assembled block copolymer in which all fluorines of L' are replaced by hydrogen.

Underlayer materials include homopolymers, random copolymers, and block copolymers. The underlayer materials can be used singularly or in combination.

The underlayer material can comprise a hydroxyl group. These materials include hydroxyl-terminated polymers (e.g., hydroxyl-terminated poly(styrene), hydroxyl-terminated poly(styrene-co-methyl methacrylate and blends of hydroxyl-terminated poly(styrene), hydroxyl-terminated poly(methyl methacrylate), and poly(styrene-b-methyl methacrylate)) and hydroxyl-functionalized polymers (e.g., poly(styrene-co-methyl methacrylate-co-2-hydroxyethyl methacrylate)).

Other underlayer materials include polymers comprising reactive groups, such as those derived from epoxydicyclopentadiene methacrylate, glycidyl methacrylate, or vinyl cinnamates. Exemplary materials comprising reactive groups include poly(styrene-co-epoxydicyclopentadiene methacrylate), poly(styrene-co-methyl methacrylate-co-epoxydicyclopentadiene methacrylate), poly(styrene-co-methyl methacrylate-co-glycidyl methacrylate), poly(styrene-co-methyl methacrylate-co-vinyl cinnamate) poly(styrene-co-methyl methacrylate-co-vinyl benzocyclobutane), and poly(alpha-methyl styrene-co-methyl methacrylate)). The reactive polymers can react as a result of thermal or photochemical treatment either alone or in conjunction with an additional crosslinking agent. In particular, a catalytic species such as a strongly acidic species can be used to facilitate reaction. The strongly acidic species can be directly incorporated into the underlayer material or the solution comprising the underlayer material. Alternatively, a thermal acid generator or photoacid generator molecule can be used to generate an acidic species as a result of thermal or photochemical treatment, respectively.

Other non-limiting examples of underlayer materials include materials used in anti-reflection coatings (ARC) layers, which can include homopolymers and copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (e.g., optical properties, surface energy, etch resistance). The polymer components also typically contain a plurality of reactive sites distributed along the polymer for reaction with a crosslinking component.

More specific materials used in ARC layers include poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4'-isopropylidenebis[2-methylphenol]-co-epichlorohydrin), poly(4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly(4,4'-hexafluoroisopropylidenebisphenol-co-epichlorohydrin), poly(4,4'-sulfonylbisphenol-co-epichlorohydrin), poly(bisphenol AF adipic ester), poly(bisphenol AF succinic ester), poly(4,4'-hexafluoroisopropylidenediphthalate-co-epichlorohydrin), poly(4,4'-hexafluoroisopropylidenediphthalate-co-poly(bisphenol AF), poly(4,4'-hexafluoroisopropylidenebisbenzoate-co-epichlorohydrin), poly(3,3',4,4'-benzophenonetetracarboxylate-co-epichlorohydrin), poly(4,4'-hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6-bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-co-epichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidene-bis[4-aminophenyl]-co-glycerol carbamate), poly(isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), glycidyl endcapped poly(bisphenol A-co-epichlorohydrin), and silicon-containing anti-reflection coating A940 from Shin Etsu. Another more specific underlayer material comprises poly(styrene-co-epoxydicyclopentadiene methacrylate) random copolymer, P(S-r-EDCPMA):

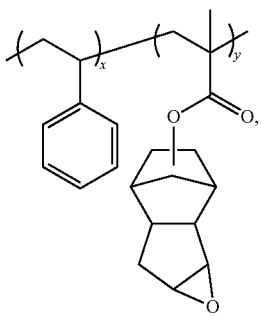

P(S-r-EDCPMA)

wherein x and y are each integers greater than 1.

Other underlayer materials include poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinammate), poly(styrene-co-methyl methacrylate-co-vinyl benzocyclobutane), poly(styrene-co-vinyl benzocyclobutane, poly(alpha-methyl styrene-co-methyl methacrylate), and poly(methyl glutarimide) (PMGI).

Other underlayer materials comprise polymer brush materials, including hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate) block copolymer, and combinations of the foregoing materials.

Other underlayer materials include self-assembled monolayers.

A layer comprising an underlayer material can include a thin dielectric material having a thickness from 1 nm to 20 nm.

In an embodiment, the underlayer material is a polymer derived from methyl methacrylate. In another embodiment, the underlayer material is a brush methacrylate homopolymer (e.g., hydroxyl-terminated poly(methyl methacrylate), (PMMA)). In another embodiment, the underlayer material includes an etch-resistant material.

Underlayer surfaces possessing desirable characteristics can comprise: cross linked organic polymer including an epoxy-based homopolymer or copolymer, organic homopolymers or copolymers; self-assembled monolayers, polymer brushes, cross-linked organosilicates, random copolymer brushes, random cross-linked copolymers, mixtures of polymer brushes or cross-linked polymers, ARC materials, oxidized silicon, and combinations of the foregoing materials.

Polymer brushes can provide a modified surface that is non-preferential or preferential to the SA material. A modified surface can be formed by reactively modifying a surface to a desired thickness and surface properties using polymeric brush precursors having a desired composition, often followed by an additional rinse step to remove non-bound material. The composition of a random copolymer brush layer can be tuned to afford the desired surface properties. This can be accomplished in some instances by randomly copolymerizing two monomers, for example the same monomers used in the preparation of a block copolymer for self-assembly, in a precise ratio. In instances where otherwise useful self-assembling materials (i.e., those that can form domains) exist for which it is unfeasible to synthesize random copolymers of repeating units of each polymeric block components (such as where different polymerization mechanisms would be required), end-group functionalization or incorporation of reactive-group containing monomers can be used to functionalize polymers to provide grafting sites. Thermally crosslinkable underlayers based on, for example, vinyl benzocyclobutene, can also be used. Photo-patternable underlayers, based on random copolymers of the monomers of the self-assembling material with an appropriate functional monomer, for example, monomers having azide, glycidyl or acryloyl groups, can also be used.

The underlayer surface can also be a coating of a crosslinked epoxy-containing polymer prepared from monomers including glycidyl (meth)acrylate, 2,3-epoxycyclohexyl (meth)acrylate, (2,3-epoxycyclohexyl)methyl (meth)acrylate, 5,6-epoxynorbornene (meth)acrylate, epoxydicyclopentadienyl (meth)acrylate, and combinations including at least one of the foregoing. Herein, where "(meth)acrylate" is used, either an acrylate or methacrylate is contemplated unless otherwise specified. In some embodiments for example, specifically useful monomers include glycidyl methacrylate and epoxydicyclopentadienyl methacrylate.

Epoxy-containing polymers also include copolymers or terpolymers further containing at least one additional monomer in addition to the epoxy-containing monomer. Exemplary additional monomers include methyl (meth)acrylate, ethyl (meth)acrylate, butyl (meth)acrylate, hexyl (meth)acrylate, cyclohexyl (meth)acrylate, benzyl (meth)acrylate, ethylcyclopentyl (meth)acrylate, methylcyclopentyl (meth)acrylate, dicyclopentyl (meth)acrylate, 2-hydroxy ethyl (meth)acrylate, 2-hydroxy propyl (meth)acrylate, hydroxyadamantyl (meth)acrylate, adamantyl (meth)acrylate, methyladamantyl (meth)acrylate, ethyladamantyl (meth)acrylate, phenyladamantyl (meth)acrylate, hydroxyadamantyl (meth)acrylate, isobornyl (meth)acrylate, benzyl (meth)acrylate, gamma-butyrolactone (meth)acrylate, 5-methacryloxy-2,6-norbornane carbolactone, 5-acryloxy-2,6-norbornane carbolactone, 2,2,2-trifluoroethyl (meth)acrylate, 1,1,1,3,3,3-hexafluoroisopropyl (meth)acrylate, styrene, 4-methyl styrene, a-methyl styrene, 4-hydroxy styrene, 4-acetoxy styrene, ethylene, propylene, 1-butene, 1,3-butadiene, vinyl acetate, dihydropyran, norbornene, maleic anhydride, or a combination including at least one of the foregoing additional monomers. The composition of the epoxy-containing polymer can be adjusted by varying the ratios and identities of the comonomers and/or by selecting the structure and/or functionality of the pendant group(s) on the (meth)acrylates.

Specifically useful epoxy-containing polymers include poly(epoxydicyclopentadienyl methacrylate) homopolymer or poly(styrene-ran-epoxydicyclopentadienyl methacrylate), a random copolymer of styrene and epoxydicyclopentadienyl methacrylate.

Organosilicate or silicon oxide-based coatings of the substrate can also be used to provide an underlayer surface. Useful surfaces can be provided by deposition of silicon dioxide or organosilicate as a vapor-deposited layer, or as a spin-on layer (organic spin-on glass, abbreviated OSG). Organosilicones, organo- or hydridosilsesquioxanes, or hybrid systems of these materials can be used to provide the underlayer surface, where such organosilicate coatings are advantageously crosslinkable to form a solid underlayer surface. Useful organosilicates include those derived from the hydrolytic condensation, catalyzed by acid or base, of hydridotrialkoxysilanes, alkyltrialkoxysilanes, alkyltrihalosilanes, dialkyldialkoxysilanes, dialkyldihalosilanes, tetraalkoxysilanes, bis(alkylenetrialkoxysilanes), and the like. Exemplary alkoxysilanes useful for preparing organosilicates include hydridotrimethoxysilane, hydridotriethoxysilane, dimethyldimethoxysilane, dimethyldiethoxysilane, methyltrimethoxysilane, ethyltrimethoxysilane, ethyltriethoxysilane propyltrimethoxysilane, propyltriethoxysilane, cyclohexyltriethoxysilane, phenyltriethoxysilane, tetramethoxysilane, tetraethoxysilane (TEOS), 1,2-ethylene bis (triethoxysilane), vinyltrimethoxysilane, vinyltriethoxysilane, glycidoxypropyltrimethoxysilane, epoxycyclohexylethyltriethoxysilane, (meth)acryloxypropyltrimethoxypropylsilane, (meth)acryloxypropyltriethoxypropylsilane, combinations of these, and the like.

An underlayer can comprise an etch-resistant material including, but not limited to, a material selected from hydrogen silsesquioxane, methyl silsesquioxane, an alkyl silsesquioxane, an alkene silsesquioxane, an aryl silsesquioxane, an arylene silsesquioxane, a silicon-based resist, an inorganic resist, a silicon-based ARC, a metal-based ARC, silicon oxide, a silicon oxynitride, a silicon-based spin-on-dielectric, a metal, a metal oxide, a metal nitride, a metal oxynitride, and a metal carbide, provided that a suitable etch chemistry exists for removing some domains of a self-assembling material selectively to other domains and the etch-resistant material. In one embodiment, the etch-resistant material can include hydrogen silsesquioxane.

A layer of such etch-resistant material formed on the substrate can be deposited by any suitable method and is not particularly limited. Where the etch-resistant material is soluble in solutions, the application of an etch-resistant material layer to a surface of the substrate can be accomplished by a process including, for example, spin-casting, dip-coating, doctor blading, spray dispense, or other suitable coating method, which is compatible with the processes and equipment used in microelectronics fabrication assembly lines. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), aqueous solutions, acetone, or a combination of the foregoing casting solvents.

In another example, the etch-resistant material can be deposited from the vapor phase by a process including, chemical vapor deposition (CVD), plasma enhanced CVD, atomic layer deposition (ALD), sputtering, thermal evaporation, electron beam evaporation, pulsed laser deposition, or other suitable deposition method that is compatible with the processes and equipment used in microelectronics fabrication.

An underlayer material can be applied by any suitable method and is not particularly limited. Where polymer-based underlayer material is desired, the application of such layers to a surface of the substrate can be accomplished by a process including, for example, spin-casting, dip-coating, doctor blading, spray dispense, or other suitable coating method, which is compatible with the processes and equipment used in microelectronics fabrication assembly lines.

Solvents that can be used to cast underlayer materials on a substrate vary with the solubility requirements of these materials. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), and acetone.

The surface energy or composition required for an underlayer material depends on the application. For example, in order to form polystyrene (PS)-poly(methyl methacrylate) (PMMA) perpendicularly oriented lamellae, a PS-r-PMMA random copolymer layer can be employed as a non-preferential underlayer material.

As another example, for an unpatterned surface, a brush composition can comprise 57-70% polystyrene (PS). However, the ideal underlayer material for a patterned surface (e.g., one having a chemo-epitaxial pre-pattern) can differ from that designed for an unpatterned surface, and the ideal underlayer material can depend upon the composition of the directing portion of the chemical pattern (e.g., PS or PMMA preferential) and the multiplication factor, as described in Liu, et al., "Chemical Patterns for Directed Self-Assembly of Lamellae-Forming Block Copolymers with Density Multiplication of Features", Macromolecules, 2013, 46, 1415-1424. The multiplication factor for spatial frequency multiplication refers to the ratio of the pitch of the chemo-epitaxial pre-pattern to the characteristic pitch (Lo) of a self-assembling material. The ideal underlayer material can be different for different BCP morphologies (e.g., perpendicular cylinders versus lamellae).

For a given underlayer material, the efficacy and the surface properties of the material can depend on various factors. For example, the efficacy and surface property of an underlayer-modified substrate can depend on the thickness of the underlayer material, the surfaces underneath the underlayer materials, the process condition of underlayers materials as well as the topography and pattern density of the substrate where the underlayer is applied for surface property control. The molecular architecture of the underlayer material can have an effect. For example, a polymer brush underlayer material can have a composition range different from that of a cross-linked underlayer material due to difference in mobility of the brush. For the same reason, a higher molecular weight brush can act differently compared to a lower molecular weight brush. Similar changes in the efficacy of the underlayer can be observed for cross-linked underlayer materials having the same composition but different molecular weights. The efficacy of the underlayer can also depend on the thickness of the self-assembly material layer above the underlayer according to the relative difference in surface free energies among the polymeric block components. The exact orientation of polymer domains at the air interface or the polymer/underlayer interface can be other than perpendicular to the substrate, even if the majority of each polymer domain is perpendicularly oriented.

Layered Structures

The substrate is a layered structure that comprises an underlayer. The underlayer can be formed by disposing on a first layered structure (first substrate) a solution containing an above-described underlayer material, a solvent, and optionally a member of the group consisting of thermal acid generators (TAGs), photo-acid generators (PAGs), catalysts, and combinations thereof, and removing the solvent (e.g., by a thermal bake and/or exposure to actinic light), thereby forming a second layered structure (second substrate) comprising a top layer, which is an underlayer for the SA layer. The underlayer preferably comprises a covalently bound form of the underlayer material linked to an underlying substrate layer. Optionally, the second layered structure can be rinsed with a solvent to remove any non-bound underlayer material. The thermal bake can be performed at a temperature between about 80° C. and about 250° C. for between about 1 second and about 24 hours, more preferably between about 120° C. and about 250° C. for between about 1 minute and about 15 minutes.

Also disclosed are compositions for preparing the SA layers. The compositions comprise a solvent and 0.1-5 wt % of a disclosed block copolymer dissolved in the solvent, wherein wt % is based on total weight of the composition. The compositions are suitable for forming a film layer (SA layer) comprising the block copolymer. The solution can be applied to an underlayer of a substrate using any suitable coating technique (e.g., spin coating) followed by removal of the solvent, thereby forming a film layer comprising the BCP. The BCP film layer has a top surface in contact with an atmosphere and a bottom surface in contact with an underlayer.

The following schematic diagrams illustrate methods of forming substrates comprising underlayers and their use in forming perpendicularly oriented lamellar domain patterns with the disclosed block copolymers.

FIGS. 5A to 5F are cross-sectional layer diagrams illustrating a process of directed self-assembly of an SA layer comprising a disclosed block copolymer, which produces perpendicularly oriented lamellar domains on an underlayer that is preferentially wetted by one domain of an otherwise identical self-assembled block copolymer in which all fluorines of L' are replaced by hydrogen. The process does not employ a lithographically prepared grapho-epitaxial or chemo-epitaxial pre-pattern. It should be understood that the layers and features are not drawn to scale.

Figure 5A:
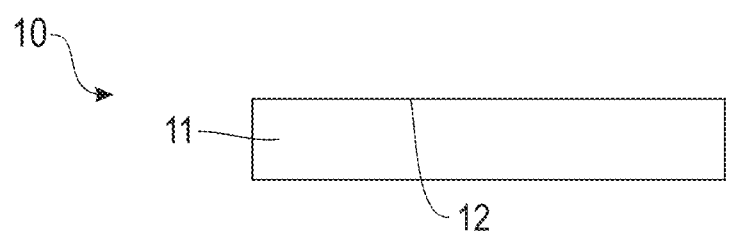
FIGS. 5A to 5F are cross-sectional layer diagrams showing a process of forming a perpendicularly oriented lamellar domain pattern using the disclosed BCPs comprising a fluorinated linking group L'. The underlayer can be preferential or non-preferential to the domains of an otherwise identical self-assembled BCP wherein all fluorines of L' are replaced by hydrogen.
Figure 5B:
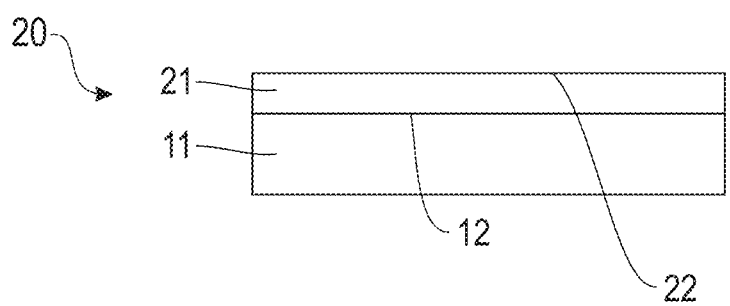

Layered structure 10 of FIG. 5A comprises substrate 11 having substrate surface 12. Substrate 11 can comprise one or more layers (not shown). A solution comprising a disclosed underlayer material (e.g., PMMA brush homopolymer) dissolved in a suitable solvent is applied (e.g., by spin coating) to substrate surface 12. Removal of the solvent from the applied layer and an optional post-application bake (PAB) (e.g., 115° C. for 1 minute) forms layered structure 20 (FIG. 5B), also referred to as a "modified substrate". Layered structure 20 comprises underlayer 21, which comprises underlayer material bound by at least one covalent bond to substrate 11. Optionally, layered structure 20 can be rinsed with a solvent to remove any non-bound underlayer material.

Figure 5C:
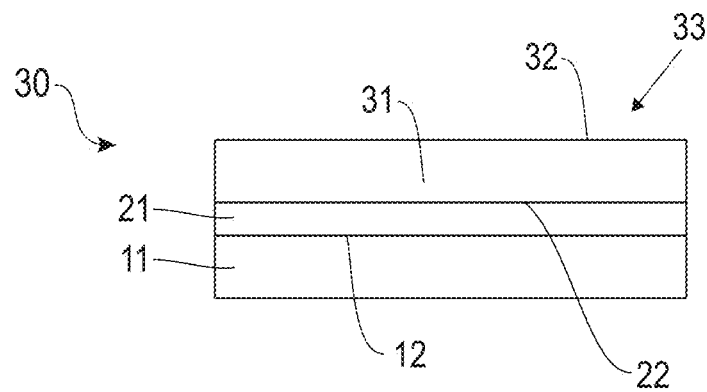

Underlayer 21 has underlayer surface 22. A solution comprising a disclosed high-chi block copolymer (e.g., comprising a poly(styrene) (PS) block and a polycarbonate block linked by a disclosed L' group) and a solvent is applied to underlayer surface 22 using any suitable technique (e.g., spin coating). Removal of the solvent followed by an optional post-application bake (PAB) (e.g., 115° C. for 1 minute) produces layered structure 30 (FIG. 5C).

Layered structure 30 comprises SA layer 31 comprising the block copolymer, which is disposed on underlayer surface 22. Underlayer surface 22 can be non-preferential or preferential to the domains of an otherwise identical self-assembled block copolymer in which all fluorines of L' are replaced by hydrogen. In this non-limiting example, and for purposes of illustration only, underlayer surface 22 (e.g., PMMA) is preferentially wetted by the domain of higher surface energy (e.g., polycarbonate domain) when all fluorines of L' are replaced by hydrogen.

SA layer 31 has a top surface 32 in contact with an atmosphere interface 33. Atmosphere interface 33 can be non-preferential or preferential to the domains of an otherwise identical self-assembled block copolymer in which all fluorines of L' are replaced by hydrogen. In this non-limiting example, and for purposes of illustration only, atmosphere interface 33 is preferentially wetted by the domain of lower surface energy (e.g., PS domain) when all fluorines of L' are replaced by hydrogen.

Figure 5D:
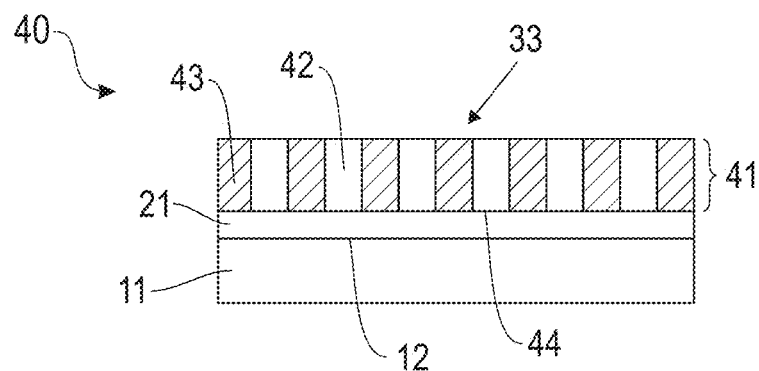

SA layer 31 is then allowed or induced to self-assemble by thermally treating SA layer 31 at a suitable temperature for a suitable period of time (e.g., annealing layered SA layer 31 at a temperature between about 80° C. and about 250° C. for between about 1 second and about 24 hours), thereby forming layered structure 40 (FIG. 5D). Structure 40 comprises perpendicularly oriented domain pattern 41 of the self-assembled block copolymer disposed on underlayer surface 44. Domain pattern 41 comprises first lamellar domain 43 comprising a first block of the block copolymer (e.g., block A, PS domain) and second lamellar domain 42 comprising a polycarbonate block (e.g., block B) of the high-chi block copolymer. Lamellae of first lamellar domain 43 and lamellae of second lamellar domain 42 have a perpendicular orientation relative to a main plane of underlayer 21.

One of the domains can be selectively removed (e.g., etched) or modified in the presence of the other domain. As an example, dry etching using a suitable gas ($O_2$) or wet/chemical etching technique can be used to selectively etch second lamellar domain 42 (polycarbonate domain). As another example, first lamellar domain 43 (polystyrene domain) can be selectively etched by modifying second lamellar domain 42 by i) sequential infiltration synthesis (SIS) to infuse metal oxide precursors or ii) by solution infiltration of second lamellar domain 42 with metal salts, followed by ion-etching of first lamellar domain 43. Selective removal of one of the domains can also remove underlayer material (not shown).

Figure 5E:
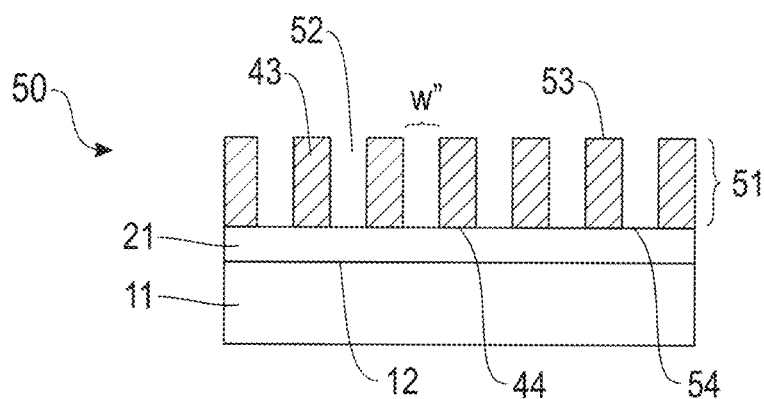
Figure 5F:
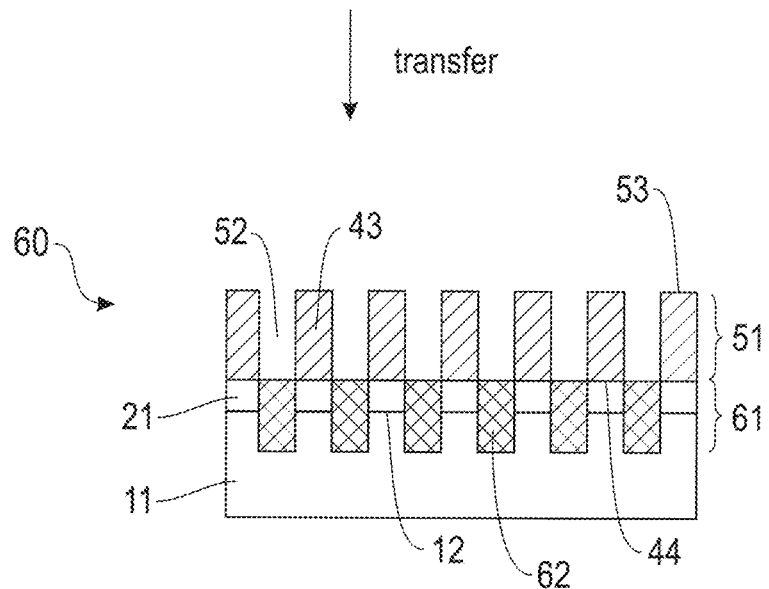

In the present example, second lamellar domain 42 is selectively removed, producing layered structure 50 (FIG. 5E). Layered structure 50 comprises etched domain pattern 51 comprising first lamellar domain 43 disposed on underlayer surface 44, and trenches 52 having bottom surface 54. Etched domain pattern 51 has a top surface 53 in contact with an atmosphere. The selective removal of second lamellar domain 42 can further remove material of underlayer 21 beneath second lamellar domain 42 (not shown).

Alternatively, first lamellar domain 43 can be selectively removed leaving second lamellar domain 42 (not shown).

Lamellae of first lamellar domain 43 can have different dimensions after removing second lamellar domain 42 compared to their dimensions before the selective removal. Trenches 52 can have a width w" of about 0.5Lo (e.g., about 2 nm to about 40 nm, or for high-chi SA materials, w" is about 2 nm to about 10 nm).

The selective removal process can be carried out by any suitable process (e.g., a thermal bake for thermally decomposable materials, a reactive ion etch process, dissolution in a selective solvent, ultraviolet exposure, combinations of the foregoing). A chemical modification can be accomplished by a variety of known methods. For example, domains can be selectively reacted with silanes or silyl chlorides to introduce silicon content into a domain and thereby increase its plasma etch resistance. Alternatively, chemical agents can be used to bind or chemically couple to functional groups that are exclusively located in one type of self-assembled domain, to effect, for example, increased solubility property differences that can advantageously be used to selectively remove one domain in the presence of the other domain.

Etched domain pattern 51 can be transferred to substrate 11 using any suitable technique, thereby forming layered structure 60 (FIG. 5F) comprising transfer pattern 61. Patterned region 61 can be a pattern of lines, holes, pits, and/or a chemically altered state of the underlayer 21 and/or substrate 11, which are represented by areas 62. Patterned region 61 can extend into one or more layers, including the underlayer 21 and/or the substrate 11 (shown). The pattern transfer process can further comprise removal of first lamellar domain 43 (not shown).

Alternatively, etched domain pattern 51 can be transferred to substrate 11 using a tone inversion process (not shown). In this process, trenches 52 of etched domain pattern 51 are filled with a dielectric material (e.g., a metal oxide such as $TiO_2$, $Al_2O_3$, $HfO_2$), which can be disposed onto etched domain pattern 51 using any suitable technique (e.g., atomic layer deposition (ALD)) that causes minimal deformation or distortion of the etched domain pattern 51. Following the deposition and any preliminary etch to expose the top surface of the underlying lamellae of first lamellar domain 43, a selective etch can be performed to remove etched domain pattern 51, leaving an inverted relief pattern comprising protruding features composed of the dielectric material. The protruding features are separated by trenches formerly occupied by etched domain pattern 51. The inverted relief pattern can then be transferred further into one or more layers of substrate 11 using any suitable technique.

FIGS. 6A to 6E are cross-sectional layer diagrams illustrating a lithographic process utilizing a pre-formed graphoepitaxial pre-pattern with an SA layer that comprises a disclosed BCP comprising the L' group. Layered structure 100 (FIG. 6A) comprises substrate 110 comprising underlayer 102 disposed on surface 103 of bottom layer 101 (e.g., silicon wafer). Grapho-epitaxial pre-pattern 104 is disposed on underlayer surface 105. Underlayer surface 105 can be non-preferential or preferential to the domains of an otherwise identical self-assembled BCP in which all fluorines of L' are replaced by hydrogen. Bottom layer 101 can comprise one or more sub-layers (not shown). Grapho-epitaxial pre-pattern 104 comprises topographic features 106 (e.g., resist features). Topographic features 106 have sidewalls 107 of height h', and mesas 108 of width w'. Topographic features 106 are separated by trenches 109 (recessed regions) which include bottom surfaces 112 comprising material of underlayer 102 in contact with an atmosphere. It should be understood that sidewalls 107, bottom surfaces 112 and mesas 108 represent the top surface of pre-pattern 104, which is in contact with an atmosphere. Pre-pattern 104 can be formed by any suitable lithographic technique. Topographic features 106 can comprise any suitable material 111 for directing self-assembly. For example, topographic features 106 can comprise a resist material, which can be a positive and/or negative tone resist material.

In the present invention, the topography of grapho-epitaxial pre-pattern 104 is not essential for perpendicular orientation control of the self-assembled lamellar domains of the high-chi block copolymer.

Figure 6A:
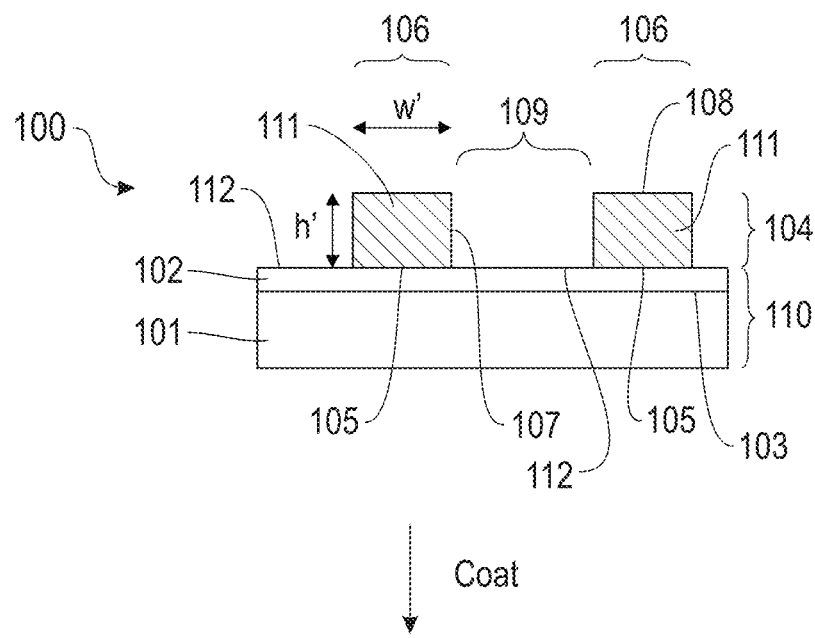
FIGS. 6A to 6E are cross-sectional layer diagrams showing a process of forming a perpendicularly oriented lamellar domain pattern with the disclosed BCPs comprising a fluorinated linking group L' using a grapho-epitaxial pre-pattern.
Figure 6B:
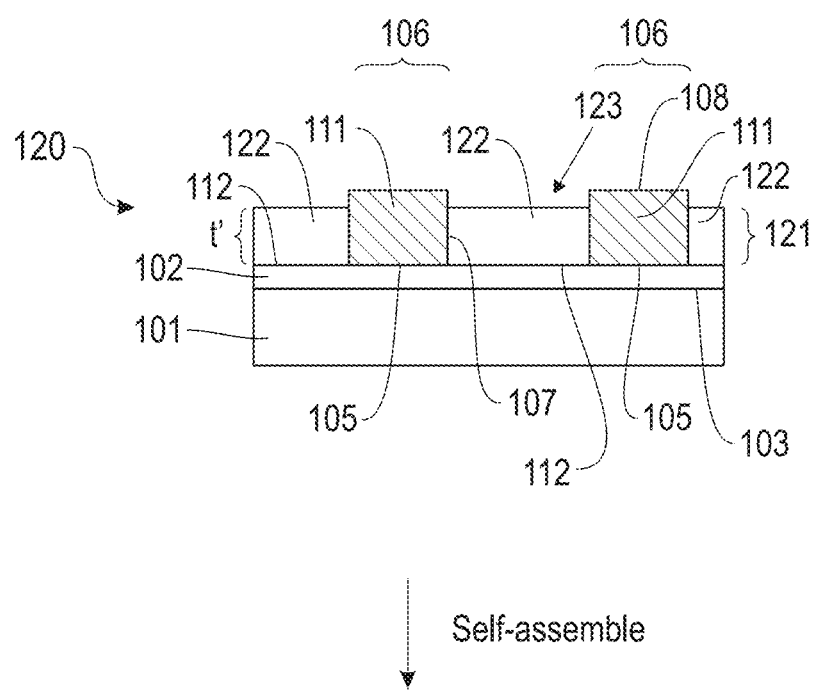
Figure 6C:
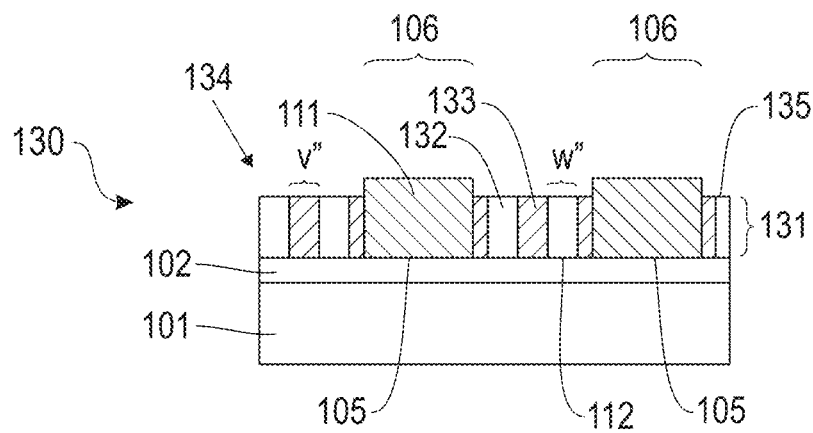

A coating mixture comprising the BCP comprising the L' group dissolved in a solvent is applied to pre-pattern 104 using any suitable technique (e.g., spin coating), thereby allocating the mixture substantially or exclusively in trench areas 109. Pre-pattern 104 is insoluble in or substantially insoluble in the solvent used to prepare the mixture. Removal of the solvent from the applied coating mixture provides layered structure 120 comprising SA layer 121 (FIG. 6B). SA layer 121 comprises regions 122 comprising the BCP. SA layer 121 is allocated substantially or wholly within trench areas 109 disposed on bottom surfaces 112 of trench areas 109. Height h' of features 106 is typically greater than or comparable to the thickness t' of the SA layer 121. Bottom surface 112 can be non-preferential or preferential to the domains of an otherwise identical self-assembled BCP in which all fluorines of L' are replaced by hydrogen, whereas atmosphere interface 123 is typically preferential to one of the domains of the otherwise identical self-assembled BCP in which all fluorines of L' are replaced by hydrogen. In this example, sidewalls 107 can be non-preferential or preferential to the domains of an otherwise identical self-assembled BCP in which all fluorines of L' are replaced by hydrogen, with the proviso that the surface properties of the sidewalls do not adversely affect self-assembly and orientation of the domains formed.

Self-assembly of SA layer 121 can be spontaneous and/or induced by thermally treating (annealing) SA layer 121 at a temperature between about 80° C. and about 250° C. for between about 1 second and about 24 hours. Self-assembly of the BCP comprising the L' group produces layered structure 130 (FIG. 6C) comprising perpendicularly oriented lamellar domain pattern 131. Domain pattern 131 comprises first lamellar domain 133 (e.g., PS domain, block A) having a width of v", and second lamellar domain 132 (e.g., polycarbonate domain, block B) having a width w". First lamellar domain 133 and second lamellar domain 132 are in contact with trench surface 112. Top surface 135 of domain pattern 131 is in contact with atmosphere interface 134, indicated by the arrow. In this example, sidewalls 107 of topographic features 106 are preferential to first lamellar domain 133. Therefore, lamellae of first lamellar domain 133 are positioned in contact with sidewalls 107. Lamellae of first lamellar domain 133 that are in contact with sidewalls 107 can have a width of about 0.5 v". In an embodiment, v" and w" are about equal to 0.5Lo.

Figure 6D:
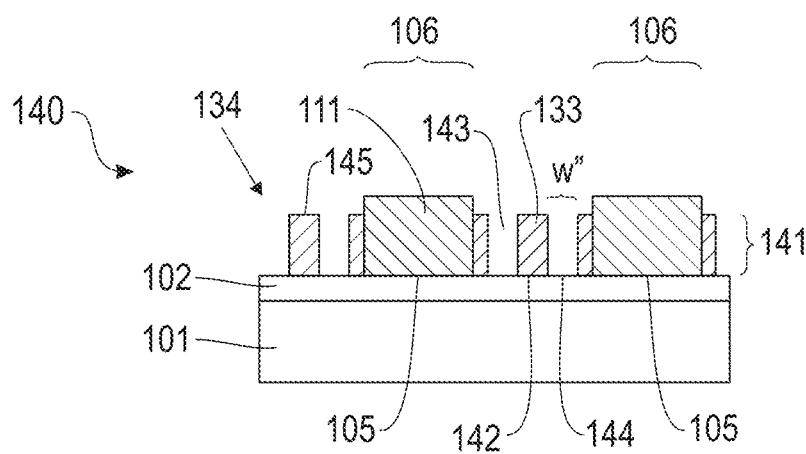

One of the domains, for example second lamellar domain 132 (e.g., polycarbonate block), can be selectively removed (e.g., ion-etched) or modified in the presence of the first lamellar domain 133 (e.g., PS block) to generate topographical or chemical contrast. Selective removal of one of the domains can also remove underlayer material (not shown), resulting in layered structure 140 comprising etched domain pattern 141 (FIG. 6D). Etched domain pattern 141 comprises first lamellar domain 133 disposed on underlayer surface 142, openings 143 having bottom surface 144, and topographic features 106. First lamellar domain 133 has top surface 145. Openings 142 can have a width w" of about 0.5Lo (e.g., about 2 nm to about 40 nm, or for a high-chi block copolymer about 2 nm to about 10 nm). The selective removal process may be carried out by a thermal bake (for thermally decomposable materials), a reactive ion etch process, dissolution in a selective solvent, or a combination thereof. A chemical modification may be accomplished by a variety of known methods as discussed above. The selective removal process can further remove features 106 (not shown).

Figure 6E:
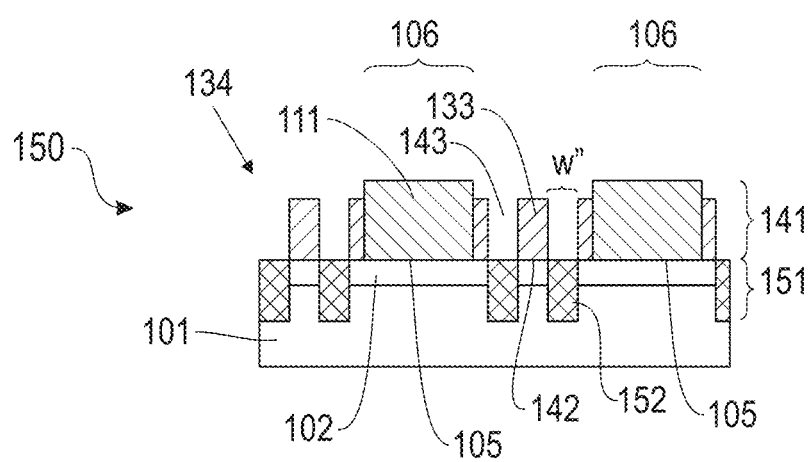

Finally, etched domain pattern 141 can be transferred to underlayer 102 and/or bottom layer 101, thereby forming layered structure 150 comprising patterned region 151 (FIG. 6E). Patterned region 151 can be a pattern of lines, holes, pits, and/or a chemically altered state of the substrate material represented by altered areas 152. Patterned region 151 can extend into one or more layers of substrate 110. The pattern transfer can be accomplished, for example, by using a reactive ion etch process. Features 106 and first lamellar domain 133 can be removed concomitantly or subsequently to formation of altered areas 152. The height of etched domain pattern 141 after the transfer can be less than the height of etched domain pattern 141 before the transfer.

Alternatively, etched domain pattern 141 can be transferred to substrate 110 using a tone inversion process as described further above (not shown).

FIGS. 7A to 7E are cross-sectional layer diagrams illustrating a lithographic process utilizing a pre-formed chemo-epitaxial pre-pattern with an SA layer that comprises a disclosed BCP comprising the L' group. Layered structure 200 (FIG. 7A) comprises substrate 210 comprising underlayer 202 disposed on surface 203 of bottom layer 201 (e.g., silicon wafer). Chemo-epitaxial pre-pattern 204 can be a material disposed on underlayer surface 205 (shown), can be a region of underlayer 202 whose surface properties differ from another region of underlayer 202 (not shown), or can include a mixture of the foregoing. Underlayer surface 205 can be non-preferential or preferential to the domains of an otherwise identical self-assembled BCP in which all fluorines of L' are replaced by hydrogen. Bottom layer 201 can comprise one or more sub-layers (not shown). In this example, chemo-epitaxial pre-pattern 204 comprises topographic features 206 (e.g., resist features). Topographic features 206 have sidewalls 207 of height h", and mesas 208 of width r". Topographic features 206 are separated by trenches 209 (recessed regions) which include bottom surfaces 212 comprising material of underlayer 202 in contact with an atmosphere. It should be understood that sidewalls 207, bottom surfaces 212 and mesas 208 represent the top surface of pre-pattern 204, and the top surface of pre-pattern 204 is in contact with an atmosphere. Pre-pattern 204 can be formed by any suitable lithographic technique. Topographic features 206 can comprise any suitable material 211 for directing self-assembly. For example, topographic features 206 can comprise a resist material, which can be a positive and/or negative tone resist material.

In the present invention, the topography of chemo-epitaxial pre-pattern 204 is not essential for perpendicular orientation control of the self-assembled lamellar domains of the high-chi block copolymer.

Figure 7A:
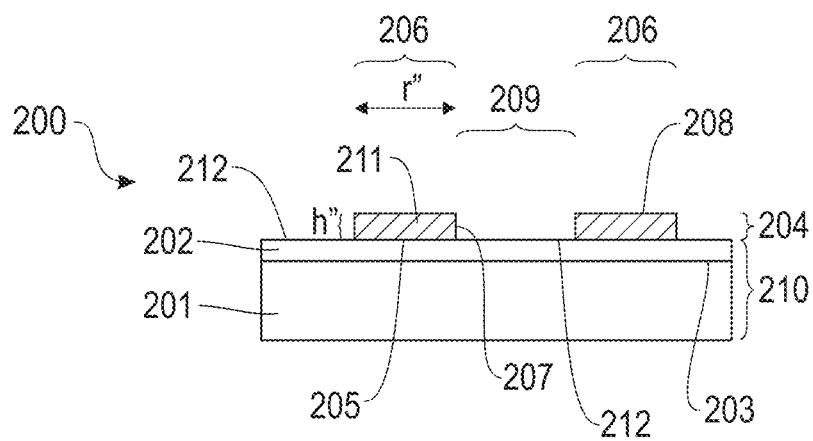
Figure 7B:
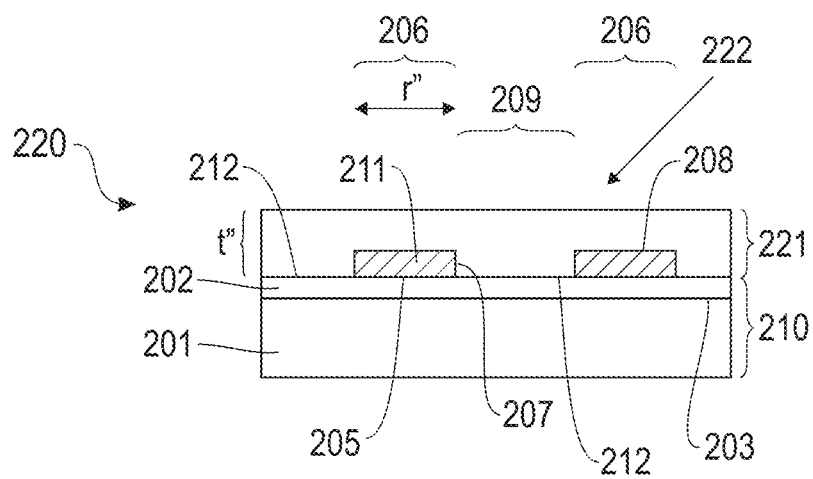

A coating mixture comprising the BCP dissolved in a solvent is applied to pre-pattern 204 using any suitable technique (e.g., spin coating). Pre-pattern 204 is insoluble in or substantially insoluble in the solvent used to prepare the mixture. Removal of the solvent from the applied coating mixture provides layered structure 220 comprising SA layer 221 (FIG. 7B). In this example, the SA layer is disposed on the top surface of pre-pattern 204 in contact with sidewalls 207, bottom surfaces 212 and mesas 208. That is, height h" of features 206 is less than the thickness t" of SA layer 221. Bottom surface 212 can be non-preferential or preferential to the domains of an otherwise identical self-assembled BCP in which all fluorines of L' are replaced by hydrogen. Mesas 208 can be non-preferential or preferential to the domains of an otherwise identical self-assembled BCP in which all fluorines of L' are replaced by hydrogen. Sidewalls 207 can be non-preferential or preferential to the domains of an otherwise identical self-assembled BCP in which all fluorines of L' are replaced by hydrogen, with the proviso that the surface properties of the sidewalls do not adversely affect self-assembly and orientation of the domains formed. Atmosphere interface 222 is typically preferential to the domains of an otherwise identical self-assembled BCP in which all fluorines of L' are replaced by hydrogen.

Self-assembly of the BCP comprising the fluorinated L' group produces layered structure 240 (FIG. 7C), which comprises perpendicularly oriented lamellar domain pattern 241. Self-assembly can be spontaneous and/or induced by thermally treating of SA layer 221 (e.g., annealing SA layer 221 at a temperature between about 80° C. and about 250° C. for between about 1 second and about 24 hours). Domain pattern 241 comprises first lamellar domain 242 (e.g., PS domain) having a width of v", and second lamellar domain 243 (e.g., polycarbonate domain) having a width w". First lamellar domain 242 and second lamellar domain 243 are in contact with trench surface 212 and mesas 208. Top surface 244 of domain pattern 241 is in contact with atmosphere interface 245, indicated by the arrow. In this example, sidewalls 207 of topographic features 206 are preferential to second lamellar domain 243. Therefore, lamellae of second lamellar domain 243 are positioned in contact with sidewalls 207. In this example, lamellae of second lamellar domain 243 that are in contact with sidewalls 207 have a width of about w". In an embodiment, v" and w" are about equal to 0.5Lo.

One of the domains, for example second lamellar domain 243 (e.g., polycarbonate block), can be selectively removed (e.g., ion-etched) or modified in the presence of the first lamellar domain 242 (e.g., PS block) to generate topographical or chemical contrast. Selective removal of one of the domains can also remove underlayer material (not shown), resulting in layered structure 250 comprising etched domain pattern 251 (FIG. 7D). Etched domain pattern 251 has thickness a" and comprises i) first lamellar domain 242 disposed on underlayer surface 212 and mesas 208, ii) openings 253 having bottom surface 252, and iii) topographic features 206. First lamellar domain 242 has top surface 254. Openings 253 can have a width w" of about 0.5Lo (e.g., about 2 nm to about 40 nm, or for a high-chi block copolymer about 2 nm to about 10 nm). The selective removal process may be carried out by a thermal bake (for thermally decomposable materials), a reactive ion etch process, dissolution in a selective solvent, or a combination thereof. A chemical modification may be accomplished by a variety of known methods as discussed above. The selective removal process can further remove features 206 (not shown).

Figure 7E:
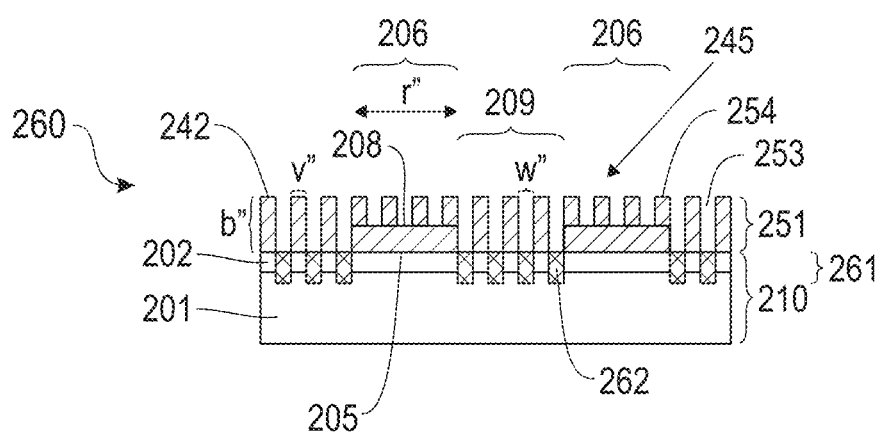
Figure 10:
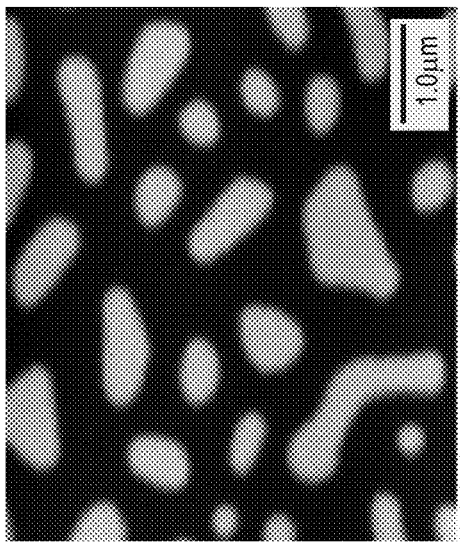
FIGS. 8-11 are AFM height images of the self-assembled block copolymer films of Examples 49-52, respectively.
Figure 9:
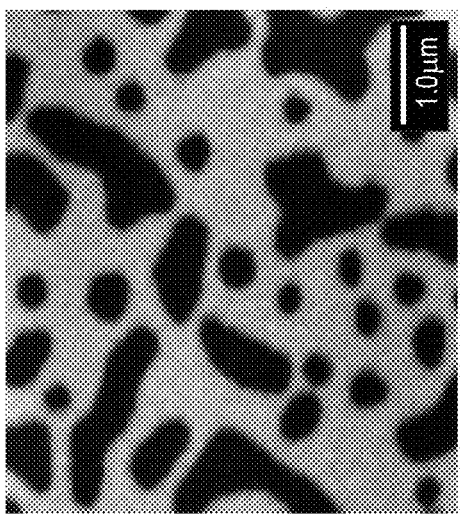
Figure 8:
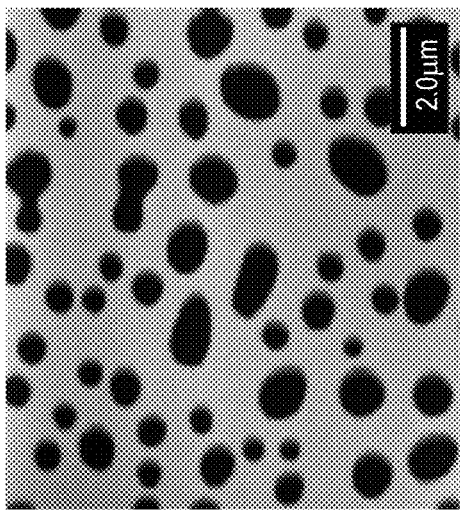
Figure 13:
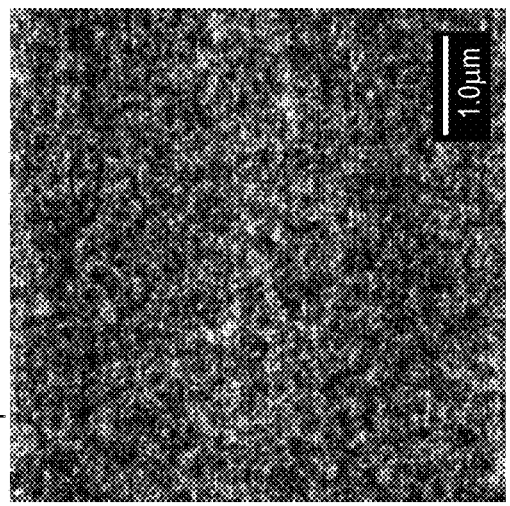
FIGS. 12-16 are AFM height images of the self-assembled block copolymer films of Examples 53-57, respectively.
Figure 12:
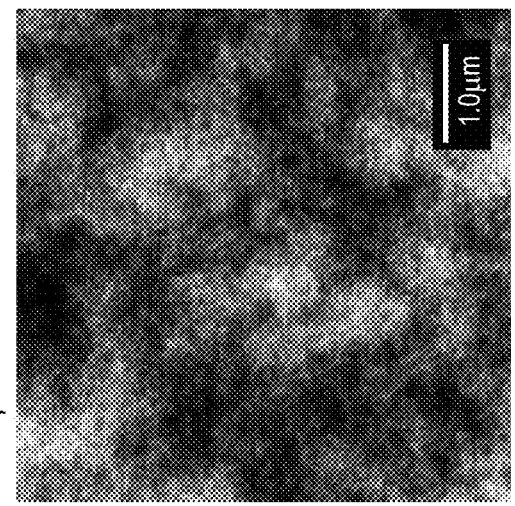
Figure 11:
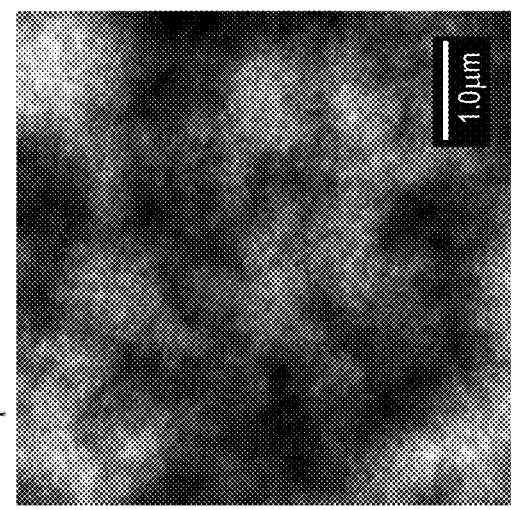
Figure 16:
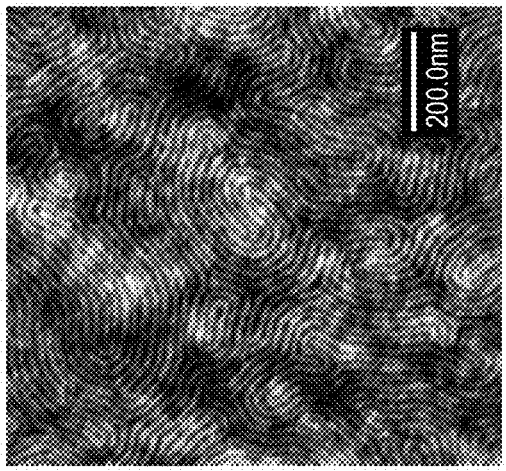
Figure 15:
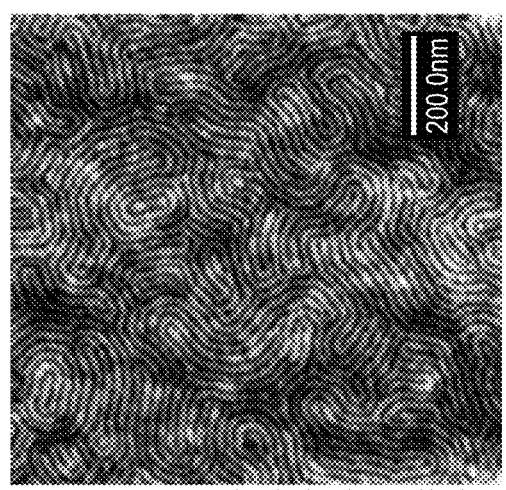
Figure 14:
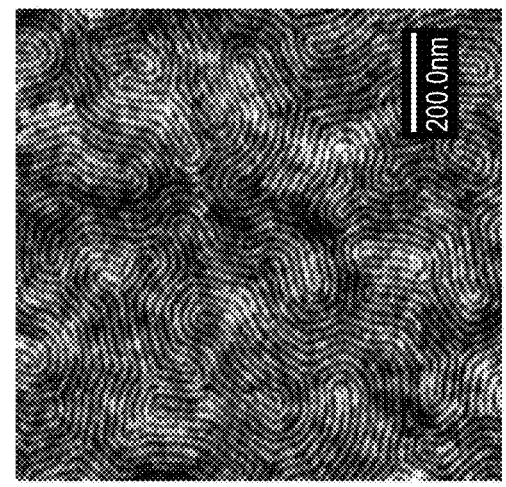
Figure 19:
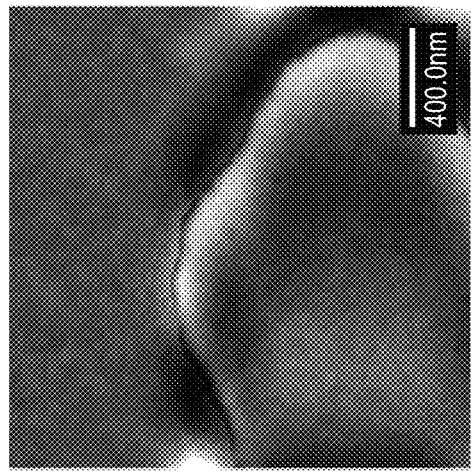
FIGS. 17-21 are AFM height images of the self-assembled block copolymer films of Examples 58 and 60-63, respectively.
Figure 18:
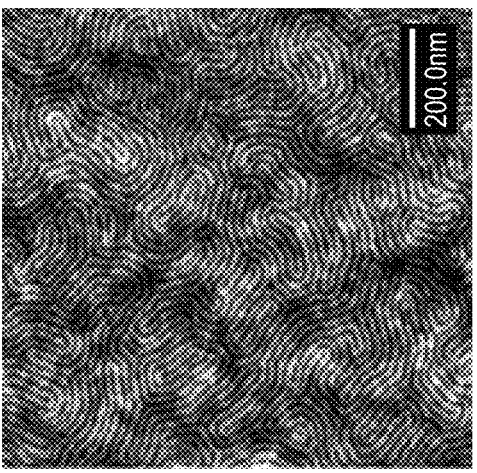
Figure 17:
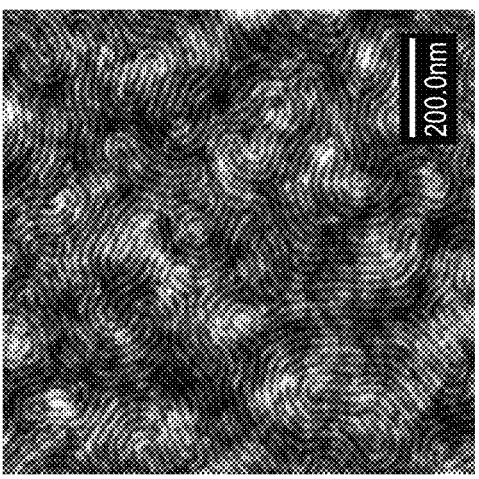
Figure 22:
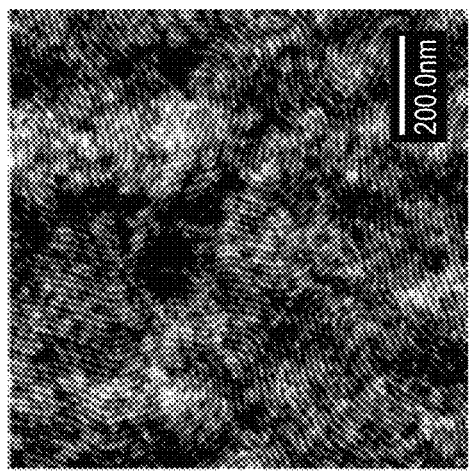
Figure 21:
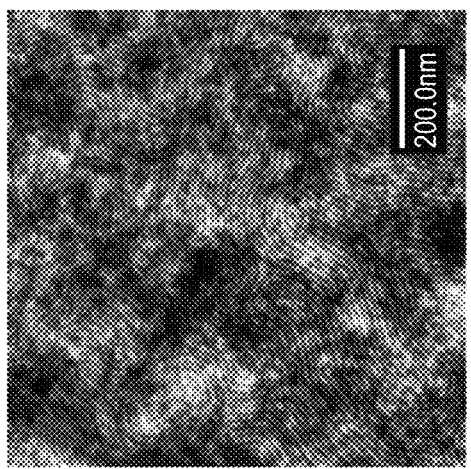
Figure 20:
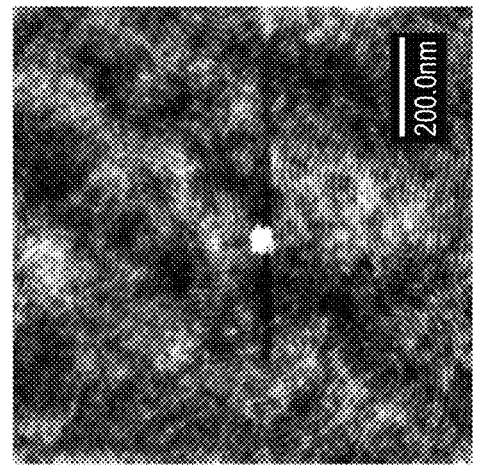
Figure 28:
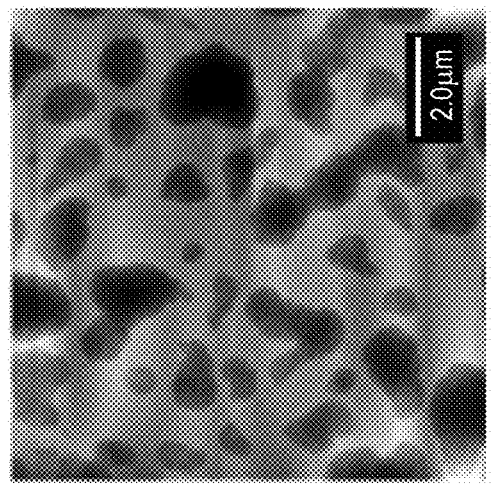
FIGS. 27-31 are AFM height images of the self-assembled block copolymer films of Examples 69-73, respectively.
Figure 27:
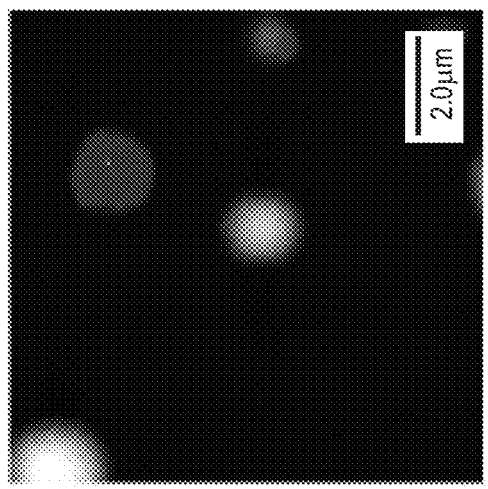
Figure 26:
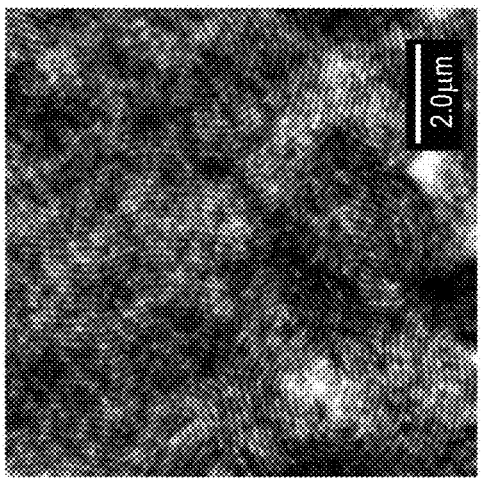
Figure 31:
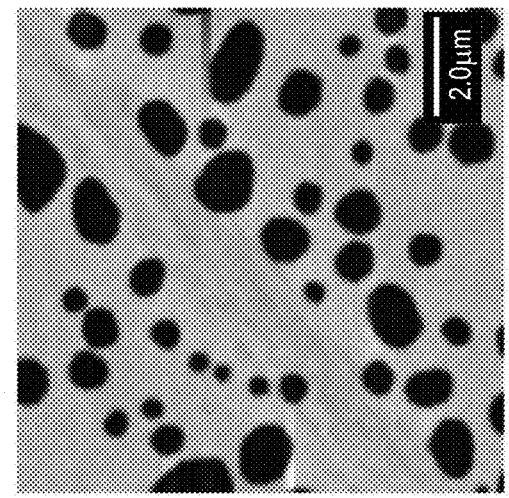
Figure 30:
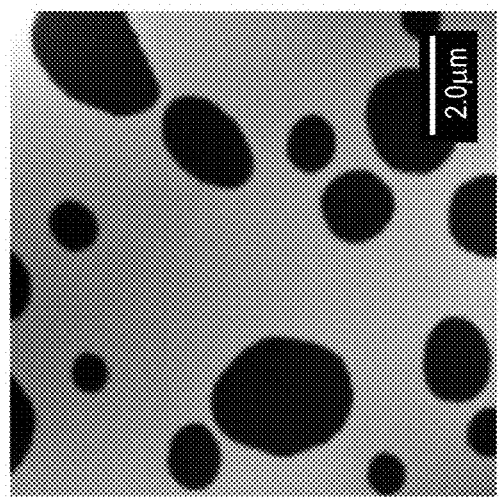
Figure 29:
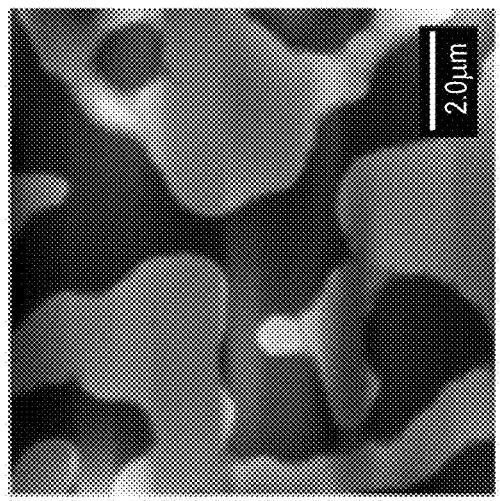
Figure 37:
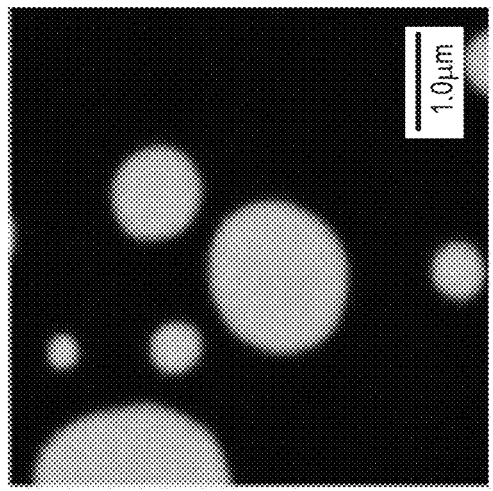
FIGS. 37-41 are AFM height images of the self-assembled block copolymer films of Examples 79-83, respectively.
Figure 36:
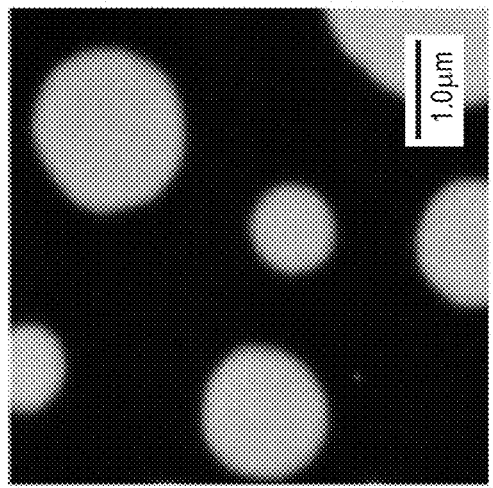
Figure 35:
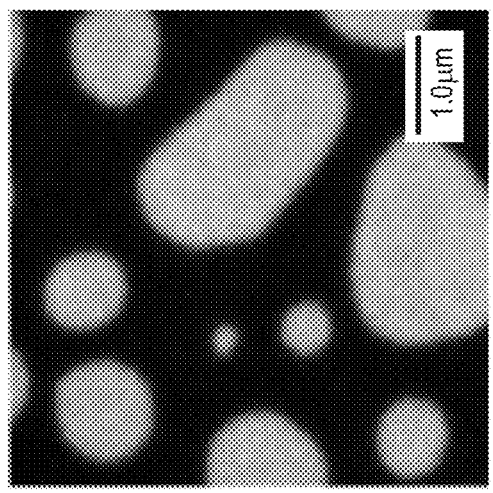
Figure 39:
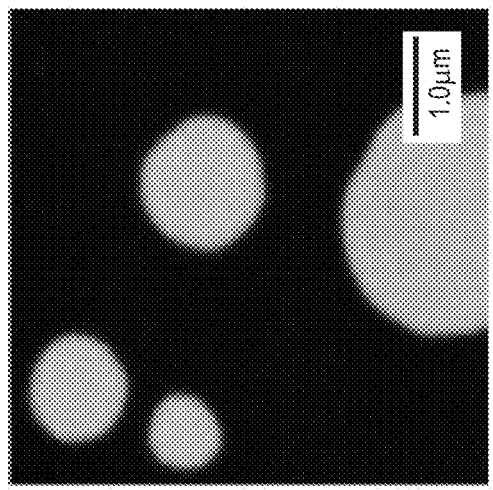
Figure 38:
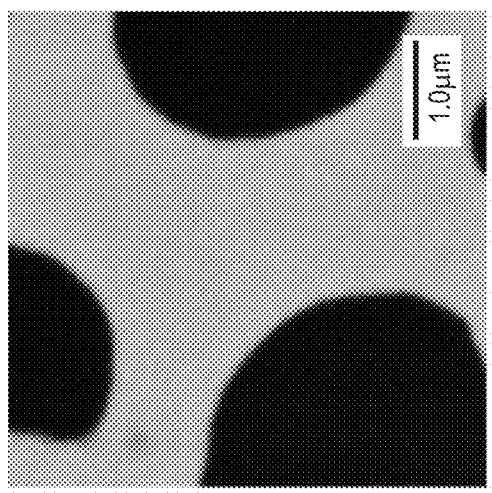
Figure 41:
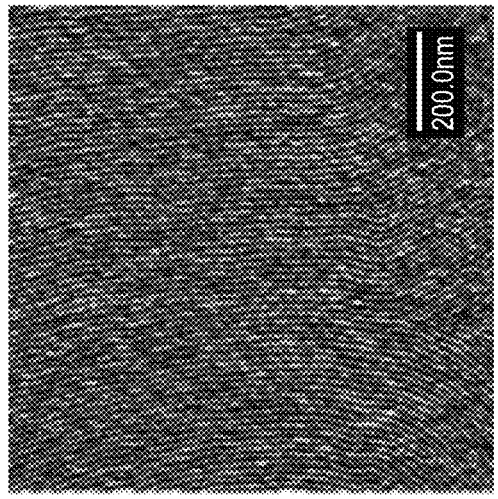
Figure 40:
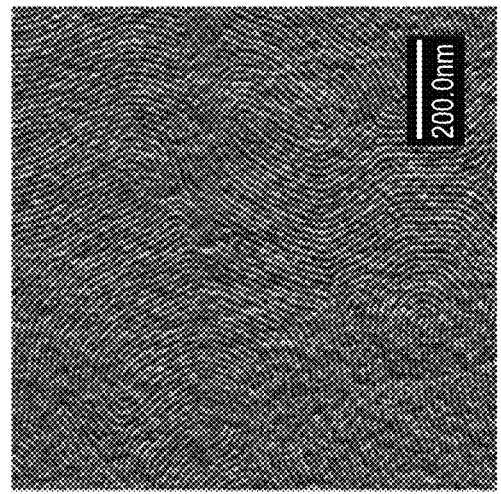
Figure 43:
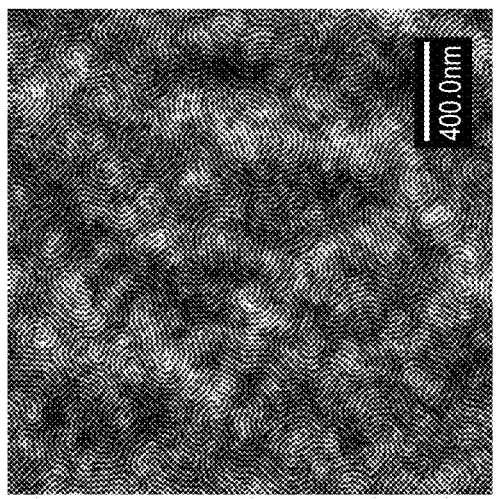
FIGS. 42-57 are AFM height images of the self-assembled block copolymer films of Examples 86-90, 95-97, 102-104, and 110-114, respectively.
Figure 42:
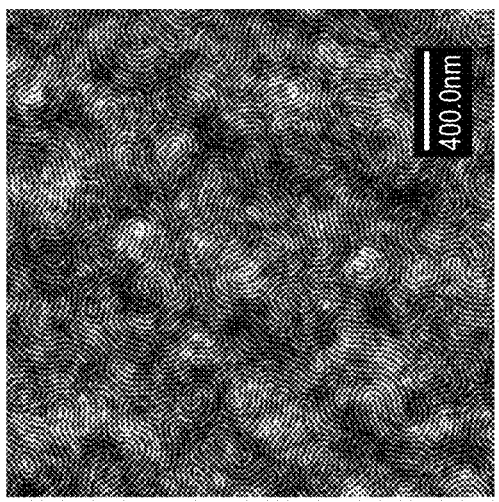
Figure 45:
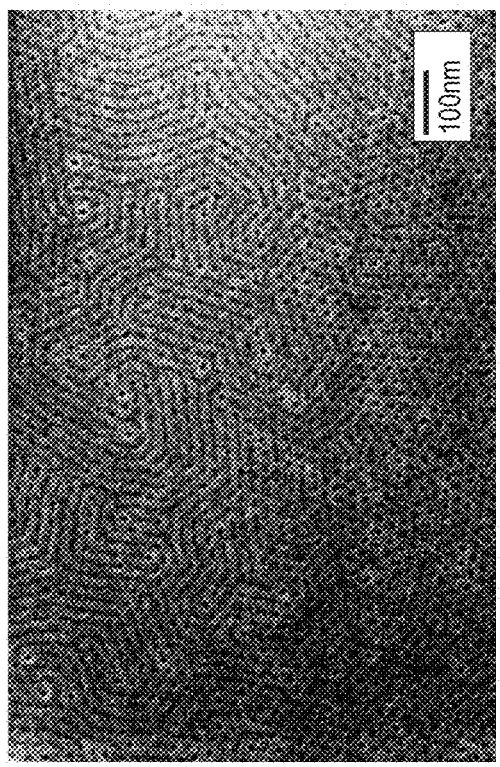
Figure 44:
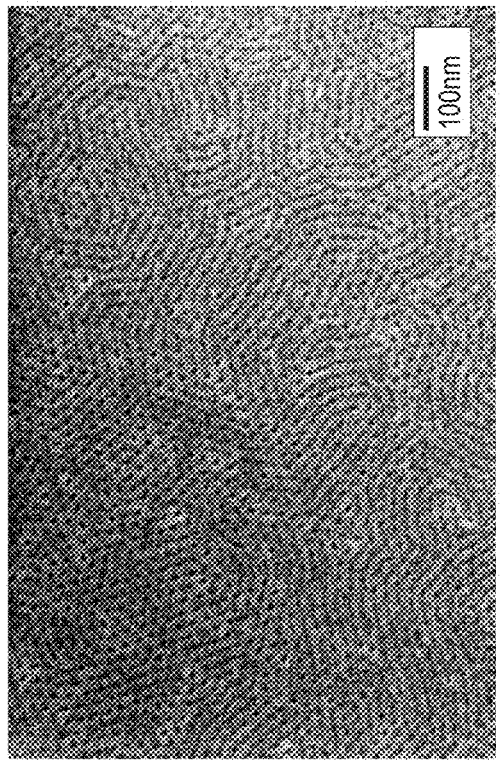
Figure 46:
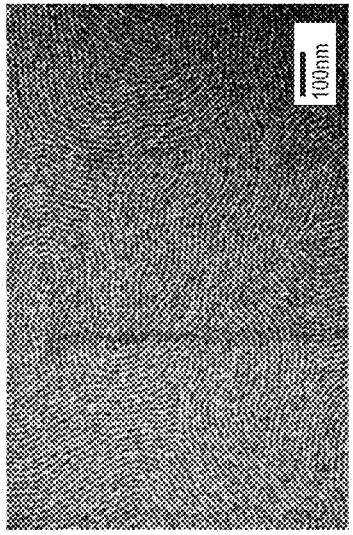
Figure 47:
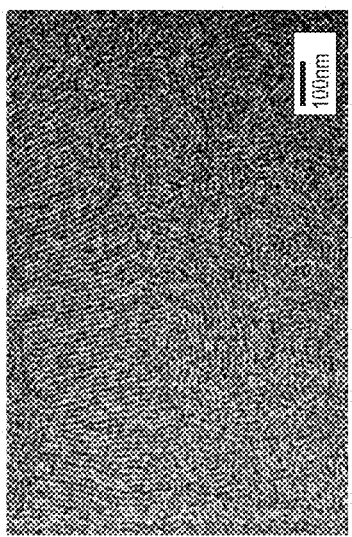
Figure 48:
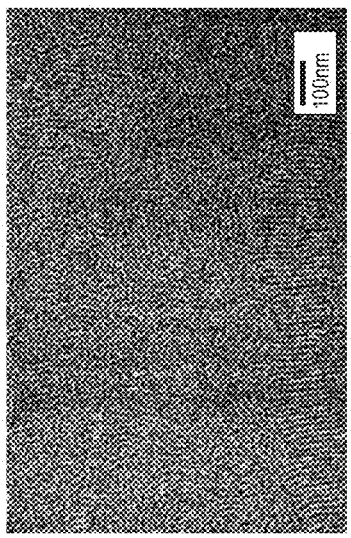
Figure 51:
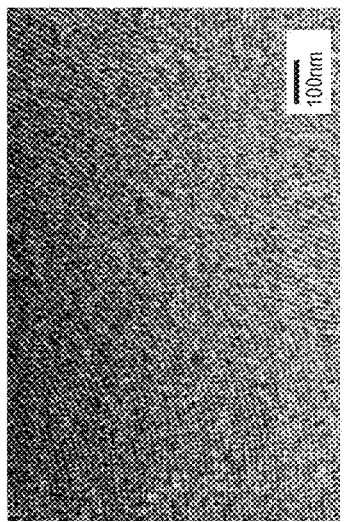
Figure 50:
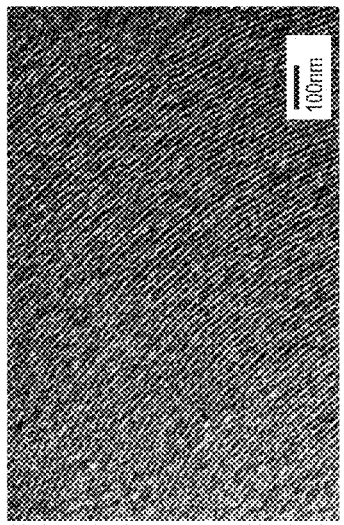
Figure 49:
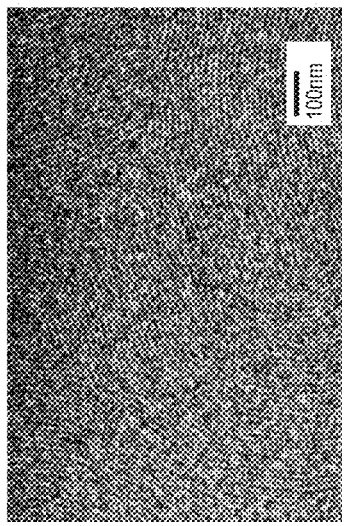
Figure 52:
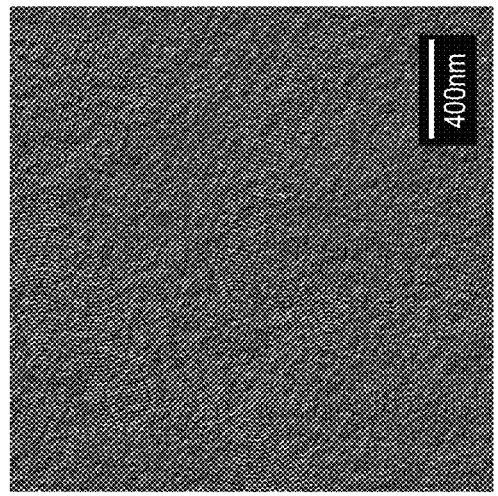
Figure 53:
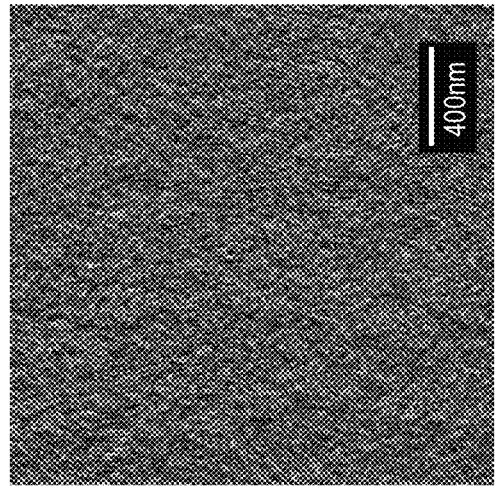
Figure 54:
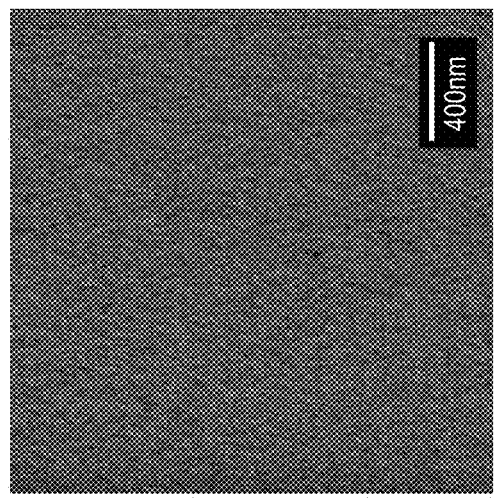
Figure 55:
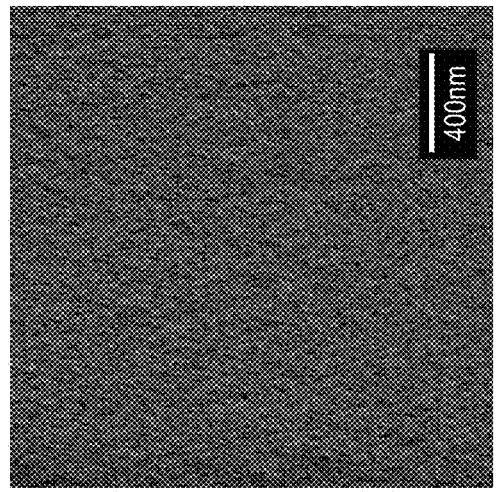
Figure 57:
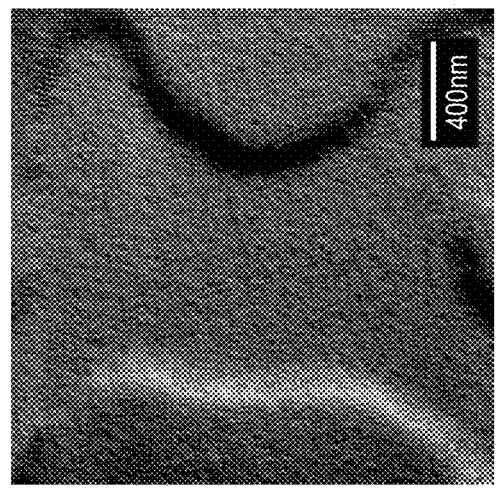
Figure 56:
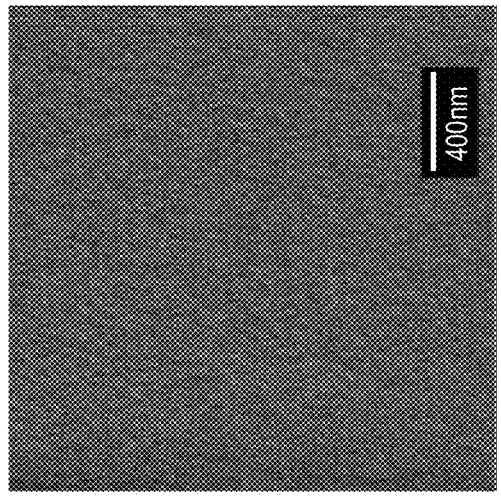

Lastly, etched domain pattern 251 can be transferred to underlayer 202 and/or bottom layer 201, thereby forming layered structure 260 comprising patterned region 261 (FIG. 7E). Patterned region 261 can be a pattern of lines, holes, pits, and/or a chemically altered state of the substrate material represented by altered areas 262. Patterned region 261 can extend into one or more layers of substrate 210. The pattern transfer can be accomplished, for example, by using a reactive ion etch process. Features 206 and first lamellar domain 242 can be removed concomitantly or subsequently to formation of altered areas 262. The height b" of etched domain pattern 251 after the transfer can be less than the height a" of etched domain pattern 251 before the transfer.

Alternatively, etched domain pattern 251 can be transferred to substrate 210 using a tone inversion process as described further above (not shown).

The substrate, and more particularly the surface of the substrate, can comprise inorganic or organic materials such as metals, carbon, or polymers. More particularly, the substrate can comprise a semiconducting material including, for example, Si, SiGe, SiGeC, SiC, Ge alloys, GaAs, InAs, InP, silicon nitride, titanium nitride, hafnium oxide, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, non-doped or contain both doped and non-doped regions therein.

The substrate can have an anti-reflection control layer (ARC layer) or a bottom ARC layer (BARC layer) to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

The morphology (e.g., shape, dimension, and orientation) of the self-assembled domains from block copolymer thin films is a function of block copolymer architecture (diblock, triblock), composition (e.g., material, molecular weight, and volume ratio of different blocks), annealing conditions (e.g., temperature, environment, and annealing time), the interface properties (e.g., polymer-air interface and polymer substrate interface) as well as the defined geometry (e.g., film thickness and topography of the confinement), and linking group L'. By adjusting one or more parameters, the morphology can be adjusted to the need of a specific application.

Self-assembly of the SA layer can occur during film formation, during a post-application bake, or during a subsequent thermal annealing process. Thermal annealing processes include annealing at a constant temperature and thermal gradient annealing. More particularly, the SA layer comprising a high-chi block copolymer is thermally annealed at a temperature that is above the glass transition temperature ($T_g$) of the block copolymer but below the decomposition or degradation temperature ($T_d$) of the block copolymer. The thermal annealing step can be carried out at a temperature of between about 80° C. and about 250° C., more preferably between about 120° C. and about 250° C. The thermal annealing can be performed for a period between about 1 second and about 24 hours, and more particularly between about 1 minute to about 15 minutes. The thermally annealed block copolymer self-assembles to form ordered domains whose orientation is perpendicular to the underlying surface plane. For a given underlayer, block A composition, and block B composition, the L' group can shorten the annealing times to achieve perpendicular orientation compared to an otherwise identical block copolymer in which the fluorines of L' are replaced by hydrogen, thereby increasing manufacturing efficiency.

In general, the SA layer can have a thickness of 50 to 10000 angstroms, more particularly 100 to 5000 angstroms, and even more particularly 100 to 3000 angstroms.

The difference in the etch rates between two ordered domain regions of the block copolymer allows the generation of additional patterns. Selectively removing by etching, solvent or other means, at least one self-assembled domain, creates a nano-scale relief pattern comprising, for example, a pattern of holes that can be transferred into the underlying substrate. Types of etching include any common etching applied in the manufacture of semiconductor devices, for example, dry-etching such as plasma etching, or wet-etching using selective solvents and/or vapors. Typically, dry etching processes are employed for etching at sub-50 nm dimensions. Prior to this pattern development/pattern transfer, the self-assembled layer of SA material can be optionally chemically modified to improve properties necessary for pattern transfer, such as etch resistance or mechanical properties.

The relief pattern of openings formed by selective removal of one of the domains can have a spatial frequency greater than that of a grapho-epitaxial pre-pattern or chemical pre-pattern used with the high-chi block copolymer.

Etch resistant materials can be applied to a substrate surface, underlayer surface, surface of a resist feature, and/or a domain pattern of the block copolymer for control of relative etch rates. The etch-resistant material can be deposited from the vapor phase by a process including, chemical vapor deposition (CVD), plasma enhanced CVD, atomic layer deposition (ALD), sequential infiltration synthesis (SIS), sequential infiltration of metal salts, sputtering, thermal evaporation, electron beam evaporation, pulsed laser deposition, or other suitable deposition method that is compatible with the processes and equipment used in microelectronics fabrication.

Also disclosed is a film comprising the self-assembled high-chi block copolymer comprising a fluorinated L' group, the film comprising lamellar domains having a perpendicular orientation relative to the main plane of the film. Further disclosed is a layered structure comprising a substrate that includes an underlayer and a film of self-assembled high-chi block copolymer disposed on the underlayer, wherein the film comprises lamellar domains having a perpendicular orientation relative to the main plane of the substrate. In an embodiment, the layered structure is a semiconductor device.

The above-described processes can be used to form layered structures comprising metal wiring lines, holes for contacts or vias, insulation sections (e.g., damascene trenches or shallow trench isolation), and trenches for capacitor structures suitable for the design of integrated circuit devices. The method is especially useful in the context of creating patterned layers of oxides, nitrides or polysilicon.

The above-described methods advantageously allow self-assembled structures having reduced feature width and increased periodicity. The domain feature width can be from about 2 nm to about 40 nm, about 2 nm to about 20 nm, about 2 nm to about 15 nm, about 2 nm to about 10 nm, or more particularly between about 2 nm and about 9 nm.

The following examples illustrate the preparation of the disclosed block copolymers and their use in forming self-assembled layers. For purposes of demonstrating the present invention, the substrate can be a two layer structure comprising an underlayer disposed on a silicon wafer. The underlayer surface can be a planar surface having uniform surface properties (i.e., the underlayer surface can have no topographical or chemical patterning). Most of the examples below utilize a planar underlayer of this type. Another example utilizes a substrate having a topographical resist pattern generated on the underlayer for grapho-epitaxy. Another example utilizes a substrate having a top surface of an underlayer having a chemo-epitaxial pre-pattern. The SA layer is disposed on the underlayer and has a top surface in contact with an atmosphere.

The examples below demonstrate that an SA layer comprising a high-chi BCP comprising a polystyrene block linked by a suitable L' group to a polycarbonate block can self-assemble to form perpendicularly oriented lamellar domains when the top surface of the SA layer has contact with the atmosphere, the underlayer surface is preferential to one domain of an otherwise identical self-assembled BCP in which all fluorines of L' are replaced by hydrogen, and the SA layer comprises no other means of orientation control (e.g., use of a separate surface active agent, a grapho-epitaxial pre-pattern, a chemo-epitaxial pre-pattern, or a topcoat over the SA layer). The examples also demonstrate that an underlying topographic and/or chemo-epitaxial pre-pattern can be employed to achieve longer-range order of the perpendicularly oriented domains (e.g., formation of large scale linear array patterns comprising alternating perpendicular oriented lamellae of the BCP domains). Additionally, one of the domains of the domain pattern can be selectively removed, leaving a relief pattern comprising the remaining domain. The relief pattern can then be transferred in one or more steps to the substrate. A tone inversion process of transferring the relief pattern is also demonstrated.

EXAMPLES

Materials used in the following examples are listed in Table 1.

TABLE 1

| ABBREVIATION | DESCRIPTION | SUPPLIER |
|---|---|---|
| A940 | Silicon containing anti-reflective coating (SiARC) | Shin-Etsu, Co. |
| AcCl | Acetyl Chloride | Sigma-Aldrich |
| AIBN | Azobisisobutyronitrile | Sigma-Aldrich |
| Anisole | Anisole | Sigma-Aldrich |
| BriBr | α-Bromoisobutyryl bromide | Sigma-Aldrich |
| BzOH | Benzyl alcohol | Sigma-Aldrich |
| CuBr | Copper (I) bromide | Sigma-Aldrich |
| DBU | 1,8-Diazabicyclo[5,4,0]undec-7-ene | Sigma-Aldrich |
| DCM | Dichloromethane | Sigma-Aldrich |
| DfOD | 1H,1H,8H,8H,-Dodecafluoro-1,8-octanediol | Synquest Laboratories |
| EMD-PS-OH | Hydroxyl- end-functional polystyrene, Mn 12500 | EMD Performance Materials Corp. |
| GMA | Glycidyl methacrylate, MW 142.2 | Sigma-Aldrich |
| HfPD | 2,2,3,3,4,4-Hexafluoro-1,5-pentanediol | Synquest Laboratories |
| Lac | D,L-lactide; 3,6-Dimethyl-1,4-dioxane-2,5-dione | Sigma-Aldrich |
| Me6TREN | Tris[2-(dimethylamino)ethyl]amine | Sigma-Aldrich |
| MeOH | Methanol | Sigma-Aldrich |
| OD | 1,8-Octanediol | Sigma-Aldrich |
| ODL401 | Organic hard mask material | Shin-Etsu, Co. |
| PfDD | 1H,1H,12H,12H,-Perfluoro-1,12-dodecandiol | Synquest Laboratories |
| PfE | 1H,1H,11H,11H,-3,6,9-trioxaundecane-1,11-diol | Synquest Laboratories |
| PFS | Pentafluorostyrene | Sigma-Aldrich |
| PLA | Poly(lactide) | |
| PMDETA | N,N,N',N',N''-pentamethyldiethylenetriamine | Sigma-Aldrich |
| P(Sty-r-MMA)-OH | hydroxy-terminated poly(styrene-r-methyl methacrylate) random copolymer brush polymer | EMD Performance Materials Corp. |
| PS-b-PMMA 3964 | Polystyrene-b-poly(methyl methacrylate), Mn(PS) = 21000, Mn(PMMA) = 21000, PDI 1.07 | Polymer Source, Inc. |
| PTFE | Poly(tetrafluoroethylene) | |
| Si Gel | Silica Gel | Sigma-Aldrich |
| Sty | Styrene, MW 104.15 | Sigma-Aldrich |
| TEA | Triethylamine | Sigma-Aldrich |
| THF | Tetrahydrofuran | Sigma-Aldrich |
| TMSS | p-Trimethylsilylstyrene | Prepared below |
| Tol | Toluene | Sigma-Aldrich |

Herein, Mn is the number average molecular weight, Mw is the weight average molecular weight, and MW is the molecular weight of one molecule.

Cyclic carbonate monomer MTC-Me (MW=174) was prepared as previously reported (Y. ZHOU et al., Polymer, 45(16), 5459-5463; 2004).

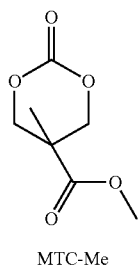

MTC-Me

Cyclic carbonate monomer MTC-Et (MW 188) was prepared according to the general procedure of J. Hedrick, et al., US 20110151566 A1, published Jun. 23, 2011.

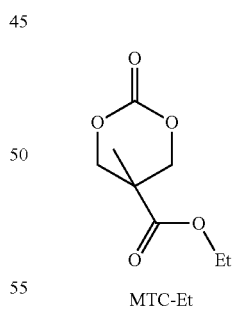

MTC-Et

4-Trimethylsilylstyrene was prepared according to the general procedure of J. Rathore, et al., "A Photocurable, Photoluminescent, Polycarbosilane Obtained by Acyclic Diene Metathesis (ADMET) Polymerization", Macromolecules, 2009, 42, 4614-4621.

The following commercially available compounds were used to prepare the block copolymers.

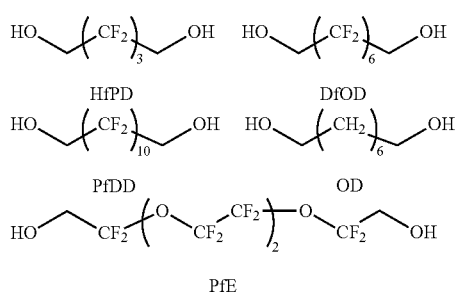

Example 1

Synthesis of mono-hydroxy functional ATRP initiator MH-1.

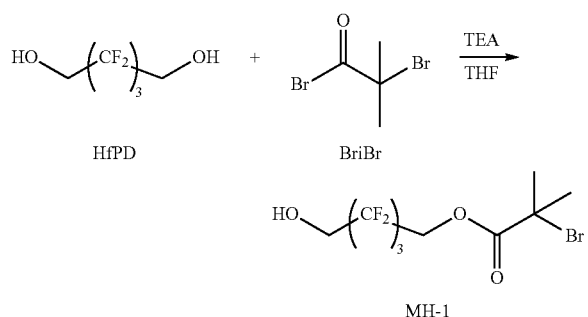

To a 100 ml round bottom flask (RBF) equipped with a magnetic stir bar, HfPD (3.0 g, 14.14 mmol) was dissolved in dry THF (50 ml). To this solution, TEA (2 ml, 14.14 mmol) was added. The reaction was stirred under $N_2$ for 10 minutes at room temperature (r.t.) after which BriBr (0.85 ml, 7.07 mmol) was added dropwise over 10 minutes. The reaction was stirred for 24 hours and was stopped the solution was filtered to remove the TEA.HCL salt. The THF was evaporated under vacuum and the resulting crude product was purified by passing through a silica gel column with Hex:EtOAc 90:10 as the eluant to obtain the mono-hydroxy functional ATRP initiator (1.2 g, 50% yield). The product was confirmed by $^1$H NMR and $^{19}$F NMR. $^1$H NMR (400 MHz, CDCl$_3$, 23° C., ppm): 1.21 (3H), 1.46 (6H), 3.71 (2H), 4.21 (2H), and 4.69 (2H). $^{19}$F NMR (400 MHz, CDCl$_3$, 23° C., ppm): −81.00, −120.48, −127.79.

Example 2

Mono-hydroxy functional initiator MH-2 was prepared according to the general procedure of Example 1 using DfOD (1H,1H,8H,8H,-dodecafluoro-1,8-octanediol).

Example 3

Mono-hydroxy functional initiator MH-3 was prepared according to the general procedure of Example 1 using PfDD (1H,1H,12H,12H-perfluoro-1,12-dodecandiol).

Example 4

Mono-hydroxy functional initiator MH-4 was prepared according to the general procedure of Example 1 using PfE.

Example 5

Mono-hydroxy functional initiator MH-5 was prepared according to the general procedure of Example 1 using OD (octanediol).

TABLE 2 summarizes Examples 1-5.

| Example | Name | THF, ml | Diol (g), mmol | TEA (ml), mmol | BriBr (ml), mmol | Rxn time (hours) | Rxn temp |
|---|---|---|---|---|---|---|---|
| 1 | MH-1 | 50 | HfPD (3.0), 14.14 | (2), 14.4 | (0.85), 7.07 | 24 | r.t. |
| 2 | MH-2 | 30 | DfOD (1.50), 4.11 | (0.7), 4.96 | (0.40), 3.10 | 24 | r.t. |
| 3 | MH-3 | 100 | PfDD (2.5), 4.44 | (0.63), 4.44 | (0.25), 2 | 24 | r.t. |
| 4 | MH-4 | 200 | PfE (2.0), 4.8 | (1.70), 12.20 | (0.45), 0.83 | 24 | r.t. |
| 5 (comp) | MH-5 | 100 | OD (5.73), 146.23 | (2), 14.4 | (1.60), 13.08 | 24 | r.t. | r.t. = room temperature

Example 6

Synthesis of hydroxyl-functional polystyrene HPS-1 from initiator of MH-1 (Example 1).

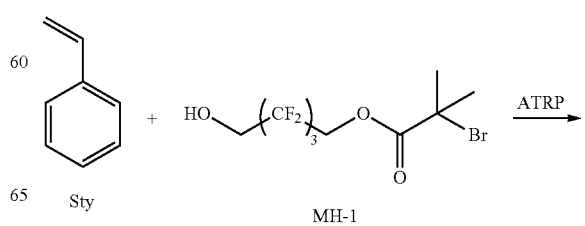

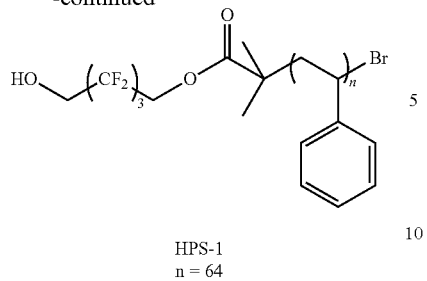

HPS-1
n = 64

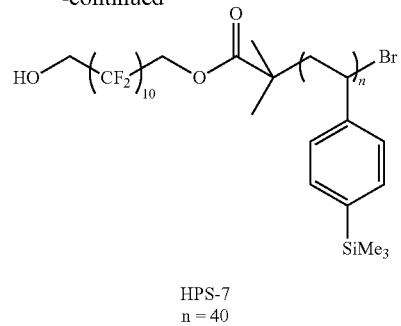

HPS-7
n = 40

To a 50 ml Schlenk flask equipped with a stir bar, styrene (Sty, 9.80 g, 94 mmol), ATRP initiator MH-1 (0.20 g, 0.554 mmol, Example 1), CuBr (79 mg, 0.554 mmol), and anisole (10.0 g) were added. The flask was sealed with a rubber septum and was purged by bubbling nitrogen for one hour. At this point, PMDETA (0.96 mg, 0.554 mmol) was added and the reaction flask was placed in an oil-bath set at 100° C. for four hours. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer was collected in a fit funnel and was dried under vacuum for 24 hours at 50° C. Mn=7000, Mw=7500, PDI=1.06. Subscript n is about 64 based on Mn.

Examples 7-11

Hydroxyl-functional polystyrenes HPS-2 to HPS-6 having different fluorinated end groups were synthesized according to the procedure of Example 6, (see Table 3).

Example 12

Hydroxyl-functional polytrimethylsilylstyrene HPS-7 was synthesized according to the general procedure of Example 6 using trimethylsilyl styrene and MH-3.

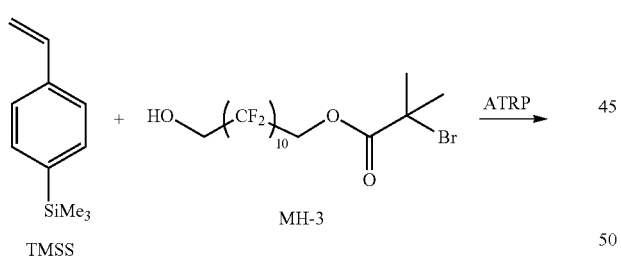

Example 13

Hydroxyl-functional polystyrene HPS-8 was synthesized according to the general procedure of Example 6 using styrene and MH-2.

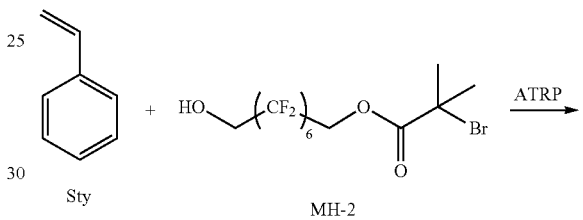

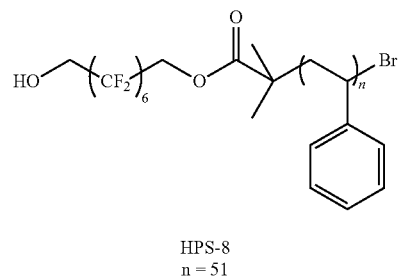

HPS-8
n = 51

Table 3 summarizes Examples 6-12. PDI refers to the polydispersity index.

TABLE 3

| Example | Name | Monomer | Catalyst | ATRP Initiator | Ester group | Temp ° C. | Time (hours) | Mn | Mw | PDI |
|---|---|---|---|---|---|---|---|---|---|---|
| 6 | HPS-1 | Styrene | CuBr/PMDETA | MH-1 | HOCH$_2$(CF$_2$)$_3$CH$_2$O—* | 100 | 4.5 | 7000 | 7500 | 1.06 |
| 7 | HPS-2 | Styrene | CuBr/PMDETA | MH-2 | HOCH$_2$(CF$_2$)$_6$CH$_2$O—* | 100 | 4.5 | 11300 | 12300 | 1.08 |
| 8 | HPS-3 | Styrene | CuBr/PMDETA | MH-3 | HOCH$_2$(CF$_2$)$_{10}$CH$_2$O—* | 100 | 3 | 6800 | 7400 | 1.09 |
| 9 | HPS-4 | Styrene | CuBr/PMDETA | MH-4 | HOCH$_2$CF$_2$(OCF$_2$CF$_2$)$_2$OCF$_2$CH$_2$O—* PFE | 100 | 100 | 6800 | 7200 | 1.06 |
| 10 | HPS-5 | Styrene | CuBr/PMDETA | MH-5 | HOCH$_2$(CH$_2$)$_6$CH$_2$O—* | 100 | 3.5 | 9600 | 10300 | 1.07 |
| 11 | HPS-6 | Styrene | CuBr/PMDETA | MH-2 | HOCH$_2$(CF$_2$)$_6$CH$_2$O—* | 100 | 9 | 14200 | 15300 | 1.06 |
| 12 | HPS-7 | TMS Styrene | CuBr/PMDETA | MH-3 | HOCH$_2$(CF$_2$)$_{10}$CH$_2$O—* | 100 | 1.5 | 7200 | 7900 | 1.10 |
| 13 | HPS-8 | Styrene | CuBr/PMDETA | MH-2 | HOCH$_2$(CF$_2$)$_6$CH$_2$O—* | 100 | 2.5 | 5700 | 6100 | 1.06 |

Preparation of Block Copolymers

Example 14 (Comparative)

Synthesis of polystyrene-b-poly(MTC-Me) using EMD-PS-OH as initiator for the ring opening polymerization (ROP) of MTC-Me.

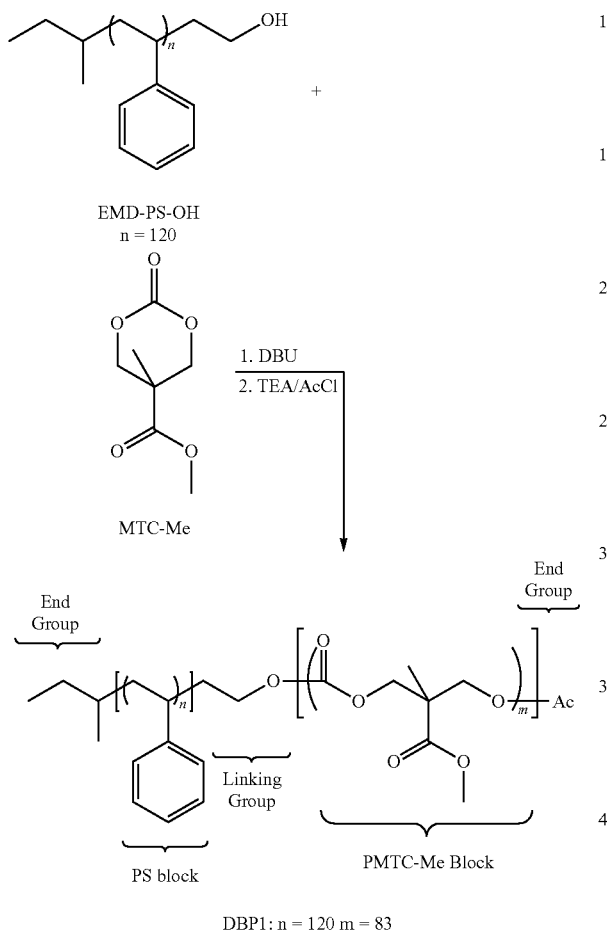

Diblock copolymer DBP1, n=120, m=83, was prepared by ring opening polymerization (ROP) of cyclic carbonate MTC-Me using mono-alcohol polystyrene macroinitiator EMD-PS-OH and DBU as the ROP base catalyst. To an oven dried 4 mL glass vial equipped with a magnetic stir bar were added EMD-PS-OH (0.10 g, 0.01 mmol, Mn=12500, PDI=1.05, n=120), obtained from EMD Performance Materials Corp, Branchburg, N.J.), MTC-Me (0.31 g, 1.80 mmol), and dichloromethane (DCM, 1.80 mL). The reaction mixture was stirred until the EMD-PS-OH macroinitiator and MTC-Me were completely dissolved in DCM, upon which catalyst (DBU, 1.5 mg, 0.01 mmol, 10 wt % solution in toluene) was added. The reaction mixture was stirred at room temperature (r.t.) for 2.5 hours in a glove box. The reaction vial brought out of the glove box and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol: acetonitrile (20 mL, 80:20 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. This polymer was further purified by stirring it over cyclohexane for 24 hours followed by decanting and drying the solid at 40° C. for 24 hours to give the final polymer DBP1. Mn (GPC)=30300, Mw=30800, PDI=1.01; Mn of each block by NMR=PS block 12500, PMTC-Me block 14400. Based on Mn, n=120, m=83 in the above structure.

Example 15

Synthesis of BCP-1 using macroinitiator HPS-1 of Example 6.

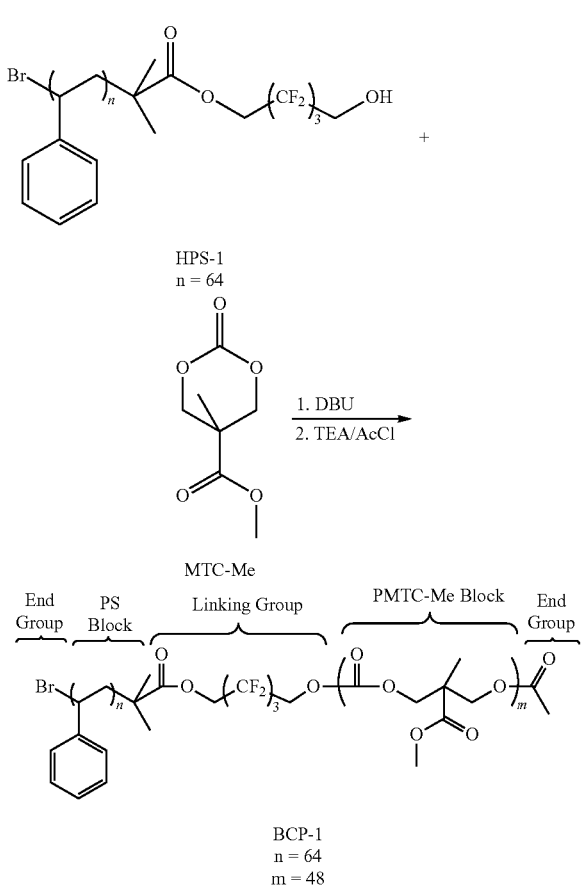

To an oven dried 4 ml glass vial equipped with a magnetic stir bar, hydroxyl-functional polystyrene initiator HPS-1 (0.15 g, 0.0214 mmol, Example 6), MTC-Me (0.51 g, 2.90 mmol) of and DCM (3.80 g) were added. The reaction mixture was stirred until the macroinitiator and MTC-Me were completely dissolved in DCM, upon which DBU (3.3 mg, 0.0214 mmol, 10 wt % stock solution in toluene) was added. The reaction mixture was stirred at room temperature for two hours in a glove box. After two hours, the reaction was stopped by bringing the reaction vial out of the glove box and adding DCM (0.5 ml), acetyl chloride (0.1 g, 0.988 mmol), and TEA (0.1 g, 1.28 mmol). The reaction was further stirred for 30 minutes at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. This compound was dissolved in THF to form a 20 wt % solution and the polymer was precipitated in methanol:acetonitrile (20 ml, 80:20 v:v). The precipitated solids and the solvents were collected in a centrifuge tube and the solids was collected by centrifuging at 4000 RPM at 0° C. followed by decanting the solvent and drying the solid BCP-1 in a vacuum oven at 40° C. for two hours. Mn (NMR) PS block (7000, n=64), Mn of PMTC-Me block=8300, m=48); $Vf_{PMTC-ME}=0.50$.

Examples 16

Preparation of BCP-2.

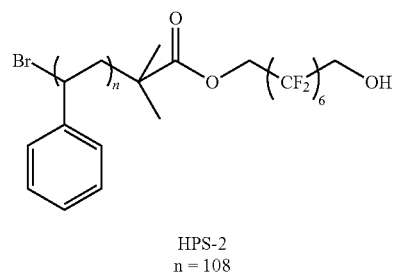

HPS-2
n = 108

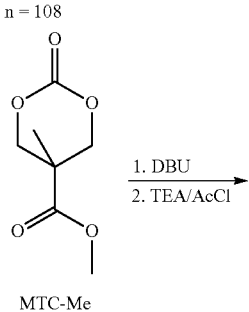

MTC-Me

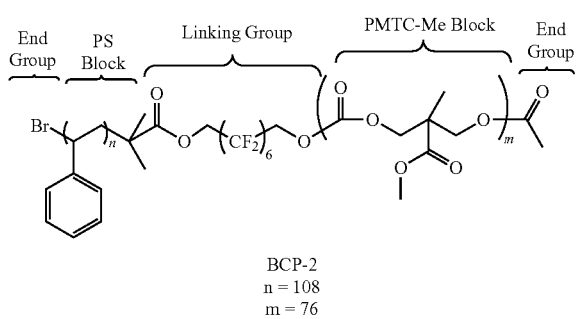

BCP-2
n = 108
m = 76

BCP-2 was prepared using the general procedure of Example 14 and macroinitiator HPS-2.

Examples 17

Preparation of BCP-3.

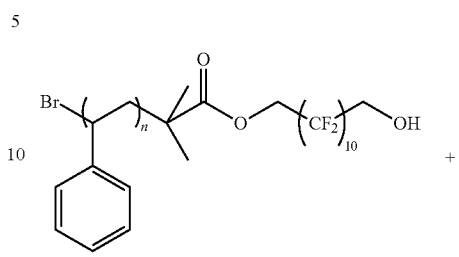

HPS-3
n = 65

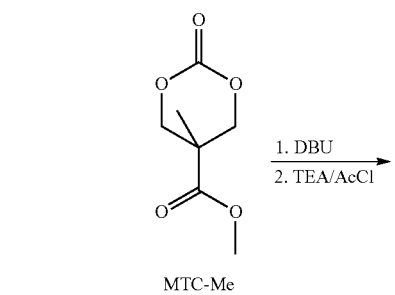

MTC-Me

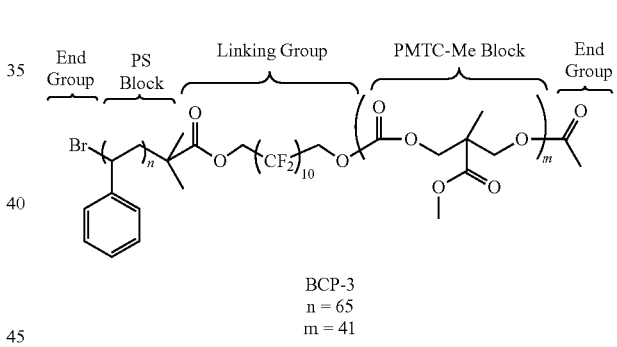

BCP-3
n = 65
m = 41

BCP-3 was prepared using the general procedure of Example 14 and macroinitiator HPS-3. Mn=7200, m=41.

Examples 18 (Comparative)

Preparation of BCP-4.

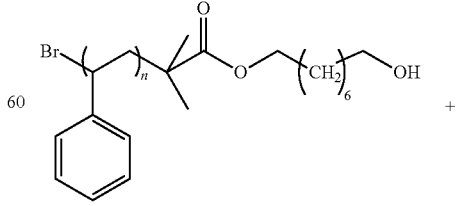

HPS-5
n = 92

-continued

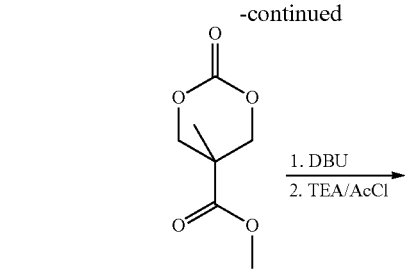

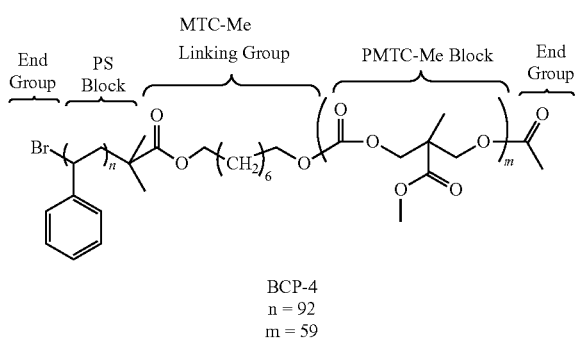

BCP-4
n = 92
m = 59

BCP-4 was prepared using the general procedure of Example 15 and macroinitiator HPS-5.

Examples 19

Preparation of BCP-5.

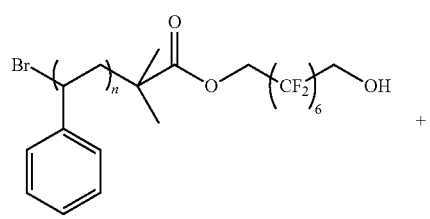

HPS-6
n = 136

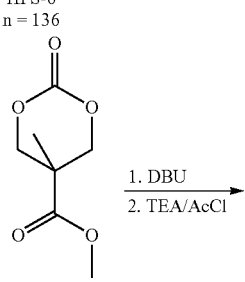

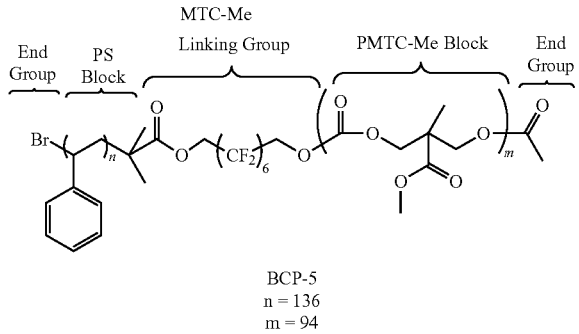

BCP-5
n = 136
m = 94

BCP-5 was prepared using the general procedure of Example 15 and macroinitiator HPS-6.

Examples 20

Preparation of BCP-6.

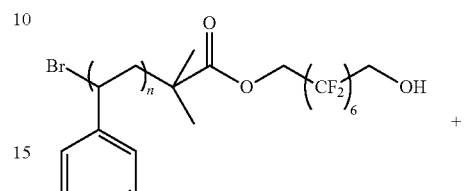

HPS-2
n = 108

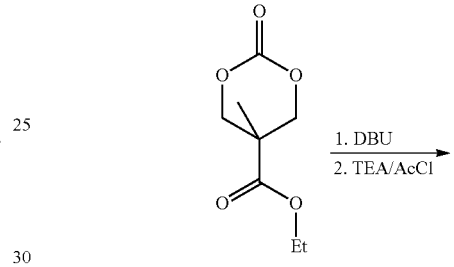

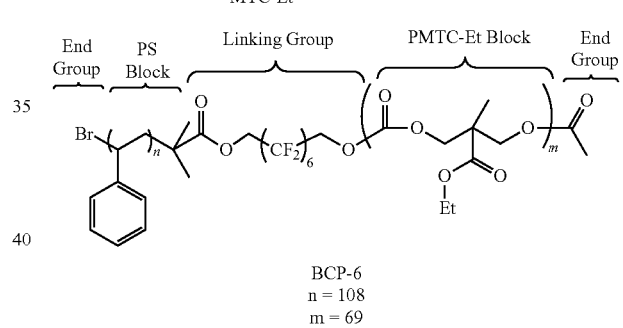

BCP-6
n = 108
m = 69

BCP-6 was prepared using the general procedure of Example 15 using cyclic carbonate monomer MTC-Et and macroinitiator HPS-2.

Examples 21

Preparation of BCP-7.

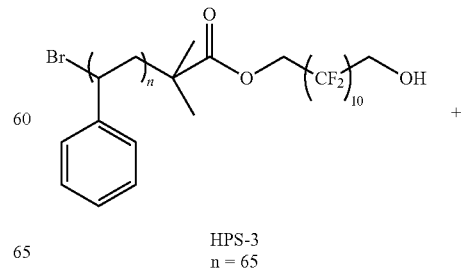

HPS-3
n = 65

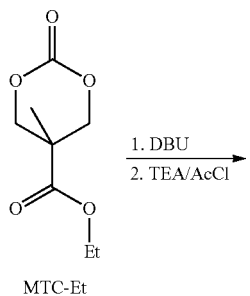

MTC-Et

1. DBU
2. TEA/AcCl

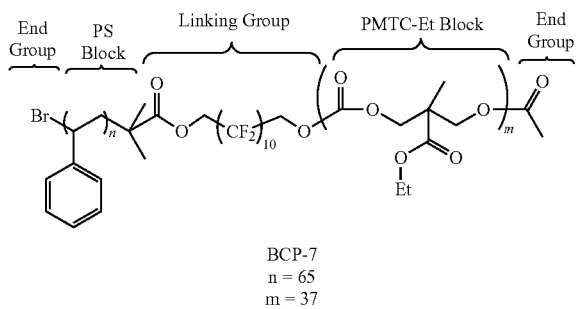

BCP-7
n = 65
m = 37

BCP-7 was prepared using the general procedure of Example 15 using cyclic carbonate monomer MTC-Et and macroinitiator HPS-3.

Examples 22

Preparation of BCP-8.

BCP-8 was prepared using the general procedure of Example 15 and macroinitiator HPS-6.

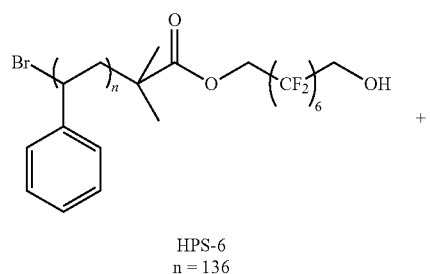

HPS-6
n = 136

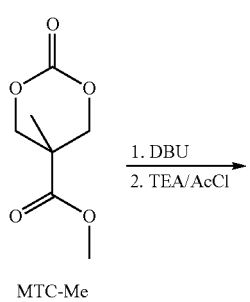

MTC-Me

1. DBU
2. TEA/AcCl

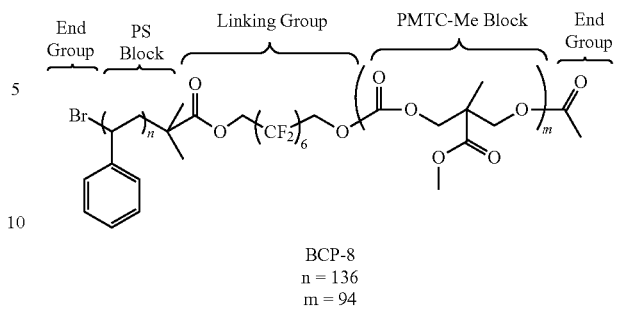

BCP-8
n = 136
m = 94

Examples 23

Preparation of BCP-9.

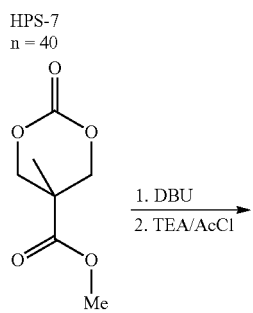

HPS-7
n = 40

MTC-Me

1. DBU
2. TEA/AcCl

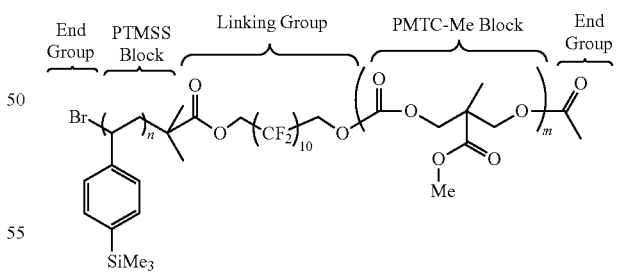

BCP-9
n = 40
m = 41

BCP-9 was prepared using the general procedure of Example 14 using cyclic carbonate monomer MTC-Me and macroinitiator HPS-7.

The preparations of Examples 14 to 23 are summarized in Table 4.

TABLE 4

| Ex. | BCP Name | Macro initiator | Macro initiator (g, mmol) | Cyclic Carbonate Monomer, (g, mmol) | DCM (g) | DBU (mg) | Time (hours) | Mn (NMR) PS Block | Mn (NMR) Poly-carbonate Block | Vf PMTC—Me | GPC Mn | GPC Mw | GPC PDI |
|---|---|---|---|---|---|---|---|---|---|---|---|---|---|
| 14 (comp) | DBP1 | EMD—PS—OH | 0.10, 0.01 | MTC—Me, 0.31, 1.8 | 2.40 | 1.5 | 2.5 | 12500 | 14400 | 0.48 | 30300 | 30800 | 1.01 |
| 15 | BCP-1 | HPS-1 | 0.15, 0.0214 | MTC—Me, 0.51, 2.9 | 3.80 | 3.3 | 2 | 7000 | 8300 | 0.50 | 18200 | 19600 | 1.08 |
| 16 | BCP-2 | HPS-2 | 0.10, 0.0088 | MTC—Me, 0.26, 1.5 | 1.95 | 1.3 | 2 | 11300 | 13200 | 0.48 | 22400 | 24500 | 1.09 |
| 17 | BCP-3 | HPS-3 | 0.15, 0.022 | MTC—Me, 0.51, 2.9 | 3.80 | 3.3 | 2 | 6800 | 7200 | 0.46 | | | |
| 18 (comp) | BCP-4 | HPS-5 | 0.10, 0.010 | MTC—Me, 0.31, 1.79 | 2.30 | 1.6 | 1.5 | 9600 | 12600 | 0.51 | 23200 | 24500 | 1.05 |
| 19 | BCP-5 | HPS-6 | 0.15, 0.0105 | MTC—Me, 0.51, 2.96 | 3.80 | 1.4 | 8 | 14200 | 16400 | 0.48 | 32000 | 33000 | 1.04 |
| 20 | BCP-6 | HPS-2 | 0.15, 0.0132 | MTC—Et, 0.49, 2.60 | 3.40 | 2.0 | 5.5 | 11300 | 13000 | 0.48 | 29700 | 31200 | 1.05 |
| 21 | BCP-7 | HPS-3 | 0.15, 0.022 | MTC—Et, 0.58, 3.09 | 3.80 | 3.3 | 2 | 6800 | 7000 | 0.45 | 19900 | 21900 | 1.10 |
| 22 | BCP-8 | HPS-6 | 0.15, 0.0105 | MTC—Me, 0.51, 2.96 | 3.80 | 1.4 | 3.5 | 14200 | 9000 | 0.33 | 25600 | 26000 | 1.04 |
| 23 | BCP-9 | HPS-7 | 0.10, 0.013 | MTC—Me, 0.31, 1.81 | 2.36 | 2.0 | 3 | 7200 | 7800 | 0.44 | 21800 | 23600 | 1.08 |

Example 24 (Comparative)

Synthesis of DBP2 with macroinitiator EMD-PS-OH and lactide.

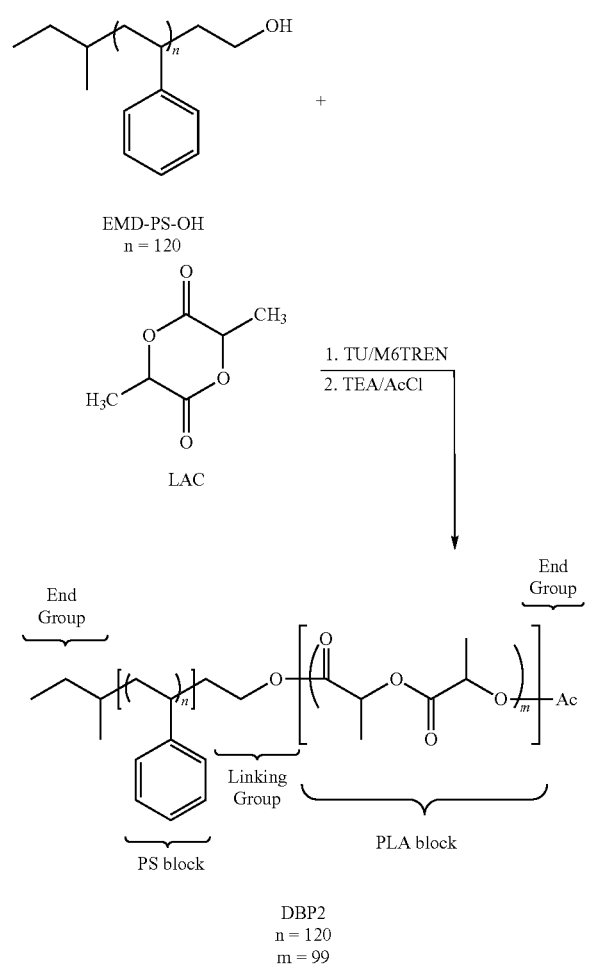

Diblock copolymer DBP2, n=120, m=99, was prepared by ring opening polymerization (ROP) of D,L-lactide (LAC) using mono-alcohol polystyrene macroinitiator EMD-PS-OH and M6TREN and TU as the ROP base catalyst and cocatalyst respectively. To an oven dried 4 mL glass vial equipped with a magnetic stir bar were added EMD-PS-OH (0.20 g, 0.016 mmol, Mn=12500, PDI=1.05, n=120), obtained from EMD Performance Materials Corp, Branchburg, N.J.), lactide (LAC, 0.254 g, 1.76 mmol), and dichloromethane (DCM, 1.80 mL). The reaction mixture was stirred until the EMD-PS-OH macroinitiator and LAC were completely dissolved in DCM, upon which catalyst (M6TREN, 23 mg, 0.1 mmol), and TU cocatalyst (37 mg, 0.1 mmol) were added. The reaction mixture was stirred at room temperature (r.t.) for 1.5 hours in a glove box. The reaction vial brought out of the glove box and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the final polymer DBP2. Mn (GPC)= 29500, Mw=31300, PDI=1.05; Mn of each block by NMR=PS block 12500, PLA block 14250. Based on Mn, n=120, m=99 in the above structure.

Example 25

Synthesis and purification of BCP-10 block copolymer using macroinitiator HPS-8 of Example 13.

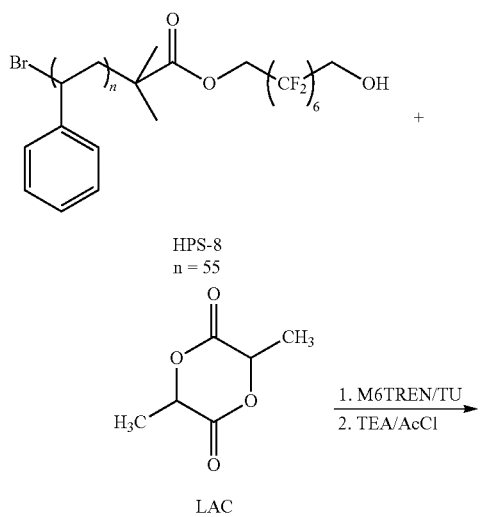

HPS-8
n = 55

LAC

1. M6TREN/TU
2. TEA/AcCl collected in a frit funnel and dried under vacuum at 40° C. for two hours to obtain the resulting compound. This compound was dissolved in THF to form a 20 wt % solution and the polymer was precipitated in methanol:acetonitrile (20 ml, 750:25 v:v). The precipitated solids and the solvents were collected in a centrifuge tube and the solids was collected by centrifuging at 4000 RPM at 0° C. followed by decanting the solvent and drying the solid BCP-11 in a vacuum oven at 40° C. for two hours. Mn (GPC)=20.2 k, Mw=22.15 k, PDI=1.09. Mn (NMR) PS block (5700, n=55), LAC block (6900, m=48); $Vf_{LAC}$=0.51.

Examples 26-27

Synthesis and purification of various BCP-11 and BCP-12 block copolymers using macroinitiators of Example 8 and Example 9. These polymers were prepared using the general procedure of Example 25, summarized in Table 5. Vf in Table 5 refers to the volume fraction of the PLA block.

TABLE 5

| Ex. | BCP Name | Macro initiator | Macro initiator (g, mmol) | Lactide, (g, mmol) | DCM (g) | M6TREN (mg), TU (mg) | Time (hours) | Mn (NMR) PS Block | Mn (NMR) PLA Block | Vf PLA | GPC Mn | GPC Mw | GPC PDI |
|---|---|---|---|---|---|---|---|---|---|---|---|---|---|
| 24 (comp) | DBP2 | EMD—PS—OH | 0.20, 0.016 | 0.254, 1.76 | 1.80 | 23,37 | 1.5 | 12500 | 14250 | 0.9 | 29500 | 31300 | 1.05 |
| 25 | BCP-10 | HPS-8 | 0.10, 0.0175 | 0.146, 1.01 | 1.300 | 20, 32 | 1 | 5700 | 6900 | 0.51 | 20200 | 22800 | 1.12 |
| 26 | BCP-11 | HPS-3 | 0.15, 0.022 | 0.33, 2.29 | 2.98 | 20, 32 | 1.5 | 6800 | 7700 | 0.49 | 20200 | 22150 | 109 |
| 27 | BCP-12 | HPS-4 | 0.15, 0.022 | 0.225, 1.57 | 2.03 | 26, 41 | 1.5 | 6800 | 9200 | 0.53 | 26600 | 28016 | 1.05 |

-continued

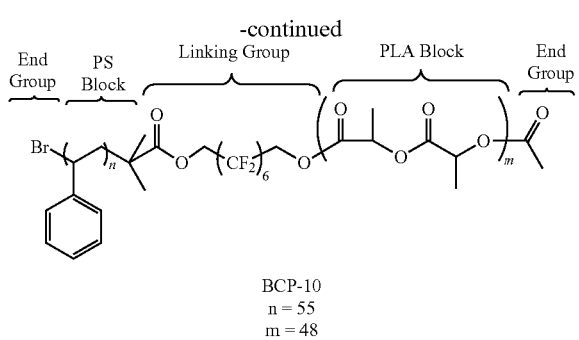

BCP-10
n = 55
m = 48

To an oven dried 4 ml glass vial equipped with a magnetic stir bar, hydroxyl-functional polystyrene initiator HPS-8 (0.10 g, 0.0175 mmol, Example 13), LAC (0.146 g, 1.01 mmol) of and DCM (1.30 g) were added. The reaction mixture was stirred until the macroinitiator and LAC were completely dissolved in DCM, upon which M6TREN (20 mg, 0.0875 mmol) and TU (32 mg, 0.0875 mm) were added. The reaction mixture was stirred at room temperature for one hour in a glove box. After one hour, the reaction was stopped by bringing the reaction vial out of the glove box and adding DCM (0.5 ml), acetyl chloride (0.1 g, 0.988 mmol), and TEA (0.1 g, 1.28 mmol). The reaction was further stirred for 30 minutes at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were Underlayer Preparations Thin film preparation of underlayer coated substrates UL-1 to UL-7 using various poly(styrene-r-methyl methacrylate) P(Sty-r-MMA)-OH) random copolymer brushes obtained from EMD Performance Materials Corporation.

The following general procedure was used to prepare a thin film underlayer on a silicon wafer. P(Sty-r-MMA)-OH, a hydroxy-terminated poly(styrene-r-methyl methacrylate) random copolymer brush material, was received from EMD Performance Materials Corporation in the form of a solution in PGMEA (solution code NLD-303). The solution was used as received. The polymer solution was spin coated at 2000 rpm on a silicon wafer. The coated wafer was baked at 250° C. for 2 minutes prior to a solvent rinse to form the underlayer. Table 6 summarizes the underlayer films UL-1 to UL-7 prepared with P(Sty-r-MMA)-OH random copolymer brush materials, where Sty=styrene and MMA=methyl methacrylate.

TABLE 6

| Example | UL Name | P(Sty-r-MMA)-OH Name | Sty:MMA mol % |
|---|---|---|---|
| 28 | UL-1 | NLD-303 | 0:100 |
| 29 | UL-2 | NLD-328J | 20:80 |
| 30 | UL-3 | NLD-320 | 30:70 |
| 31 | UL-4 | NLD-321 | 40:60 |
| 32 | UL-5 | NLD-322 | 47:53 |
| 33 | UL-6 | NLD-208D | 60:40 |
| 34 | UL-7 | NLD-307D | 72:28 |

Formulation of Block Copolymer Solutions

Examples 35-48

Preparation of coating formulations for self-assembly containing block copolymer Examples 14-27 in PGMEA.

The following general procedure is representative. The block copolymer (0.01 g) for self-assembly was dissolved in PGMEA (0.823 g) to form a 1.2 wt % solution of the block copolymer. The solution was filtered through 0.2 micrometer PTFE filter.

Table 7 summarizes the block copolymer coating formulations. The linking groups of Table 7 join the PS block to the polycarbonate or the polylactide block as shown in the structure of Example 15 above. In Table 7, and other tables that follow, Y' has the following structure:

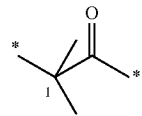

The carbonyl carbon of Y' is linked to the oxygen of the linking group, and carbon 1 of Y' is linked to the polystyrene block of the block copolymer.

TABLE 7

| Formulation Example | BCP Name | BCP Ex. | BCP A Block | BCP B Block | Linking Group | A Block-B Block Mn (NMR) (k = ×1000) |
|---|---|---|---|---|---|---|
| 35 (comp) | DBP1 | 13 | PS | PMTC—Me | *—CH$_2$CH$_2$—O—* | 12.5k-14.6k |
| 36 | BCP-1 | 14 | PS | PMTC—Me | Y'—OCH$_2$(CF$_2$)$_3$CH$_2$O—* | 7.0k-8.3k |
| 37 | BCP-2 | 15 | PS | PMTC—Me | Y'—OCH$_2$(CF$_2$)$_6$CH$_2$O—* | 11.3k-13.2k |
| 38 | BCP-3 | 16 | PS | PMTC—Me | Y'—OCH$_2$(CF$_2$)$_{10}$CH$_2$O—* | 6.8k-7.2k |
| 39 (comp) | BCP-4 | 18 | PS | PMTC—Me | Y'—OCH$_2$(CH$_2$)$_6$CH$_2$O—* | 9.6k-12.6k |
| 40 | BCP-5 | 19 | PS | PMTC—Me | Y'—OCH$_2$(CF$_2$)$_6$CH$_2$O—* | 14.2k-16.4k |
| 41 | BCP-6 | 20 | PS | PMTC—Et | Y'—OCH$_2$(CF$_2$)$_6$CH$_2$O—* | 11.3k-13k |
| 42 | BCP-7 | 21 | PS | PMTC—Et | Y'—OCH$_2$(CF$_2$)$_{10}$CH$_2$O—* | 6.8k-7k |
| 43 | BCP-8 | 22 | PS | PMTC—Me | Y'—OCH$_2$(CF$_2$)$_6$CH$_2$O—* | 14.2k.9.0k |
| 44 | BCP-9 | 23 | PTMSS | PMTC—Me | Y'—OCH$_2$(CF$_2$)$_{10}$CH$_2$O—* | 7.6k-7.8k |
| 45 (comp) | DBP2 | 24 | PS | PLA | *—CH$_2$CH$_2$—O—* | 5.7k-6.9k |
| 46 | BCP-10 | 25 | PS | PLA | Y'—OCH$_2$(CF$_2$)$_{10}$CH$_2$O—* | 6.8k-7.7k |
| 47 | BCP-11 | 26 | PS | PLA | Y'—OCH$_2$(CF$_2$)$_6$CH$_2$O—* | 6.8k-9.2k |
| 48 | BCP-12 | 27 | PS | PLA | Y'—OCH$_2$CF$_2$(OCF$_2$CF$_2$)$_2$—OCF$_2$CH$_2$O—* | 6.8k-9.2k |

Thin Film Self-Assembly

Examples 49-114

The following general procedure was used to prepare thin films of block copolymers on UL-1 to UL-7 substrates. A selected coating solution prepared in Examples 35-48 was spin coated on a selected underlayer coated substrate of Examples 28-34 at a spin rate of 2000 rpm. The coated wafer was then baked (annealed) at a temperature of 170° C. or 200° C. for 5 minutes and immediately cooled to room temperature. The block copolymer films were characterized by atomic force microscopy (AFM) using a Digital Instruments 3100 AFM with a 1 N/m spring constant silicon nitride cantilever operated in a tapping mode. Scan size and speed were set at 2 micrometer×2 micrometer area and 1 Hz respectively. Table 8 summarizes the coating and annealing conditions.

TABLE 8

| | | | BCP Thin Film layer for Self-Assembly | | | Coating/Annealing Conditions | | | |
| | | | | | | | | | |
| Film Example | Film Name | Underlayer Name | Formulation Example | BCP Name | Linking Group | Spin Speed RPM | Spin time Sec | Anneal Temp ° C. | Anneal Time (min) |
|---|---|---|---|---|---|---|---|---|---|
| 49 (comp) | F-1 | UL-1 | 35 | DBP1 | *—CH$_2$CH$_2$—O—* | 2000 | 30 | 170 | 5 |
| 50 (comp) | F-2 | UL-2 | 35 | DBP1 | *—CH$_2$CH$_2$—O—* | 2000 | 30 | 170 | 5 |

TABLE 8-continued

| | | | | BCP Thin Film layer for Self-Assembly | | Coating/Annealing Conditions | | | |
| --- | --- | --- | --- | --- | --- | --- | --- | --- | --- |
| Film Example | Film Name | Underlayer Name | Formulation Example | BCP Name | Linking Group | Spin Speed RPM | Spin time Sec | Anneal Temp ° C. | Anneal Time (min) |
| 51 (comp) | F-3 | UL-3 | 35 | DBP1 | *—CH$_2$CH$_2$—O—* | 2000 | 30 | 170 | 5 |
| 52 | F-4 | UL-1 | 36 | BCP-1 | Y'—OCH$_2$(CF$_2$)$_3$CH$_2$O—* | 2000 | 30 | 170 | 5 |
| 53 | F-5 | UL-2 | 36 | BCP-1 | Y'—OCH$_2$(CF$_2$)$_3$CH$_2$O—* | 2000 | 30 | 170 | 5 |
| 54 | F-6 | UL-3 | 36 | BCP-1 | Y'—OCH$_2$(CF$_2$)$_3$CH$_2$O—* | 2000 | 30 | 170 | 5 |
| 55 | F-7 | UL-1 | 37 | BCP-2 | Y'—OCH$_2$(CF$_2$)$_6$CH$_2$O—* | 2000 | 30 | 200 | 5 |
| 56 | F-8 | UL-2 | 37 | BCP-2 | Y'—OCH$_2$(CF$_2$)$_6$CH$_2$O—* | 2000 | 30 | 200 | 5 |
| 57 | F-9 | UL-3 | 37 | BCP-2 | Y'—OCH$_2$(CF$_2$)$_6$CH$_2$O—* | 2000 | 30 | 200 | 5 |
| 58 | F-10 | UL-4 | 37 | BCP-2 | Y'—OCH$_2$(CF$_2$)$_6$CH$_2$O—* | 2000 | 30 | 200 | 5 |
| 59 | F-11 | UL-5 | 37 | BCP-2 | Y'—OCH$_2$(CF$_2$)$_6$CH$_2$O—* | 2000 | 30 | 200 | 5 |
| 60 | F-12 | UL-6 | 37 | BCP-2 | Y'—OCH$_2$(CF$_2$)$_6$CH$_2$O—* | 2000 | 30 | 200 | 5 |
| 61 | F-13 | UL-7 | 37 | BCP-2 | Y'—OCH$_2$(CF$_2$)$_6$CH$_2$O—* | 2000 | 30 | 200 | 5 |
| 62 | F-14 | UL-1 | 38 | BCP-3 | Y'—OCH$_2$(CF$_2$)$_{10}$CH$_2$O—* | 2000 | 30 | 170 | 5 |
| 63 | F-15 | UL-2 | 38 | BCP-3 | Y'—OCH$_2$(CF$_2$)$_{10}$CH$_2$O—* | 2000 | 30 | 170 | 5 |
| 64 | F-16 | UL-3 | 38 | BCP-3 | Y'—OCH$_2$(CF$_2$)$_{10}$CH$_2$O—* | 2000 | 30 | 170 | 5 |
| 65 | F-17 | UL-4 | 38 | BCP-3 | Y'—OCH$_2$(CF$_2$)$_{10}$CH$_2$O—* | 2000 | 30 | 170 | 5 |
| 66 | F-18 | UL-5 | 38 | BCP-3 | Y'—OCH$_2$(CF$_2$)$_{10}$CH$_2$O—* | 2000 | 30 | 170 | 5 |
| 67 | F-19 | UL-6 | 38 | BCP-3 | Y'—OCH$_2$(CF$_2$)$_{10}$CH$_2$O—* | 2000 | 30 | 170 | 5 |
| 68 | F-20 | UL-7 | 38 | BCP-3 | Y'—OCH$_2$(CF$_2$)$_{10}$CH$_2$O—* | 2000 | 30 | 170 | 5 |
| 69 (comp) | F-21 | UL-1 | 39 | BCP-4 | Y'—OCH$_2$(CH$_2$)$_6$CH$_2$O—* | 2000 | 30 | 170 | 5 |
| 70 (comp) | F-22 | UL-2 | 39 | BCP-4 | Y'—OCH$_2$(CH$_2$)$_6$CH$_2$O—* | 2000 | 30 | 170 | 5 |
| 71 (comp) | F-23 | UL-3 | 39 | BCP-4 | Y'—OCH$_2$(CH$_2$)$_6$CH$_2$O—* | 2000 | 30 | 170 | 5 |
| 72 (comp) | F-24 | UL-4 | 39 | BCP-4 | Y'—OCH$_2$(CH$_2$)$_6$CH$_2$O—* | 2000 | 30 | 170 | 5 |
| 73 (comp) | F-25 | UL-6 | 39 | BCP-4 | Y'—OCH$_2$(CH$_2$)$_6$CH$_2$O—* | 2000 | 30 | 170 | 5 |
| 74 (comp) | F-26 | UL-7 | 39 | BCP-4 | Y'—OCH$_2$(CH$_2$)$_6$CH$_2$O—* | 2000 | 30 | 170 | 5 |
| 75 | F-27 | UL-1 | 41 | BCP-6 | Y'—OCH$_2$(CF$_2$)$_6$CH$_2$O—* | 2000 | 30 | 170 | 5 |
| 76 | F-28 | UL-2 | 41 | BCP-6 | Y'—OCH$_2$(CF$_2$)$_6$CH$_2$O—* | 2000 | 30 | 170 | 5 |
| 77 | F-29 | UL-3 | 41 | BCP-6 | Y'—OCH$_2$(CF$_2$)$_6$CH$_2$O—* | 2000 | 30 | 170 | 5 |
| 78 | F-30 | UL-4 | 41 | BCP-6 | Y'—OCH$_2$(CF$_2$)$_6$CH$_2$O—* | 2000 | 30 | 170 | 5 |
| 79 | F-31 | UL-5 | 41 | BCP-6 | Y'—OCH$_2$(CF$_2$)$_6$CH$_2$O—* | 2000 | 30 | 170 | 5 |
| 80 | F-32 | UL-6 | 41 | BCP-6 | Y'—OCH$_2$(CF$_2$)$_6$CH$_2$O—* | 2000 | 30 | 170 | 5 |
| 81 | F-33 | UL-7 | 41 | BCP-6 | Y'—OCH$_2$(CF$_2$)$_6$CH$_2$O—* | 2000 | 30 | 170 | 5 |
| 82 | F-34 | UL-1 | 42 | BCP-7 | Y'—OCH$_2$(CF$_2$)$_{10}$CH$_2$O—* | 2000 | 30 | 170 | 5 |
| 83 | F-35 | UL-3 | 42 | BCP-7 | Y'—OCH$_2$(CF$_2$)$_{10}$CH$_2$O—* | 2000 | 30 | 170 | 5 |
| 84 | F-36 | UL-4 | 42 | BCP-7 | Y'—OCH$_2$(CF$_2$)$_{10}$CH$_2$O—* | 2000 | 30 | 170 | 5 |
| 85 | F-37 | UL-5 | 42 | BCP-7 | Y'—OCH$_2$(CF$_2$)$_{10}$CH$_2$O—* | 2000 | 30 | 170 | 5 |
| 86 | F-38 | UL-1 | 40 | BCP-5 | Y'—OCH$_2$(CF$_2$)$_6$CH$_2$O—* | 2000 | 30 | 200 | 5 |
| 87 | F-39 | UL-2 | 40 | BCP-5 | Y'—OCH$_2$(CF$_2$)$_6$CH$_2$O—* | 2000 | 30 | 200 | 5 |
| 88 | F-40 | UL-6 | 43 | BCP-8 | Y'—OCH$_2$(CF$_2$)$_6$CH$_2$O—* | 2000 | 30 | | 5 |
| 89 | F-41 | UL-7 | 43 | BCP-8 | Y'—OCH$_2$(CF$_2$)$_6$CH$_2$O—* | 2000 | 30 | | 5 |
| 90 | F-42 | UL-1 | 46 | BCP-10 | Y'—OCH$_2$(CF$_2$)$_6$CH$_2$O—* | 2000 | 30 | 170 | 5 |
| 91 | F-43 | UL-2 | 46 | BCP-10 | Y'—OCH$_2$(CF$_2$)$_6$CH$_2$O—* | 2000 | 30 | 170 | 5 |
| 92 | F-44 | UL-3 | 46 | BCP-10 | Y'—OCH$_2$(CF$_2$)$_6$CH$_2$O—* | 2000 | 30 | 170 | 5 |
| 93 | F-45 | UL-4 | 46 | BCP-10 | Y'—OCH$_2$(CF$_2$)$_6$CH$_2$O—* | 2000 | 30 | 170 | 5 |
| 94 | F-46 | UL-5 | 46 | BCP-10 | Y'—OCH$_2$(CF$_2$)$_6$CH$_2$O—* | 2000 | 30 | 170 | 5 |
| 95 | F-47 | UL-6 | 46 | BCP-10 | Y'—OCH$_2$(CF$_2$)$_6$CH$_2$O—* | 2000 | 30 | 170 | 5 |
| 96 | F-48 | UL-7 | 46 | BCP-10 | Y'—OCH$_2$(CF$_2$)$_6$CH$_2$O—* | 2000 | 30 | 170 | 5 |
| 97 | F-49 | UL-1 | 47 | BCP-11 | Y'—OCH$_2$(CF$_2$)$_{10}$CH$_2$O—* | 2000 | 30 | 170 | 5 |
| 98 | F-50 | UL-2 | 47 | BCP-11 | Y'—OCH$_2$(CF$_2$)$_{10}$CH$_2$O—* | 2000 | 30 | 170 | 5 |
| 99 | F-51 | UL-3 | 47 | BCP-11 | Y'—OCH$_2$(CF$_2$)$_{10}$CH$_2$O—* | 2000 | 30 | 170 | 5 |
| 100 | F-59 | UL-4 | 47 | BCP-11 | Y'—OCH$_2$(CF$_2$)$_{10}$CH$_2$O—* | 2000 | 30 | 170 | 5 |
| 101 | F-60 | UL-5 | 47 | BCP-11 | Y'—OCH$_2$(CF$_2$)$_{10}$CH$_2$O—* | 2000 | 30 | 170 | 5 |
| 102 | F-61 | UL-6 | 47 | BCP-11 | Y'—OCH$_2$(CF$_2$)$_{10}$CH$_2$O—* | 2000 | 30 | 170 | 5 |

TABLE 8-continued

| Film Example | Film Name | Under-layer Name | Formulation Example | BCP Name | Linking Group | Spin Speed RPM | Spin time Sec | Anneal Temp °C. | Anneal Time (min) |
|---|---|---|---|---|---|---|---|---|---|
| 103 | F-62 | UL-7 | 47 | BCP-11 | Y'—OCH$_2$(CF$_2$)$_{10}$CH$_2$O—* | 2000 | 30 | 170 | 5 |
| 104 | F-63 | UL-1 | 48 | BCP-12 | Y'—OCH$_2$CF$_2$(OCF$_2$CF$_2$)$_2$—OCF$_2$CH$_2$O—* | 2000 | 30 | 170 | 5 |
| 105 | F-64 | UL-2 | 48 | BCP-12 | Y'—OCH$_2$CF$_2$(OCF$_2$CF$_2$)$_2$—OCF$_2$CH$_2$O—* | 2000 | 30 | 170 | 5 |
| 106 | F-65 | UL-3 | 48 | BCP-12 | Y'—OCH$_2$CF$_2$(OCF$_2$CF$_2$)$_2$—OCF$_2$CH$_2$O—* | 2000 | 30 | 170 | 5 |
| 107 | F-66 | UL-4 | 48 | BCP-12 | Y'—OCH$_2$CF$_2$(OCF$_2$CF$_2$)$_2$—OCF$_2$CH$_2$O—* | 2000 | 30 | 170 | 5 |
| 108 | F-67 | UL-5 | 48 | BCP-12 | Y'—OCH$_2$CF$_2$(OCF$_2$CF$_2$)$_2$—OCF$_2$CH$_2$O—* | 2000 | 30 | 170 | 5 |
| 109 | F-68 | UL-6 | 48 | BCP-12 | Y'—OCH$_2$CF$_2$(OCF$_2$CF$_2$)$_2$—OCF$_2$CH$_2$O—* | 2000 | 30 | 170 | 5 |
| 110 | F-69 | UL-7 | 48 | BCP-12 | Y'—OCH$_2$CF$_2$(OCF$_2$CF$_2$)$_2$—OCF$_2$CH$_2$O—* | 2000 | 30 | 170 | 5 |
| 111 (comp) | F-70 | UL-1 | 45 | DBP2 | *—CH$_2$CH$_2$—O—* | 2000 | 30 | 170 | 5 |
| 112 (comp) | F-71 | UL-2 | 45 | DBP2 | *—CH$_2$CH$_2$—O—* | 2000 | 30 | 170 | 5 |
| 113 (comp) | F-72 | UL-4 | 45 | DBP2 | *—CH$_2$CH$_2$—O—* | 2000 | 30 | 170 | 5 |
| 114 (comp) | F-73 | UL-7 | 45 | DBP2 | *—CH$_2$CH$_2$-O—* | 2000 | 30 | 170 | 5 |

Table 9 summarizes the properties of the self-assembled films prepared on various underlayers and the morphologies obtained by self-assembly. "I/H" means islands/holes (not desirable). "∥ lamellae" means parallel lamellae (not desirable). "Mixed lamellae" means about 20% to less than 70% of the regions of the film contained perpendicular lamellae (not desirable). "∥ cylinders" means parallel cylinders (not desirable). "⊥ lamellae" means 95% to 100% of the regions of the film contained perpendicular lamellae (most desirable). "⊥ cylinders" means 95% to 100% of the regions of the film contained perpendicular cylinders (most desirable). Table 9 also includes AFM height images (FIGS. 8-57) corresponding to Examples 49-58, 60-83, 86-90, 95-97, 102-104, and 110-114, respectively. "UL non-preferential?" means: "is the underlayer non-preferential to the domains of an otherwise identical self-assembled BCP in which all fluorines of L' are replaced by hydrogen?". "BCP Pitch" refers to the characteristic pitch (Lo) of the block copolymer.

TABLE 9

| Film Example | Film Name | Under-layer Name | Formulation Example | BCP Name | Linking Group | Orientation | UL non-preferential? Yes/No | BCP Pitch | FIG. |
|---|---|---|---|---|---|---|---|---|---|
| 49 (comp) | F-1 | UL-1 | 35 | DBP1 | *—CH$_2$CH$_2$—O—* | ∥ lamellae | No | 19.5 | 8 |
| 50 (comp) | F-2 | UL-2 | 35 | DBP1 | *—CH$_2$CH$_2$—O—* | ∥ lamellae | Yes | 19.5 | 9 |
| 51 (comp) | F-3 | UL-3 | 35 | DBP1 | *—CH$_2$CH$_2$—O—* | ∥ lamellae | No | 19.5 | 10 |
| 52 | F-4 | UL-1 | 36 | BCP-1 | Y'—OCH$_2$(CF$_2$)$_3$CH$_2$O—* | ⊥ lamellae | No | 14.2 | 11 |
| 53 | F-5 | UL-2 | 36 | BCP-1 | Y'—OCH$_2$(CF$_2$)$_3$CH$_2$O—* | ⊥ lamellae | Yes | 14.2 | 12 |
| 54 | F-6 | UL-3 | 36 | BCP-1 | Y'—OCH$_2$(CF$_2$)$_3$CH$_2$O—* | ∥ lamellae | No | 14.2 | 13 |
| 55 | F-7 | UL-1 | 37 | BCP-2 | Y'—OCH$_2$(CF$_2$)$_6$CH$_2$O—* | ⊥ lamellae | No | 19.6 | 14 |
| 56 | F-8 | UL-2 | 37 | BCP-2 | Y'—OCH$_2$(CF$_2$)$_6$CH$_2$O—* | ⊥ lamellae | Yes | 19.6 | 15 |
| 57 | F-9 | UL-3 | 37 | BCP-2 | Y'—OCH$_2$(CF$_2$)$_6$CH$_2$O—* | ⊥ lamellae | No | 19.6 | 16 |
| 58 | F-10 | UL-4 | 37 | BCP-2 | Y'—OCH$_2$(CF$_2$)$_6$CH$_2$O—* | ⊥ lamellae | No | 19.6 | 17 |
| 59 | F-11 | UL-5 | 37 | BCP-2 | Y'—OCH$_2$(CF$_2$)$_6$CH$_2$O—* | ⊥ lamellae | No | 19.6 | |
| 60 | F-12 | UL-6 | 37 | BCP-2 | Y'—OCH$_2$(CF$_2$)$_6$CH$_2$O—* | ⊥ lamellae | No | 19.6 | 18 |
| 61 | F-13 | UL-7 | 37 | BCP-2 | Y'—OCH$_2$(CF$_2$)$_6$CH$_2$O—* | ∥ lamellae | No | — | 19 |
| 62 | F-14 | UL-1 | 38 | BCP-3 | Y'—OCH$_2$(CF$_2$)$_{10}$CH$_2$O—* | ⊥ lamellae | No | 15.4 | 20 |
| 63 | F-15 | UL-2 | 38 | BCP-3 | Y'—OCH$_2$(CF$_2$)$_{10}$CH$_2$O—* | ⊥ lamellae | Yes | 15.4 | 21 |
| 64 | F-16 | UL-3 | 38 | BCP-3 | Y'—OCH$_2$(CF$_2$)$_{10}$CH$_2$O—* | ⊥ lamellae | No | 15.4 | 22 |
| 65 | F-17 | UL-4 | 38 | BCP-3 | Y'—OCH$_2$(CF$_2$)$_{10}$CH$_2$O—* | ⊥ lamellae | No | 15.4 | 23 |
| 66 | F-18 | UL-5 | 38 | BCP-3 | Y'—OCH$_2$(CF$_2$)$_{10}$CH$_2$O—* | ⊥ lamellae | No | 15.4 | 24 |
| 67 | F-19 | UL-6 | 38 | BCP-3 | Y'—OCH$_2$(CF$_2$)$_{10}$CH$_2$O—* | ⊥ lamellae | No | 15.4 | 25 |

TABLE 9-continued

| Film Example | Film Name | Underlayer Name | Formulation Example | BCP Name | Linking Group | Orientation | UL non-preferential? Yes/No | BCP Pitch | FIG. |
|---|---|---|---|---|---|---|---|---|---|
| 68 | F-20 | UL-7 | 38 | BCP-3 | Y'—OCH$_2$(CF$_2$)$_{10}$CH$_2$O—* | ⊥ lamellae | No | 15.4 | 26 |
| 69 (comp) | F-21 | UL-1 | 39 | BCP-4 | Y'—OCH$_2$(CH$_2$)$_6$CH$_2$O—* | ‖ lamellae | No | 16 | 27 |
| 70 (comp) | F-22 | UL-2 | 39 | BCP-4 | Y'—OCH$_2$(CH$_2$)$_6$CH$_2$O—* | ‖ lamellae | Yes | 16 | 28 |
| 71 (comp) | F-23 | UL-3 | 39 | BCP-4 | Y'—OCH$_2$(CH$_2$)$_6$CH$_2$O—* | ‖ lamellae | No | 16 | 29 |
| 72 (comp) | F-24 | UL-4 | 39 | BCP-4 | Y'—OCH$_2$(CH$_2$)$_6$CH$_2$O—* | ‖ lamellae | No | 16 | 30 |
| 73 (comp) | F-25 | UL-6 | 39 | BCP-4 | Y'—OCH$_2$(CH$_2$)$_6$CH$_2$O—* | ‖ lamellae | No | 16 | 31 |
| 74 (comp) | F-26 | UL-7 | 39 | BCP-4 | Y'—OCH$_2$(CH$_2$)$_6$CH$_2$O—* | ‖ lamellae | No | 16 | 32 |
| 75 | F-27 | UL-1 | 41 | BCP-6 | Y'—OCH$_2$(CF$_2$)$_6$CH$_2$O—* | ‖ lamellae | No | 16.8 | 33 |
| 76 | F-28 | UL-2 | 41 | BCP-6 | Y'—OCH$_2$(CF$_2$)$_6$CH$_2$O—* | ‖ lamellae | No | 16.8 | 34 |
| 77 | F-29 | UL-3 | 41 | BCP-6 | Y'—OCH$_2$(CF$_2$)$_6$CH$_2$O—* | ‖ lamellae | Yes | 16.8 | 35 |
| 78 | F-30 | UL-4 | 41 | BCP-6 | Y'—OCH$_2$(CF$_2$)$_6$CH$_2$O—* | ‖ lamellae | No | 16.8 | 36 |
| 79 | F-31 | UL-5 | 41 | BCP-6 | Y'—OCH$_2$(CF$_2$)$_6$CH$_2$O—* | ‖ lamellae | No | 16.8 | 37 |
| 80 | F-32 | UL-6 | 41 | BCP-6 | Y'—OCH$_2$(CF$_2$)$_6$CH$_2$O—* | ‖ lamellae | No | 16.8 | 38 |
| 81 | F-33 | UL-7 | 41 | BCP-6 | Y'—OCH$_2$(CF$_2$)$_6$CH$_2$O—* | ‖ lamellae | No | 16.8 | 39 |
| 82 | F-34 | UL-1 | 42 | BCP-7 | Y'—OCH$_2$(CF$_2$)$_{10}$CH$_2$O—* | ⊥ lamellae | No | 15.6 | 40 |
| 83 | F-35 | UL-3 | 42 | BCP-7 | Y'—OCH$_2$(CF$_2$)$_{10}$CH$_2$O—* | ⊥ lamellae | Yes | 15.6 | 41 |
| 84 | F-36 | UL-4 | 42 | BCP-7 | Y'—OCH$_2$(CF$_2$)$_{10}$CH$_2$O—* | ⊥ lamellae | No | 15.6 | |
| 85 | F-37 | UL-5 | 42 | BCP-7 | Y'—OCH$_2$(CF$_2$)$_{10}$CH$_2$O—* | ⊥ lamellae | No | 15.6 | |
| 86 | F-38 | UL-1 | 40 | BCP-5 | Y'—OCH$_2$(CF$_2$)$_6$CH$_2$O—* | ⊥ lamellae | No | 15.6 | 42 |
| 87 | F-39 | UL-2 | 40 | BCP-5 | Y'—OCH$_2$(CF$_2$)$_6$CH$_2$O—* | ⊥ lamellae | Yes | 15.6 | 43 |
| 88 | F-40 | UL-6 | 43 | BCP-8 | Y'—OCH$_2$(CF$_2$)$_6$CH$_2$O—* | ⊥ cylinder | | | 44 |
| 89 | F-41 | UL-7 | 43 | BCP-8 | Y'—OCH$_2$(CF$_2$)$_6$CH$_2$O—* | ⊥ cylinder | | | 45 |
| 90 | F-42 | UL-1 | 46 | BCP-10 | Y'—OCH$_2$(CF$_2$)$_6$CH$_2$O—* | ⊥ lamellae | No | 14.4 | 46 |
| 91 | F-43 | UL-2 | 46 | BCP-10 | Y'—OCH$_2$(CF$_2$)$_6$CH$_2$O—* | ⊥ lamellae | No | 15.0 | |
| 92 | F-44 | UL-3 | 46 | BCP-10 | Y'—OCH$_2$(CF$_2$)$_6$CH$_2$O—* | ⊥ lamellae | No | 14.1 | |
| 93 | F-45 | UL-4 | 46 | BCP-10 | Y'—OCH$_2$(CF$_2$)$_6$CH$_2$O—* | ⊥ lamellae | No | 14.0 | |
| 94 | F-46 | UL-5 | 46 | BCP-10 | Y'—OCH$_2$(CF$_2$)$_6$CH$_2$O—* | ⊥ lamellae | No | 14.4 | |
| 95 | F-47 | UL-6 | 46 | BCP-10 | Y'—OCH$_2$(CF$_2$)$_6$CH$_2$O— | mixed-lamellae | No | 15.0 | 47 |
| 96 | F-48 | UL-7 | 46 | BCP-10 | Y'—OCH$_2$(CF$_2$)$_6$CH$_2$O— | mixed-lamellae | No | 15.4 | 48 |
| 97 | F-49 | UL-1 | 47 | BCP-11 | Y'—OCH$_2$(CF$_2$)$_{10}$CH$_2$O—* | ⊥ lamellae | No | 15.4 | 49 |
| 98 | F-50 | UL-2 | 47 | BCP-11 | Y'—OCH$_2$(CF$_2$)$_{10}$CH$_2$O—* | ⊥ lamellae | No | 14.6 | |
| 99 | F-51 | UL-3 | 47 | BCP-11 | Y'—OCH$_2$(CF$_2$)$_{10}$CH$_2$O—* | ⊥ lamellae | No | 14.8 | |
| 100 | F-59 | UL-4 | 47 | BCP-11 | Y'—OCH$_2$(CF$_2$)$_{10}$CH$_2$O—* | ⊥ lamellae | No | 15.0 | |
| 101 | F-60 | UL-5 | 47 | BCP-11 | Y'—OCH$_2$(CF$_2$)$_{10}$CH$_2$O—* | ⊥ lamellae | No | 14.8 | |
| 102 | F-61 | UL-6 | 47 | BCP-11 | Y'—OCH$_2$(CF$_2$)$_{10}$CH$_2$O—* | ⊥ lamellae | No | 15.4 | 50 |
| 103 | F-62 | UL-7 | 47 | BCP-11 | Y'—OCH$_2$(CF$_2$)$_{10}$CH$_2$O—* | ⊥ lamellae | No | 15.0 | 51 |
| 104 | F-63 | UL-1 | 48 | BCP-12 | Y'—OCH$_2$CF$_2$(OCF$_2$CF$_2$)$_2$—OCF$_2$CH$_2$O—* | ⊥ lamellae | No | 16.4 | 52 |
| 105 | F-64 | UL-2 | 48 | BCP-12 | Y'—OCH$_2$CF$_2$(OCF$_2$CF$_2$)$_2$—OCF$_2$CH$_2$O—* | ⊥ lamellae | No | 16.4 | |
| 106 | F-65 | UL-3 | 48 | BCP-12 | Y'—OCH$_2$CF$_2$(OCF$_2$CF$_2$)$_2$—OCF$_2$CH$_2$O—* | ⊥ lamellae | No | 16.4 | |
| 107 | F-66 | UL-4 | 48 | BCP-12 | Y'—OCH$_2$CF$_2$(OCF$_2$CF$_2$)$_2$—OCF$_2$CH$_2$O—* | ⊥ lamellae | No | 16.4 | |
| 108 | F-67 | UL-5 | 48 | BCP-12 | Y'—OCH$_2$CF$_2$(OCF$_2$CF$_2$)$_2$—OCF$_2$CH$_2$O—* | ⊥ lamellae | No | 16.4 | |
| 109 | F-68 | UL-6 | 48 | BCP-12 | Y'—OCH$_2$CF$_2$(OCF$_2$CF$_2$)$_2$—OCF$_2$CH$_2$O—* | ⊥ lamellae | No | 16.4 | |
| 110 | F-69 | UL-7 | 48 | BCP-12 | Y'—OCH$_2$CF$_2$(OCF$_2$CF$_2$)$_2$—OCF$_2$CH$_2$O—* | ⊥ lamellae | No | 16.4 | 53 |
| 111 | F-70 | UL-1 | 45 | DBP2 | *—CH$_2$CH$_2$—O—* | ‖ lamellae | No | 20 | 54 |
| 112 | F-71 | UL-2 | 45 | DBP2 | *—CH$_2$CH$_2$—O—* | ‖ lamellae | No | 20 | 55 |
| 113 | F-72 | UL-4 | 45 | DBP2 | *—CH$_2$CH$_2$—O—* | ‖ lamellae | No | 20 | 56 |
| 114 | F-73 | UL-7 | 45 | DBP2 | *—CH$_2$CH$_2$—O—* | ‖ lamellae | No | 20 | 57 |

Example 115

Pattern transfer of a layer comprising BCP-2 (Example 16) into a trilayer substrate. AZEMBLY NLD-303, a solution of a PMMA-brush polymer for forming an underlayer, was spin coated at 2000 RPM on a tri-layer substrate. The tri-layer substrate consisted of a silicon wafer substrate, a 30 nm amorphous carbon layer disposed on the silicon wafer, and a 10 nm silicon nitride layer disposed on the carbon layer. The underlayer coated substrate was baked at 250° C. for 2 minutes prior to a rinse with propylene glycol monomethyl ether acetate (PGMEA). The block copolymer BCP-2 (0.01 g) was dissolved in PGMEA (0.823 g) to form a 1.2 wt % solution of the block copolymer based on total weight of the solution. The solution was filtered through 0.2 micrometer polytetrafluoroethylene (PTFE) filter. The 1.2 wt % solution of BCP-2 was spin-coated on the poly(methyl methacrylate) (PMMA) brush grafted trilayer substrate and the sample of was annealed at 170° C. for 5 minutes followed by immediate cooling of the coated substrate at room temperature. The annealed BCP-2 film formed perpendicularly oriented lamellae.

Figure 59:
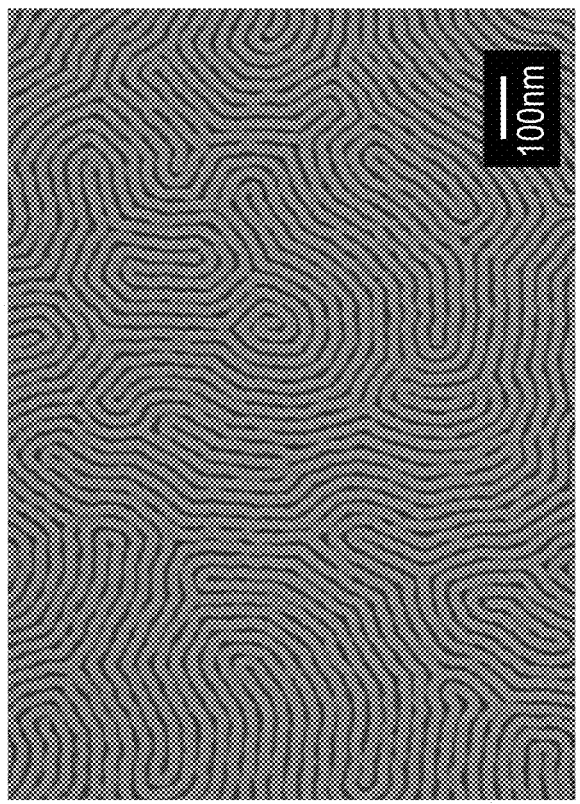
FIG. 59 is an SEM of the relief pattern formed after transferring the etched domain pattern of Example 114 to the substrate layers.
Figure 58:
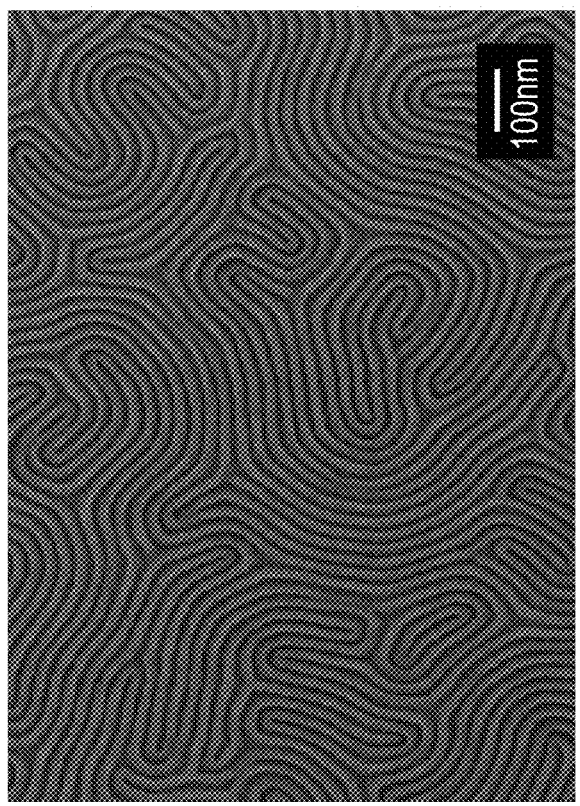
FIG. 58 is a scanning electron micrograph (SEM) of the etched domain pattern of Example 114 after selective removal of the polycarbonate domain.

Reactive ion etching of the self-assembled thin film of block copolymer BCP-2 was performed as follows. First, the polycarbonate domain of the BCP-2 film and the PMMA brush layer beneath the domain was etched away in a Lam Research 4520 XLe dielectric etch tool for 7 seconds under the following conditions: pressure=300 mT, oxygen flow rate=136 sccm, lower electrode power=50 W, upper electrode power=0 W, and the gap between the electrodes was 2.25 cm. The polystyrene (PS) domain pattern that remained after the previous etch (FIG. 58, Scanning electron micrograph image (SEM)), was then used as a mask to etch the silicon nitride thin film of the trilayer substrate. The silicon nitride etch was performed on a Plasma Therm Versaline ICP etcher for 13 seconds at a pressure of 4 mT, with $CF_4$ and $CHF_3$ flow rates of 20 sccm (standard cubic centimeters per minute) and 15 sccm respectively, at a bias power of 50 W with a coil power of 100 W. Finally, the amorphous carbon layer of the trilayer substrate was etched for 30 seconds with a nitrogen oxygen plasma in the Plasma Therm Versaline tool (FIG. 59, SEM). To achieve an anisotropic amorphous carbon etch the following parameters were used: Pressure=4 mT, $O_2$ flow rate=2 sccm, $N_2$ flow rate=40 sccm, bias power=100 W, and coil power=200 W.

Example 116

Figure 60A:
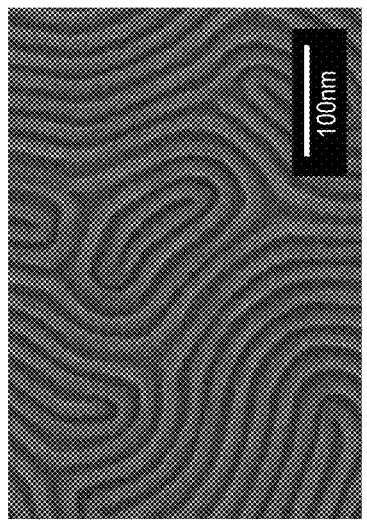
FIGS. 60A-F illustrate the tone inversion process of Example 116 using a self-assembled thin film of block copolymer BCP-1 prepared as in Example 115 on a multi-layered substrate.
Figure 60B:
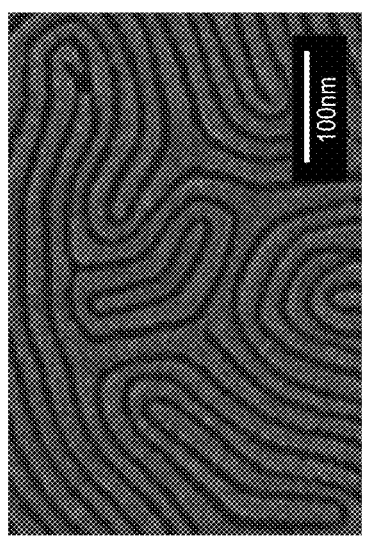
Figure 60C:
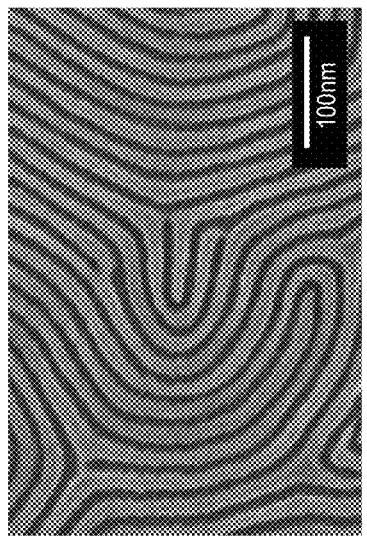
Figure 60F:
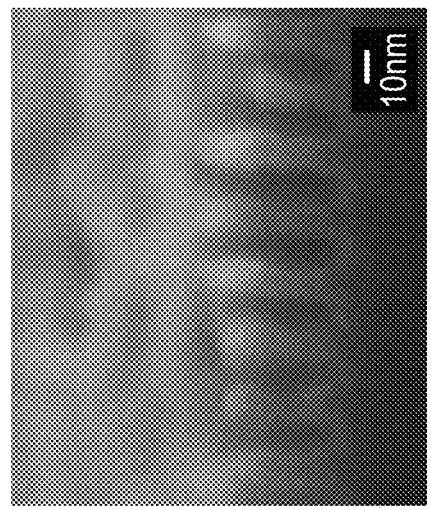
Figure 60E:
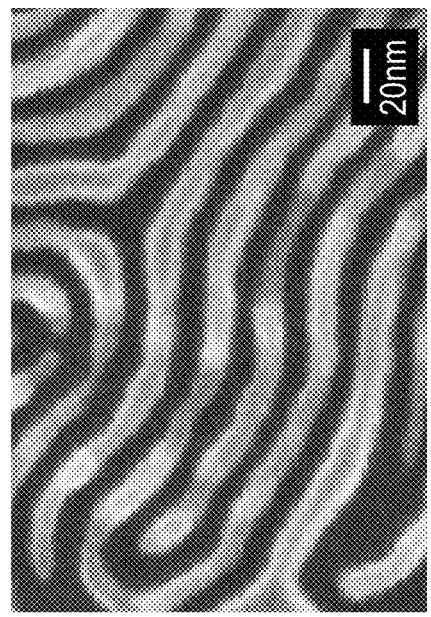
Figure 60D:
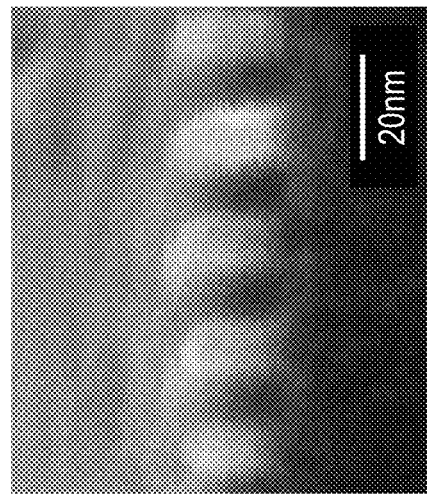

Pattern transfer of a thin film of block copolymer BCP-2 by tone inversion using atomic layer deposition. The self-assembled thin film of BCP-2 was prepared on the tri-layer substrate as described in Example 115. The polycarbonate domain of the BCP-2 film and the brush layer beneath the domain were etched away using the same oxygen plasma process described in Example 115 (FIG. 60A). Next, the substrate, with the remaining PS pattern, was placed into an Ultratech Fiji F200 ALD (atomic layer deposition) tool to deposit a conformal thin film of $TiO_2$ on the PS pattern. The $TiO_2$ film was deposited below the glass transition temperature of the PS domain (100° C.) to prevent the PS pattern from reflowing or distorting during the deposition process. The following ALD conditions were used: chamber temperature=98° C., chuck temperature=98° C., Ti precursor=Tetrakis (Dimethylamido) Titanium (IV), Ti precursor temperature=81° C., Ar carrier flow rate=60 sccm, automatic pressure control (APC) valve=11%, water pulse time=0.06 seconds, water dwell time=60 seconds, Ti precursor pulse time=0.17 seconds, and Ti precursor dwell time=60 seconds. The final ALD film ($TiO_2$) thickness after the $TiO_2$ deposition process was 23 nm, which allowed the ALD film ($TiO_2$) to completely fill the space between the PS domains (due to the conformal nature of the deposition process) while also depositing on the top surface of the PS domain. Next, the ALD film was etched in a Plasma Therm Versaline inductively coupled plasma (ICP) etcher to remove the $TiO_2$ film from the top surface of the PS pattern using the following conditions: pressure=7.5 mT, $BCl_3$ flow rate=45 sccm, $SF_6$ flow rate=5 sccm, bias power=40 W, coil power=300 W, t=20 seconds (FIG. 60B, SEM, where the black lines in the image are the uncovered PS domain). Once the top surface of the PS domain was exposed after the $TiO_2$ etch, the PS domain and the brush layer beneath it were etched with an oxygen plasma in a Plasma Therm Versaline ICP tool at a pressure of 6 mT, with an $O_2$ flow rate of 20 sccm, a bias power of 10 W, a coil power of 100 W for 13 seconds. The final $O_2$ etch yielded a $TiO_2$ pattern that was the inverse of the PS domain pattern (FIG. 60C, SEM). The $TiO_2$ pattern was then used to mask a silicon nitride etch as described in Example 114 (FIG. 60D, SEM). Finally, the amorphous carbon layer was etched using the same conditions described in Example 115 (FIG. 60E, SEM, top-down view and corresponding FIG. 60F, SEM, cross-sectional view). For the tone inversion process to work, the ALD film must be deposited below the glass transition temperature of the PS domain. Also, the ALD film must be deposited using water pulses and not plasma or ozone pulses. After the polycarbonate domain removal step, the spacing between PS lines must be smaller than the height of the PS lines such that the conformal ALD film deposition from the lateral surfaces of the PS lines meets at the center of the space between the PS lines, thereby avoiding the formation of ALD film spacers when the ALD film is etched back to reveal the top surfaces of the PS lines. Using these criteria, ALD thin films such as $Al_2O_3$, $HfO_2$, and similar metal oxides can be used to invert the tone of self-assembled BCP systems, provided there are chemical etchants (plasma, liquid, or vapor) capable of etching the metal oxide films back to the top surface of the PS lines without pattern distortion or pattern delamination.

Grapho-epitaxy Directed Self-assembly (DSA)

Example 117

The following procedure was used for creating a line/space pattern. A grapho-epitaxial pre-pattern was formed on a preferential underlayer using a negative tone photoresist, followed by coating a thin film of block copolymer onto the pre-pattern. The block copolymer was substantially confined to the trenches of the resist pre-pattern. The coated structure was then annealed, allowing the pre-pattern to direct self-assembly of the block copolymer.

The following procedure is representative. A trilayer substrate was prepared consisting of a silicon wafer coated with approximately a 30 nm thick amorphous carbon layer followed by a 10 nm thick silicon nitride ($SiN_x$) layer. The underlayer solution AZEMBLY™ NLD-303 (100% PMMA brush polymer) was spin coated on the silicon nitride layer at 2000 rpm spin rate. After forming the thin film, the underlayer coated substrate was baked at 250° C. for 2 minutes and cooled to room temperature. The underlayer was then given a solvent rinse by casting PGMEA on top of the brush coated substrate, letting the solvent puddle for 30 seconds, and spin drying the treated brush coated substrate at 2000 rpm for 30 seconds. The rinse was intended to remove any excess random graft copolymer that was not crosslinked or grafted to the silicon nitride surface. The final film thickness of the underlayer was 10 nm after the solvent rinse.

Next, a 60 nm thick layer of a commercial 193 nm negative-tone photoresist (JSR ARF7210JN-8) was disposed on this underlayer-coated substrate followed by a post application bake at 80° C. for 60 seconds. The photoresist layer was then exposed using a 193 nm immersion interference tool (IBM NEMO) with fixed dose of 4.67 mJ, baked at 95° C. for 60 seconds, and developed for 60 seconds with 2-heptanone developer. The resulting 200 nm pitch patterned photoresist layer was then hard baked at 200° C. for 3 minutes prior to coating a block copolymer formulation.

Figure 62:
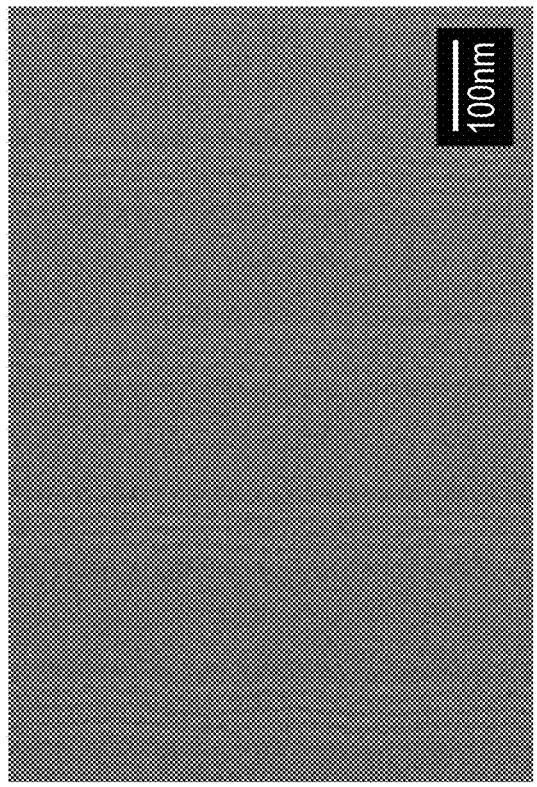
FIG. 62 is an SEM of the domain pattern formed in Example 117 using a grapho-epitaxial pre-pattern formed on an underlayer of poly(styrene-co-methyl methacrylate) containing 30 mol % styrene.
Figure 61:
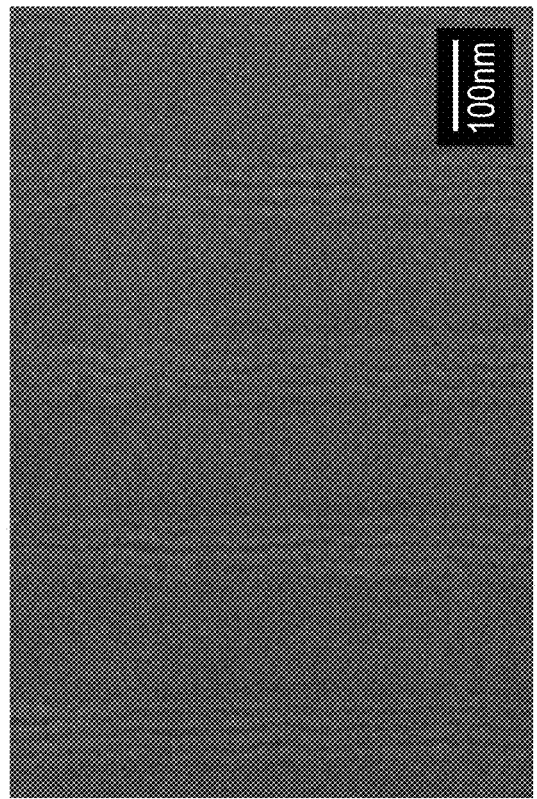
FIG. 61 is an SEM of the domain pattern formed in Example 117 using a grapho-epitaxial pre-pattern formed on an underlayer of poly(methyl methacrylate).

The block copolymer formulation was prepared as follows. Diblock copolymer BCP-2 (0.01 g) was dissolved in PGMEA (1.24 g, 10,000 parts by weight) to form a 0.8 wt % stock solution of the block copolymer based on total weight of the solution. The solution was passed through a 0.2 micrometer polytetrafluoroethylene (PTFE) filter. The resulting solution containing block copolymer was spin coated on the patterned photoresist substrate described above. After spin coating, the coated wafer was baked at 200° C. for 5 minutes. The self-assembled domains of the block copolymer inside the guiding pre-pattern trenches were analyzed with top down and cross section SEM. The samples were subjected to 20 seconds of Au sputtering with 20 mA current prior to SEM imaging (FIG. 61). This example was repeated using an underlayer comprising poly (styrene-co-methyl methacrylate), Sty:MMA=30:70 mol % (FIG. 62).

Example 118

Figure 63:
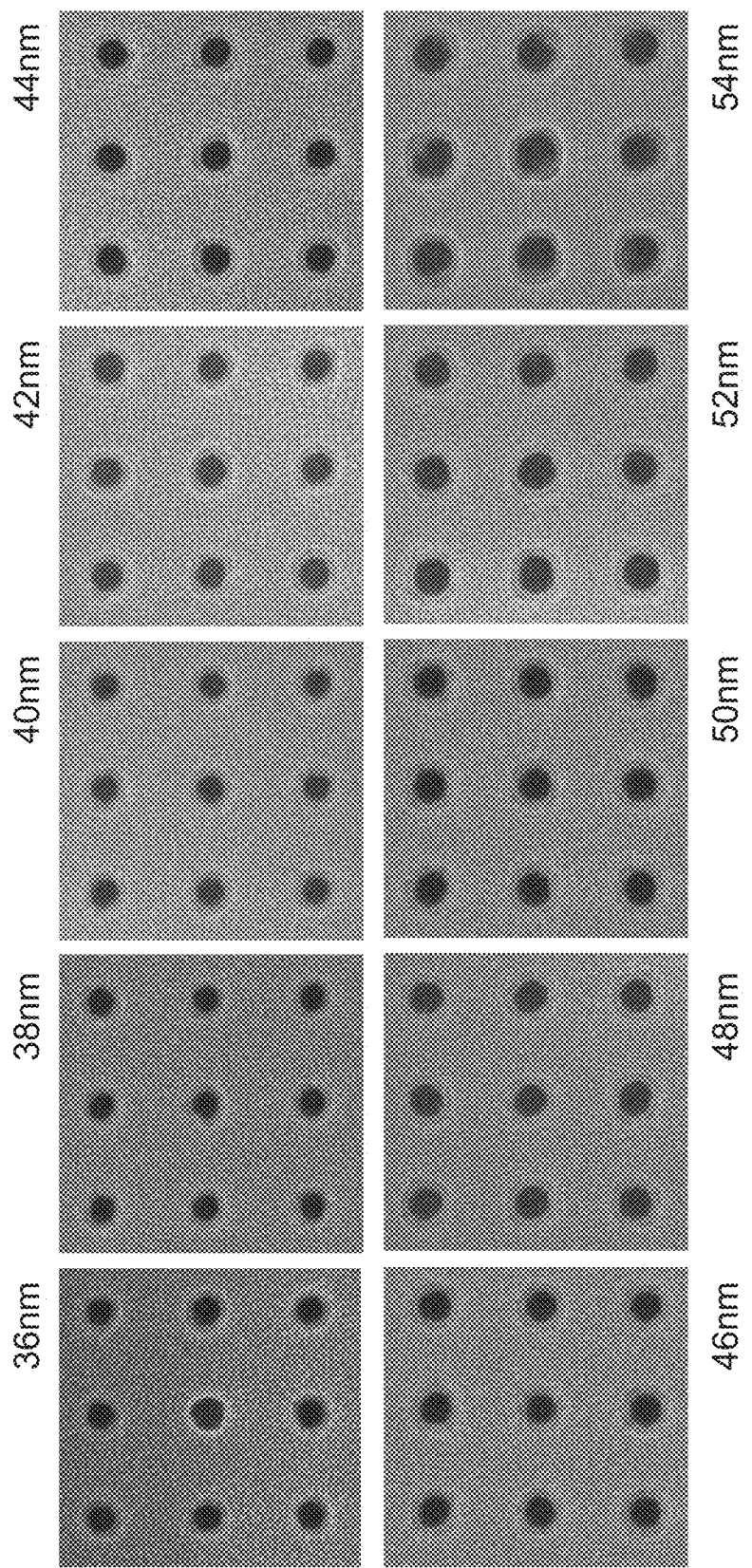
FIG. 63 is an SEM of the contact hole pattern formed in Example 118.

The following procedure was used for creating a contact hole pattern. Directed self-assembly using a circular guiding pre-pattern (grapho-epitaxy) was performed using BCP-2. The guiding pattern was prepared using production-like semiconductor fabrication tools. The silicon substrate was first coated with an organic hard mask (ODL-401) and baked at 250° C. for 2 minutes to obtain a 135 nm thick film, forming an organic planarization layer (OPL). Secondly, SiARC (A940) was coated on top of the OPL layer and subsequently baked at 220° C. for 2 minutes to obtain a 20 nm thick film. The steps were repeated to obtain a double stack of OPL and SiARC with another 50 nm OPL layer and 20 nm SiARC film. Finally, a positive-tone resist was applied on top of the SiARC and then patterned with extreme ultraviolet (EUV) lithography at 13.4 nm to form the desired circular guiding patterns. Afterwards, a BCP-2 solution (1 wt % in PGMEA) was spin-coated on the guiding pattern without further modification, baked at 200° C. for 20 minutes, and subsequently etched with reactive ion oxygen etch for 8 seconds to improve contrast between the domains. The self-assembly was characterized by SEM (FIG. 63). Measurements of the BCP-2 vias were taken by the imaging tools from MatLab. The DSA process window was defined so that more than 80% of the guiding pattern in the field of view (~100 holes) contain BCP-2 vias. The circular dimension uniformity (CDU) was calculated by the deviation from the mean via size averaged over 2000 vias and then divided by the mean via size. The eccentricity is a measure of the roundness of the vias and was obtained by fitting the via shape to an ellipse. The eccentricity was defined as the ratio of the distance between the foci of the ellipse and its major axis length and ranges from 0 for a circle to 1 for being a line segment). The placement error was defined as the vector distance between the center of the guiding pattern and the center of the BCP-2 via averaged over 2000 vias. The rectification constant was determined by the slope of the BCP-2 via diameter versus the guiding pattern diameter. The results are shown in Table 10. Table 10 also includes values obtained for the comparison block copolymer PS-b-PMMA 3964 that lacks the fluorinated L' group of BCP-2.

TABLE 10

| BCP Sample | Process Window | CDU | Eccentricity | Placement Error | Rectification constant |
|---|---|---|---|---|---|
| BCP-2 | 38 nm to 52 nm guiding pattern diameter | 2.98% | 0.42 | 1.78 nm | 0.65 |
| PS-b-PMMA 3694 | 54 nm to 78 nm guiding pattern diameter | 6.85% | 0.55 | 2.21 nm | 0.14 |

The most important parameter of Table 10 is CDU, the critical dimension (CD) uniformity. A CDU less than about 3% is desirable for high volume manufacturing. Eccentricity is a measure of the roundness. Smaller eccentricity values are generally more desirable, but there are no requirements set for the eccentricity. A placement error of less than 1 nm is also desirable. A smaller rectification constant is also generally more desirable. The process window determines the guiding pattern CD in which the block copolymer forms vias. A smaller guiding pattern CD is more desirable. As seen in Table 10, the CDU for high-chi block copolymer BCP-2 is significantly lower (improved) compared to the control block copolymer PS-b-PMMA 3964 lacking the L' group. PS-b-PMMA 3964 only forms PMMA vias when the guiding pattern CDs are larger because the characteristic pitch (Lo) of PS-b-PMMA is larger (the process window depends on the pitch capability of the block copolymer, which is related to the chi interaction parameter of the block copolymer).

The rectification constant (Table 10) for PS-b-PMMA 3964 is also lower compared to BCP-2. Without being bound by theory, this suggests a greater amount of stretching of the chains in the BCP-2 when they form the vias. Self-assembled PS-b-PMMA 3964 films are weakly phase-segregated and the polymer coils are only slightly stretched. This leads to more variation in the CD for PS-b-PMMA 3964, but also to greater intrinsic CD that is less dependent on the guiding pattern CD. The high chi BCP-2 on the other hand, is strongly phase-segregated, which leads to greater stretching of the polymer chains. The high-chi BCP-2 stretched chains have less freedom to move compared to PS-b-PMMA 3964 chains, leading to a higher rectification constant but lower CDU. The L' group may induce even more stretching at the interface since both blocks have a high interaction parameter with the L' group.

Chemo-epitaxy

Example 119

This example demonstrates chemo-epitaxy directed self-assembly (DSA) using BCP-2. The block copolymer formulation was prepared as follows. Diblock copolymer BCP-2 (0.01 g, Example 16) was dissolved in PGMEA (0.823 g) to form a 1.2 wt % stock solution of the block copolymer based on total weight of the solution. The solution was passed through a 0.2 micrometer polytetrafluoroethylene (PTFE) filter. The resulting solution containing block copolymer was spin-coated on the patterned substrate prepared as follows. AZEMBLY™ NLD-320 (SMMA, poly (styrene-co-methyl methacrylate), 30% styrene, 70% MMA, brush polymer) solution in PGMEA was spin coated at 2000 rpm on a 10 nm thick silicon nitride layer disposed on a silicon wafer. The coated wafer was baked at 250° C. for 2 minutes prior to a solvent rinse to form the underlayer. To this SMMA underlayer modified substrate, hydrogen silsesquioxane (HSQ, diluted Dow Corning XR-1541 E-beam resist in methylisobutylketone) was coated at 2000 rpm and baked at 130° C. for 2 minutes to form an HSQ layer on the SMMA brush modified substrate. The HSQ pattern was written by electron beam lithography using Leica-Vistec VB6 and developed by 0.26N tetramethyl ammonium hydroxide (TMAH). These HSQ features served as the wetting region and the exposed SMMA brush layer served as the non-preferential region. The width of the HSQ features was about 10 nm, which is approximately equal to the size of one of the domains of BCP-2, thus HSQ was an effective pinning layer for one of the domains of the BCP.

Figure 64:
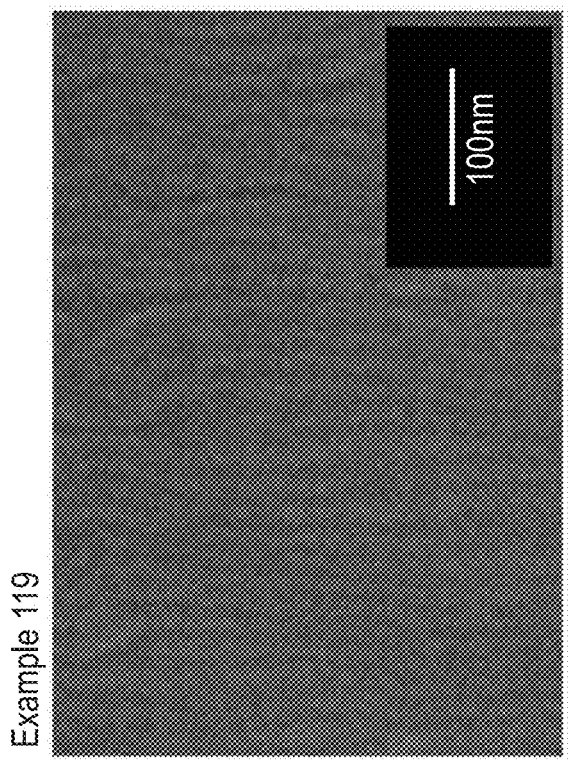
FIG. 64 is an SEM of the domain pattern formed in Example 119 using a chemo-epitaxial pre-pattern.

Chemo-epitaxy directed self-assembly of BCP-2 (Example 16) was carried out by coating the 1.2 wt % solution at 3000 rpm on the chemical prepattern comprising HSQ lines over SMMA brush layer, followed by annealing at 200° C. for 5 minutes. The self-assembled domains of the block copolymer inside the guiding pre-pattern trenches were analyzed with top down SEM. (FIG. 64, SEM). The SEM image showed aligned BCP-2 domains. This demonstrates the ability of a chemical prepattern to align domains of a block copolymer comprising a disclosed L' group.

Grazing Incidence Small Angle x-ray Scattering (GISAXS)

Examples 120-137

The film samples for grazing incidence small angle x-ray scattering (GISAXS) were prepared as described above. GISAXS is a versatile tool to characterize morphology and orientation of domains in thin films as it combines features from traditional small angle x-ray scattering and x-ray reflectivity. GISAXS was collected at the Advanced Light Source (ALS) at Lawrence Berkeley National Laboratory (LBNL) at beam line 7.3.3 (A. Hexemer, et al., "A SAXS/WAXS/GISAXS Beamline with Multilayer Monochromator", J. Phys. Conf. Ser. 2010, 247, 012007). The incident X-ray energy was 10 keV and the sample to detector distance was 4 meters. The grazing incidence angle was chosen to be between the critical angle of the polymer and the substrate, thereby creating standing waves within the films which amplify the scattering and ensure full penetration of the film. A Pilatus 2M area detector was used to record the scattered intensity of the x-rays over a range of exit angles and scattering angles. Data were normalized for incoming x-ray intensity, film thickness and wafer size, averaged, and integrated along the scattering in-plane at $q_x = 0.028$ Å$^{-1}$ using the IRENA package, developed by I. Ilaysky, et al., "Irena: tool suite for modeling and analysis of small-angle scattering", J. Appl. Cryst. (2009), 42(2), pages 347-353. The intensity distribution along this scattering plane provides information about the ordering normal to the surface of the thin film. The scattering profiles were analyzed by fitting a series of Voigt peaks and an exponential background to the 1D data. The morphology within the thin film can be extracted from the sequence of the observed Bragg peaks as only certain reflections from specific hkl lattices are allowed depending on the space group of the structure. Reflections from the (100), (200), (300), (400) etc. lattices are observed for lamellar structures with the space group Pm, whereas reflections from (100), (110), (200), (210) etc. occur for cylindrical structures with the space group P6 mm. The position of the $1^{st}$ order Bragg peak is directly correlated to the spacing of the lattice by $d=2\pi/q$ and was used to calculate the BCP characteristic pitch (Lo). The orientation with respect to the substrate was determined by the appearance and intensity of the higher order Bragg peaks as the scattering along the in-plane only originates from perpendicular structures while parallel structures contribute to out-of-plane scattering. The GISAXS results are summarized in Table 11.

TABLE 11

| | | | BCP Thin Film layer for Self-Assembly | | | GISAXS Results | | |
|---|---|---|---|---|---|---|---|---|
| GISAXS Example | Underlayer Name | Thin film Example | BCP Name | Linking Group | Morphology | Perpendicular Orientation Yes/No | UL non-preferential? Yes/No | BCP Pitch [nm] |
| 120 | UL-1 | 52 | BCP-1 | Y'—OCH$_2$(CF$_2$)$_3$CH$_2$O—* | Lamellae | Yes | No | 14.16 |
| 121 | UL-2 | 53 | BCP-1 | Y'—OCH$_2$(CF$_2$)$_3$CH$_2$O—* | Lamellae | Yes | Yes | 14.19 |
| 122 | UL-3 | 54 | BCP-1 | Y'—OCH$_2$(CF$_2$)$_3$CH$_2$O—* | * | Mixed | No | 14.09 |
| 123 | UL-1 | 55 | BCP-2 | Y'—OCH$_2$(CF$_2$)$_6$CH$_2$O—* | Lamellae | Yes | No | 18.94 |
| 124 | UL-2 | 56 | BCP-2 | Y'—OCH$_2$(CF$_2$)$_6$CH$_2$O—* | Lamellae | Yes | Yes | 18.94 |
| 125 | UL-5 | 59 | BCP-2 | Y'—OCH$_2$(CF$_2$)$_6$CH$_2$O—* | Lamellae | Yes | No | 19.08 |
| 126 | UL-6 | 60 | BCP-2 | Y'—OCH$_2$(CF$_2$)$_6$CH$_2$O—* | Lamellae | Mixed | No | 19.62 |
| 127 | UL-2 | 61 | BCP-2 | Y'—OCH$_2$(CF$_2$)$_6$CH$_2$O—* | * | No | No | 20.65 |
| 128 | UL-1 | 62 | BCP-3 | Y'—OCH$_2$(CF$_2$)$_{10}$CH$_2$O—* | Lamellae | Yes | No | 15.18 |
| 129 | UL-2 | 63 | BCP-3 | Y'—OCH$_2$(CF$_2$)$_{10}$CH$_2$O—* | Lamellae | Yes | Yes | 15.26 |
| 130 | UK-5 | 66 | BCP-3 | Y'—OCH$_2$(CF$_2$)$_{10}$CH$_2$O—* | Lamellae | Yes | No | 15.43 |
| 131 | UL-7 | 68 | BCP-3 | Y'—OCH$_2$(CF$_2$)$_{10}$CH$_2$O—* | * | No | No | 16.64 |
| 132 | UL-1 | 69 | BCP-5 | Y'—OCH$_2$(CF$_2$)$_6$CH$_2$O—* | * | No | No | * |
| 133 | UL-2 | 70 | BCP-5 | Y'—OCH$_2$(CF$_2$)$_6$CH$_2$O—* | * | No | Yes | 17.06 |
| 134 | UL-3 | 71 | BCP-5 | Y'—OCH$_2$(CF$_2$)$_6$CH$_2$O—* | * | No | No | * |
| 135 | UL-4 | 72 | BCP-5 | Y'—OCH$_2$(CF$_2$)$_6$CH$_2$O—* | * | No | No | * |
| 136 | UL-6 | 74 | BCP-5 | Y'—OCH$_2$(CF$_2$)$_6$CH$_2$O—* | * | No | No | * |
| 137 | UL-2 | 77 | BCP-7 | Y'—OCH$_2$(CF$_2$)$_6$CH$_2$O—* | * | No | Yes | 17.50 |

Figure 65:
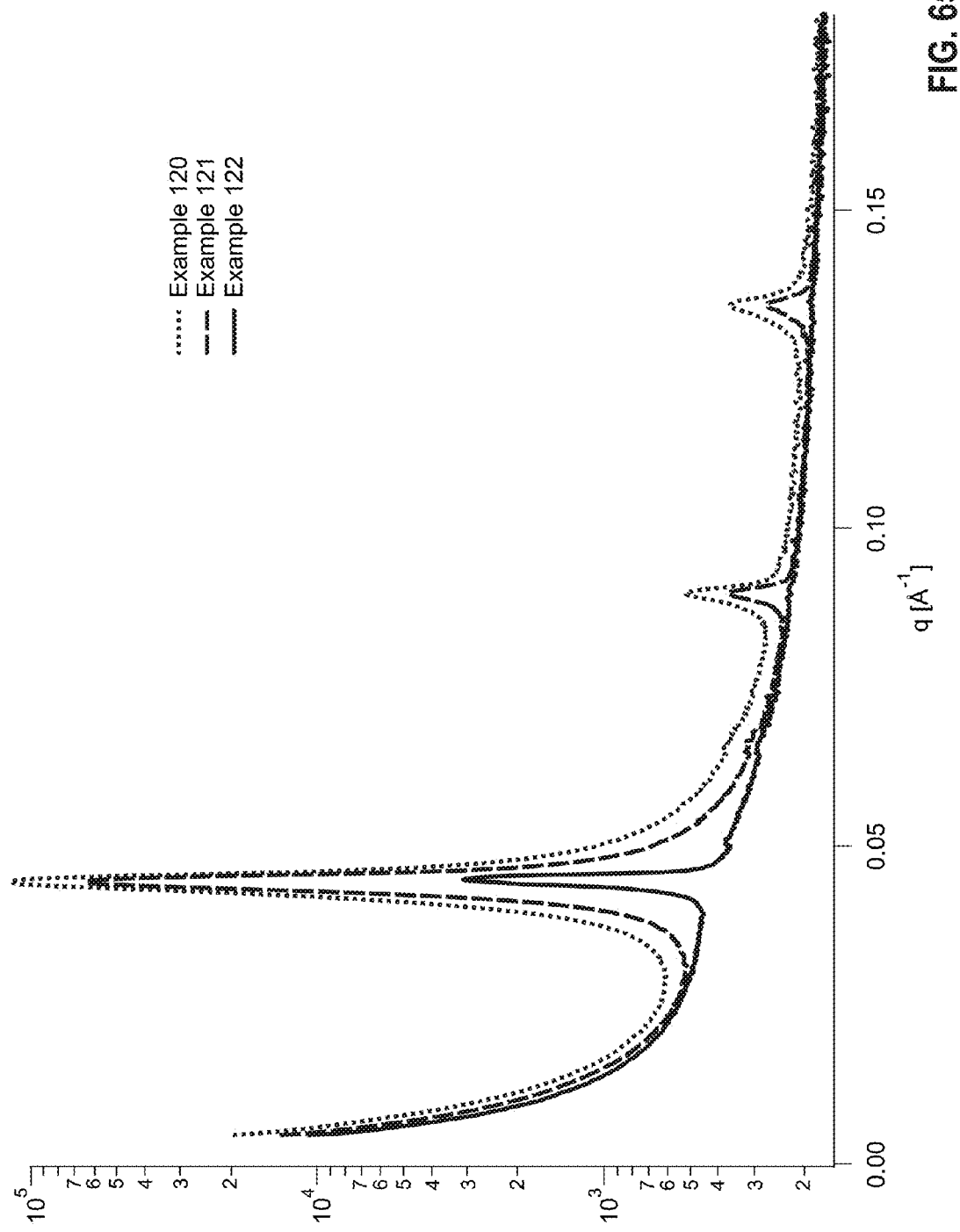
FIG. 65 is a graph showing the GISAXS results for Examples 120-122 of Table 11.
Figure 66:
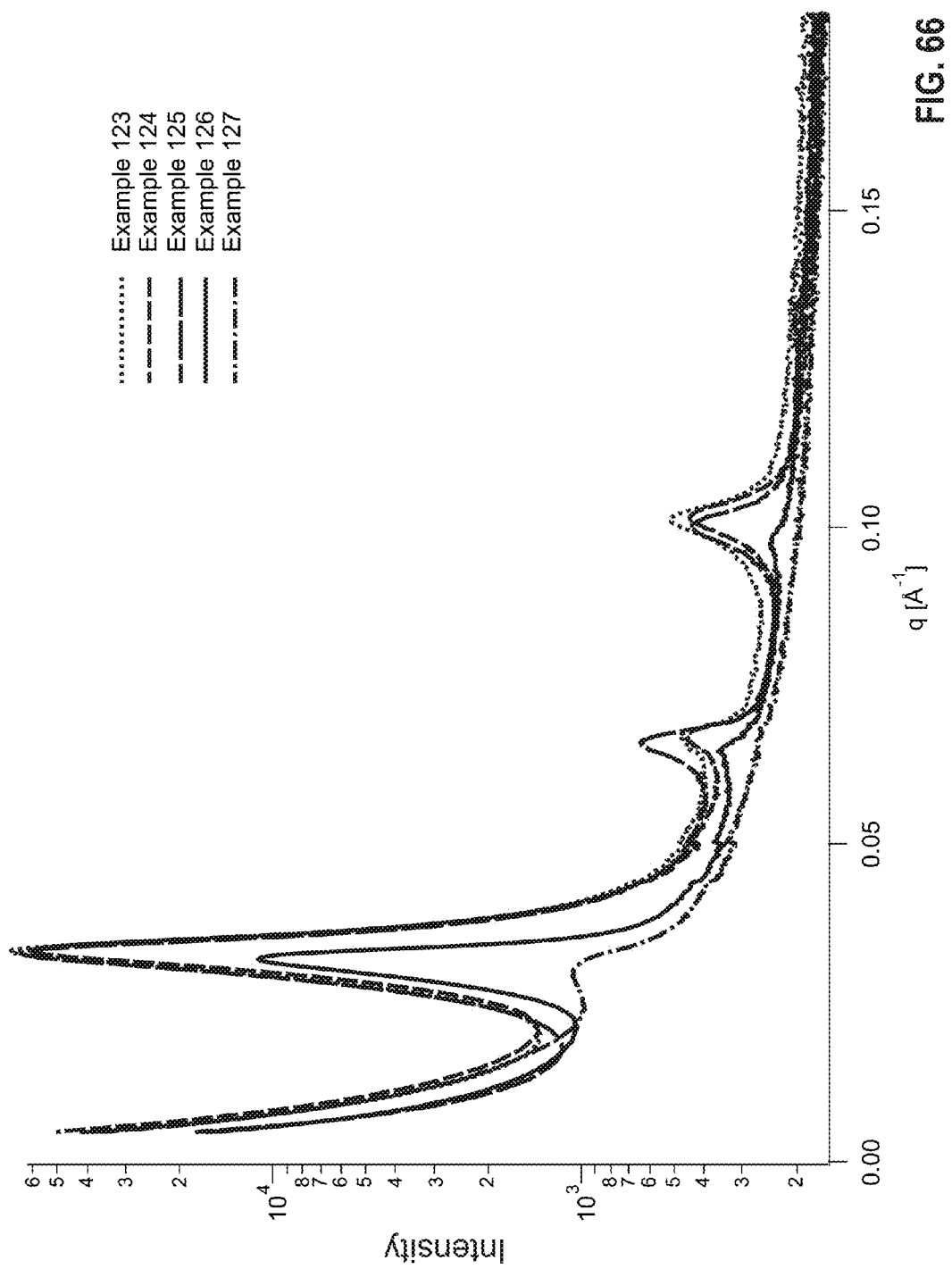
FIG. 66 is a graph showing the GISAXS results for Examples 123-127 of Table 11.
Figure 67:
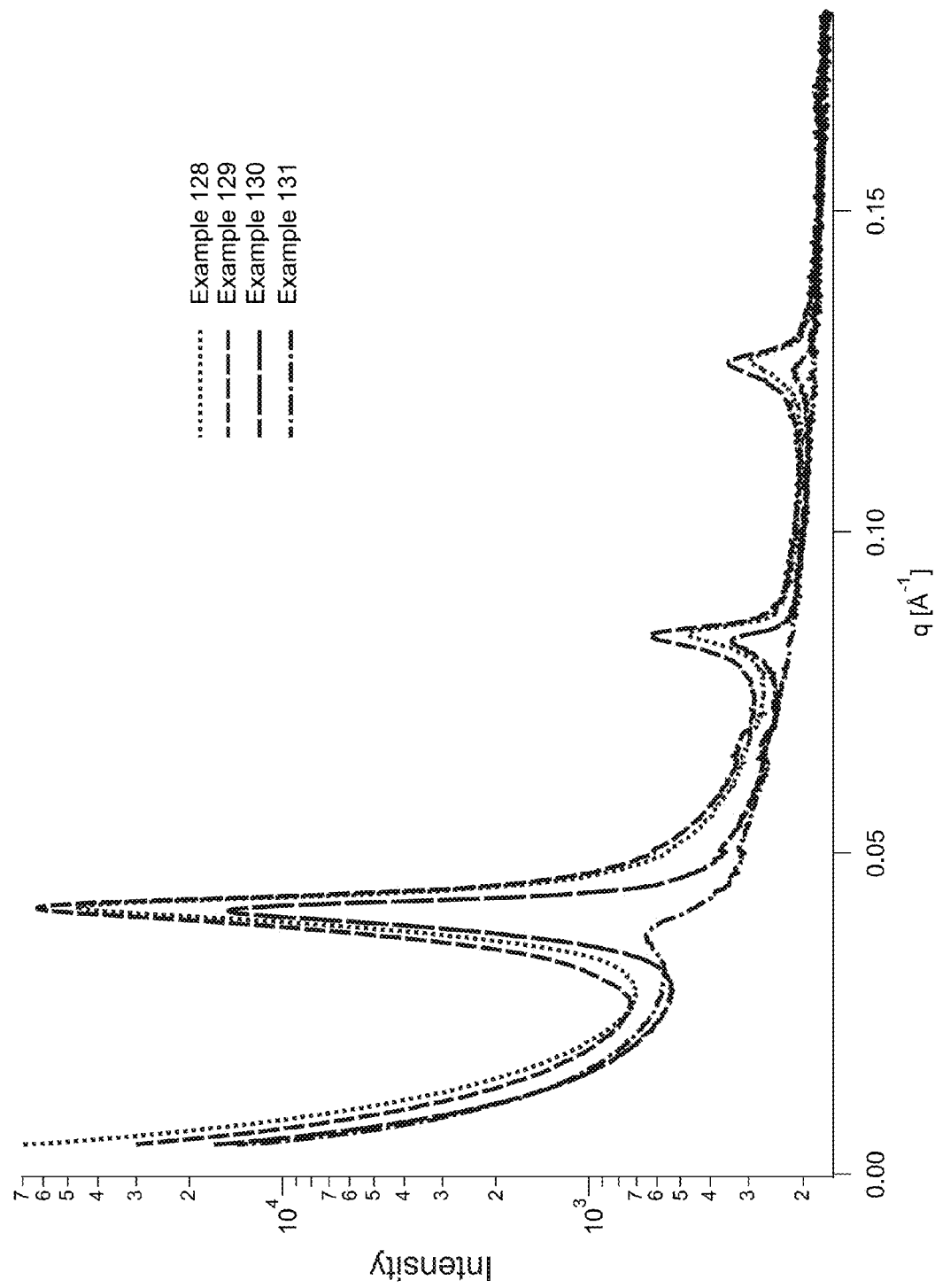
FIG. 67 is a graph showing the GISAXS results for Examples 128-131 of Table 11.
Figure 68:
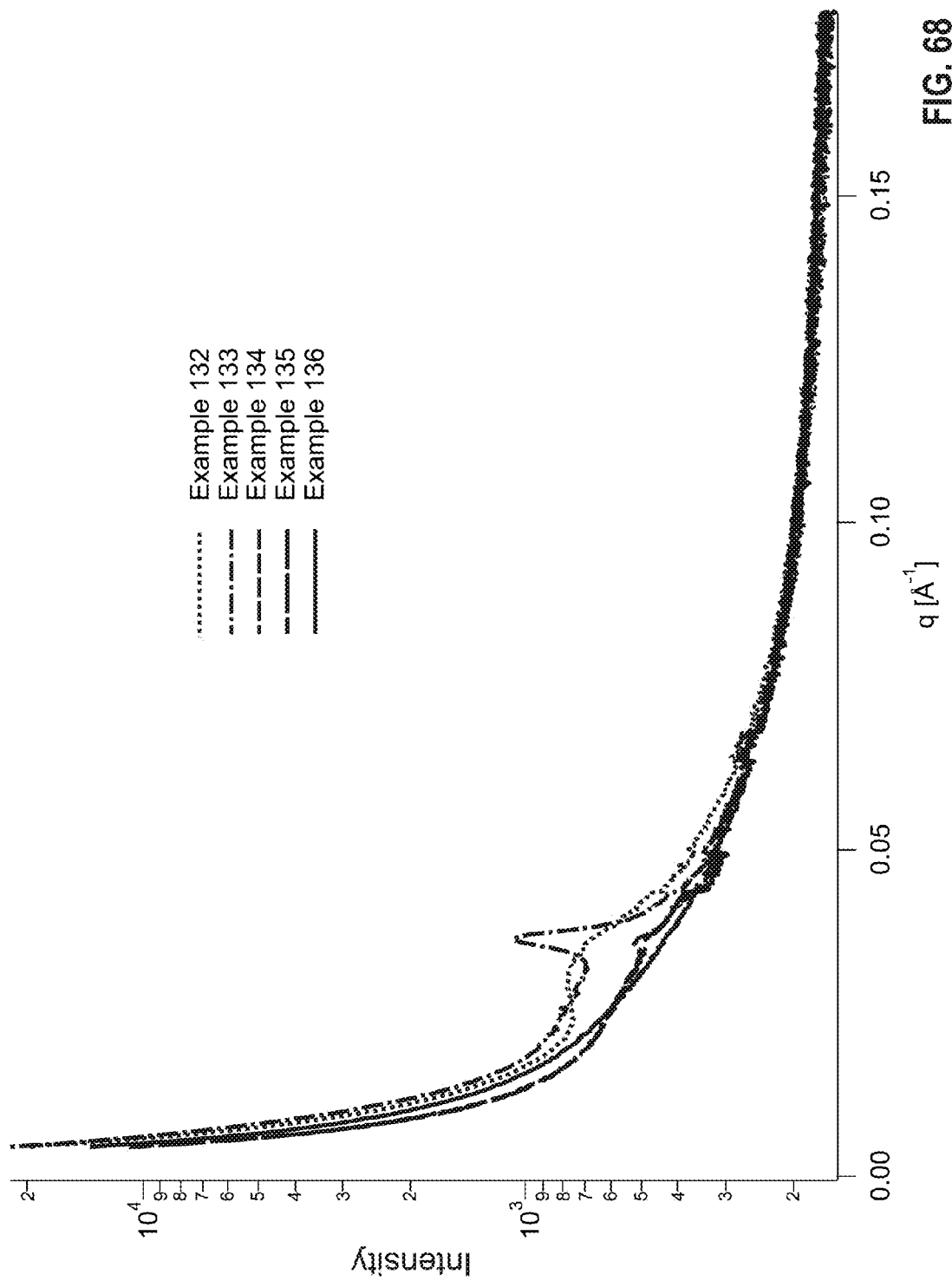
FIG. 68 is a graph showing the GISAXS results for Examples 132-136 of Table 11.
Figure 69:
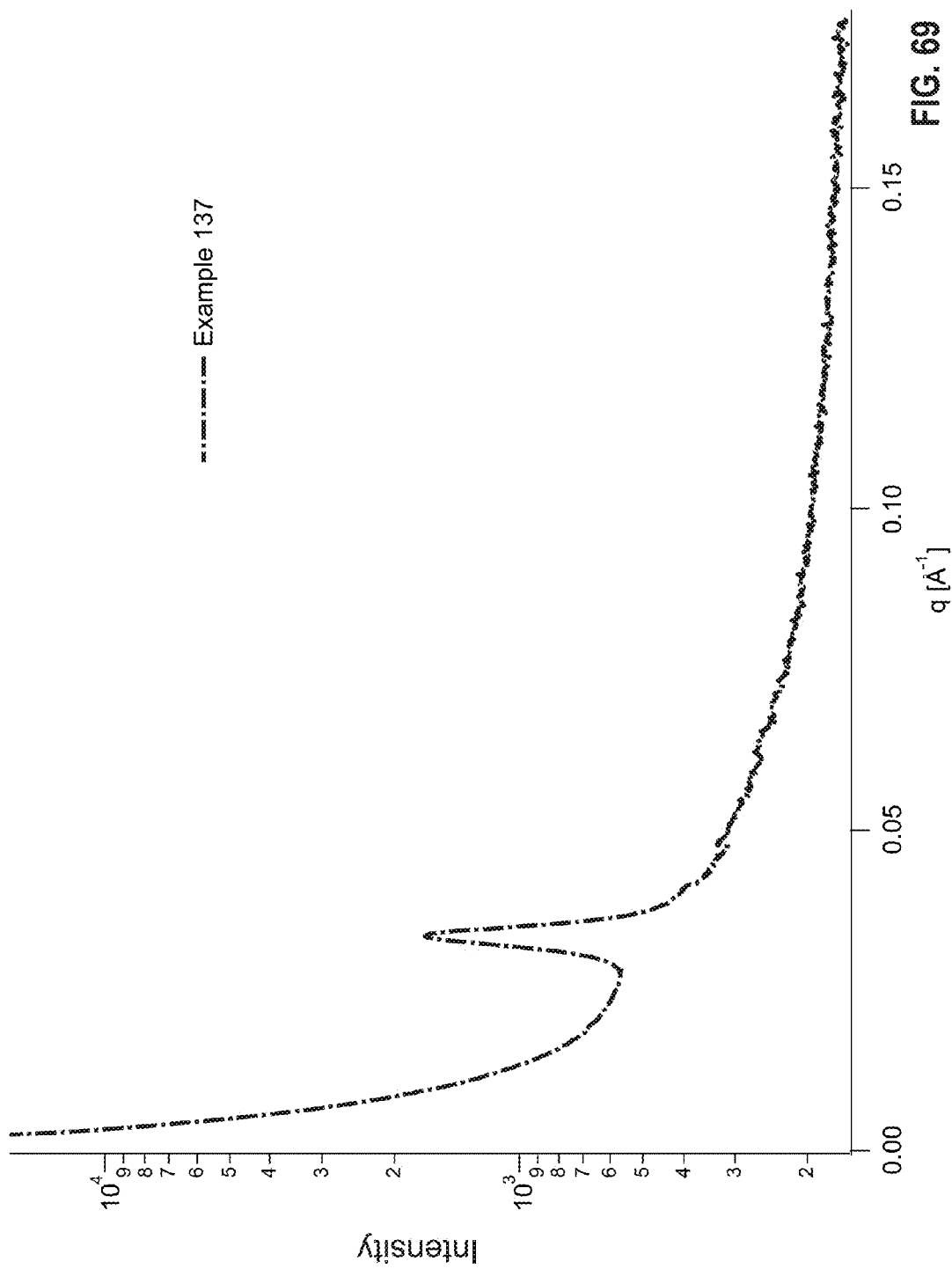
FIG. 69 is a graph showing the GISAXS results for Examples 137 of Table 11.

*in-plane scattered intensity not sufficient to determine morphology and/or BCP pitch FIG. 65 is a graph showing the GISAXS results for Examples 120-122 of Table 11. FIG. 66 is a graph showing the GISAXS results for Examples 123-127 of Table 11. FIG. 67 is a graph showing the GISAXS results for Examples 128-131 of Table 11. FIG. 68 is a graph showing the GISAXS results for Examples 132-136 of Table 11. FIG. 69 is a graph showing the GISAXS results for Examples 137 of Table 11. All graphs show in-plane scattering profiles. Peaks in the in-plane direction originate from perpendicular structures in the thin film. Thus, if a strong first order peak and additionally a second and/or third order peak is observed, the film morphology is mainly perpendicular lamellae. The sequence of the peaks gives an indication of the morphology. If the peak positions are at ratios of 1:2:3 (the second order is sometimes very weak, especially when the BCP is exactly a 50/50 composition, for which the second order peak is forbidden due to the symmetry), then the morphology is lamellar as explained in the paragraph above (for cylinders the ratio would be 1:1.7:2:2.2). The characteristic pitch (Lo) was calculated from the position of the first order peak.

Examples S1-S210

Modelling of BCPs with linear junction groups. Single chain in mean-field (SCMF) Monte Carlo simulations were carried out to explore the effects of fluorinated linear linking groups on the thin-film self-assembly process of block copolymers. Lamella-forming block copolymers with a fluorinated linking group were modeled as bead-spring chains with 25 beads in each block, A and B, and a range of 0-3 beads for the fluorinated linking group (designated C), an interaction parameter $chi_{AB}N$ of 20 $k_B T$ and compressibility k of 25 $k_B T$. The interaction between the linking group C and the block copolymer blocks was varied. The bead number density was 20 beads per lattice cell. The equilibrium lamellar period of this model in a thin film is 38 lattice units, allowing a mapping of 1 lattice unit to be 0.5 nm (i.e., the lamellar characteristic pitch was set to be 19 nm). The simulation box was 160 lattices units long by 160 wide, with a variable height of 40-60 units, and was periodic across its width and length. Static fields at the bottom and the top of the simulation box were introduced to create specific affinities to each block and the linking group. Each system was started in a disordered melt and simulated for 5000 Monte Carlo sweeps with 1 move per bead per sweep and mean-field updates after each step with half the values of the final chi parameters. After the first round, the simulation was carried out for another 5000 steps using the initial block copolymer configuration and the final chi parameters. Using two rounds of simulations with increasing chi parameters ensures that the simulation converges after 5000 sweeps. The densities of block A, B, and the junction group C from the final configuration were collected and visualized using codes written by MatLab and ImageJ. All Monte-Carlo calculations were carried out on an IBM BlueGene/Q supercomputer at the Center for Computational Innovations at Rensselaer Polytechnic Institute. Table 12 summarizes the results.

TABLE 12

| Example | Film Thickness (nm) | Linking Group Length | chi(AC) | chi(BC) | Bottom Interface chi(A) | chi(B) | chi(C) | Top Interface chi(A) | chi(B) | chi(C) | Perpendicular Yes/No |
|---|---|---|---|---|---|---|---|---|---|---|---|
| S1 | 20 | 0 | 1.0 | 1.0 | 5.0 | 5.0 | 5.0 | 1.0 | 5.0 | 0 | No |
| S2 | 20 | 1 | 1.0 | 1.0 | 5.0 | 5.0 | 5.0 | 1.0 | 5.0 | 0 | No |
| S3 | 20 | 2 | 1.0 | 1.0 | 5.0 | 5.0 | 5.0 | 1.0 | 5.0 | 0 | No |
| S4 | 20 | 3 | 1.0 | 1.0 | 5.0 | 5.0 | 5.0 | 1.0 | 5.0 | 0 | No |
| S5 | 20 | 0 | 2.0 | 2.0 | 5.0 | 5.0 | 5.0 | 1.0 | 5.0 | 0 | No |
| S6 | 20 | 1 | 2.0 | 2.0 | 5.0 | 5.0 | 5.0 | 1.0 | 5.0 | 0 | No |
| S7 | 20 | 2 | 2.0 | 2.0 | 5.0 | 5.0 | 5.0 | 1.0 | 5.0 | 0 | No |
| S8 | 20 | 3 | 2.0 | 2.0 | 5.0 | 5.0 | 5.0 | 1.0 | 5.0 | 0 | Yes |
| S9 | 20 | 0 | 3.0 | 3.0 | 5.0 | 5.0 | 5.0 | 1.0 | 5.0 | 0 | No |
| S10 | 20 | 1 | 3.0 | 3.0 | 5.0 | 5.0 | 5.0 | 1.0 | 5.0 | 0 | No |
| S11 | 20 | 2 | 3.0 | 3.0 | 5.0 | 5.0 | 5.0 | 1.0 | 5.0 | 0 | Yes |
| S12 | 20 | 3 | 3.0 | 3.0 | 5.0 | 5.0 | 5.0 | 1.0 | 5.0 | 0 | Yes |
| S13 | 20 | 0 | 4.0 | 4.0 | 5.0 | 5.0 | 5.0 | 1.0 | 5.0 | 0 | No |
| S14 | 20 | 1 | 4.0 | 4.0 | 5.0 | 5.0 | 5.0 | 1.0 | 5.0 | 0 | No |
| S15 | 20 | 2 | 4.0 | 4.0 | 5.0 | 5.0 | 5.0 | 1.0 | 5.0 | 0 | Yes |
| S16 | 20 | 3 | 4.0 | 4.0 | 5.0 | 5.0 | 5.0 | 1.0 | 5.0 | 0 | Yes |
| S17 | 20 | 0 | 5.0 | 5.0 | 5.0 | 5.0 | 5.0 | 1.0 | 5.0 | 0 | No |
| S18 | 20 | 1 | 5.0 | 5.0 | 5.0 | 5.0 | 5.0 | 1.0 | 5.0 | 0 | Yes |
| S19 | 20 | 2 | 5.0 | 5.0 | 5.0 | 5.0 | 5.0 | 1.0 | 5.0 | 0 | Yes |
| S20 | 20 | 3 | 5.0 | 5.0 | 5.0 | 5.0 | 5.0 | 1.0 | 5.0 | 0 | Yes |
| S21 | 20 | 0 | 1.0 | 1.0 | 5.0 | 5.0 | 5.0 | 3.0 | 5.0 | 0 | No |
| S22 | 20 | 1 | 1.0 | 1.0 | 5.0 | 5.0 | 5.0 | 3.0 | 5.0 | 0 | No |
| S23 | 20 | 2 | 1.0 | 1.0 | 5.0 | 5.0 | 5.0 | 3.0 | 5.0 | 0 | No |
| S24 | 20 | 3 | 1.0 | 1.0 | 5.0 | 5.0 | 5.0 | 3.0 | 5.0 | 0 | No |
| S25 | 20 | 0 | 2.0 | 2.0 | 5.0 | 5.0 | 5.0 | 3.0 | 5.0 | 0 | No |
| S26 | 20 | 1 | 2.0 | 2.0 | 5.0 | 5.0 | 5.0 | 3.0 | 5.0 | 0 | No |
| S27 | 20 | 2 | 2.0 | 2.0 | 5.0 | 5.0 | 5.0 | 3.0 | 5.0 | 0 | No |
| S28 | 20 | 3 | 2.0 | 2.0 | 5.0 | 5.0 | 5.0 | 3.0 | 5.0 | 0 | Yes |
| S29 | 20 | 0 | 3.0 | 3.0 | 5.0 | 5.0 | 5.0 | 3.0 | 5.0 | 0 | No |
| S30 | 20 | 1 | 3.0 | 3.0 | 5.0 | 5.0 | 5.0 | 3.0 | 5.0 | 0 | No |
| S31 | 20 | 2 | 3.0 | 3.0 | 5.0 | 5.0 | 5.0 | 3.0 | 5.0 | 0 | Yes |
| S32 | 20 | 3 | 3.0 | 3.0 | 5.0 | 5.0 | 5.0 | 3.0 | 5.0 | 0 | Yes |
| S33 | 20 | 0 | 4.0 | 4.0 | 5.0 | 5.0 | 5.0 | 3.0 | 5.0 | 0 | No |
| S34 | 20 | 1 | 4.0 | 4.0 | 5.0 | 5.0 | 5.0 | 3.0 | 5.0 | 0 | Yes |
| S35 | 20 | 2 | 4.0 | 4.0 | 5.0 | 5.0 | 5.0 | 3.0 | 5.0 | 0 | Yes |
| S36 | 20 | 3 | 4.0 | 4.0 | 5.0 | 5.0 | 5.0 | 3.0 | 5.0 | 0 | Yes |
| S37 | 20 | 0 | 5.0 | 5.0 | 5.0 | 5.0 | 5.0 | 3.0 | 5.0 | 0 | No |
| S38 | 20 | 1 | 5.0 | 5.0 | 5.0 | 5.0 | 5.0 | 3.0 | 5.0 | 0 | Yes |
| S39 | 20 | 2 | 5.0 | 5.0 | 5.0 | 5.0 | 5.0 | 3.0 | 5.0 | 0 | Yes |
| S40 | 20 | 3 | 5.0 | 5.0 | 5.0 | 5.0 | 5.0 | 3.0 | 5.0 | 0 | Yes |
| S41 | 20 | 0 | 1.0 | 1.0 | 5.0 | 5.0 | 5.0 | 5.0 | 5.0 | 0 | Yes |
| S42 | 20 | 1 | 1.0 | 1.0 | 5.0 | 5.0 | 5.0 | 5.0 | 5.0 | 0 | Yes |
| S43 | 20 | 2 | 1.0 | 1.0 | 5.0 | 5.0 | 5.0 | 5.0 | 5.0 | 0 | Yes |
| S44 | 20 | 3 | 1.0 | 1.0 | 5.0 | 5.0 | 5.0 | 5.0 | 5.0 | 0 | Yes |
| S45 | 20 | 0 | 2.0 | 2.0 | 5.0 | 5.0 | 5.0 | 5.0 | 5.0 | 0 | Yes |
| S46 | 20 | 1 | 2.0 | 2.0 | 5.0 | 5.0 | 5.0 | 5.0 | 5.0 | 0 | Yes |
| S47 | 20 | 2 | 2.0 | 2.0 | 5.0 | 5.0 | 5.0 | 5.0 | 5.0 | 0 | Yes |
| S48 | 20 | 3 | 2.0 | 2.0 | 5.0 | 5.0 | 5.0 | 5.0 | 5.0 | 0 | Yes |
| S49 | 20 | 0 | 3.0 | 3.0 | 5.0 | 5.0 | 5.0 | 5.0 | 5.0 | 0 | Yes |
| S50 | 20 | 1 | 3.0 | 3.0 | 5.0 | 5.0 | 5.0 | 5.0 | 5.0 | 0 | Yes |
| S51 | 20 | 2 | 3.0 | 3.0 | 5.0 | 5.0 | 5.0 | 5.0 | 5.0 | 0 | Yes |
| S52 | 20 | 3 | 3.0 | 3.0 | 5.0 | 5.0 | 5.0 | 5.0 | 5.0 | 0 | Yes |
| S53 | 20 | 0 | 4.0 | 4.0 | 5.0 | 5.0 | 5.0 | 5.0 | 5.0 | 0 | Yes |
| S54 | 20 | 1 | 4.0 | 4.0 | 5.0 | 5.0 | 5.0 | 5.0 | 5.0 | 0 | Yes |

TABLE 12-continued

| Example | Film Thickness (nm) | Linking Group Length | chi(AC) | chi(BC) | Bottom Interface chi(A) | chi(B) | chi(C) | Top Interface chi(A) | chi(B) | chi(C) | Perpendicular Yes/No |
|---|---|---|---|---|---|---|---|---|---|---|---|
| S55 | 20 | 2 | 4.0 | 4.0 | 5.0 | 5.0 | 5.0 | 5.0 | 5.0 | 0 | Yes |
| S56 | 20 | 3 | 4.0 | 4.0 | 5.0 | 5.0 | 5.0 | 5.0 | 5.0 | 0 | Yes |
| S57 | 20 | 0 | 5.0 | 5.0 | 5.0 | 5.0 | 5.0 | 5.0 | 5.0 | 0 | Yes |
| S58 | 20 | 1 | 5.0 | 5.0 | 5.0 | 5.0 | 5.0 | 5.0 | 5.0 | 0 | Yes |
| S59 | 20 | 2 | 5.0 | 5.0 | 5.0 | 5.0 | 5.0 | 5.0 | 5.0 | 0 | Yes |
| S60 | 20 | 3 | 5.0 | 5.0 | 5.0 | 5.0 | 5.0 | 5.0 | 5.0 | 0 | Yes |
| S61 | 30 | 0 | 1.0 | 1.0 | 5.0 | 5.0 | 5.0 | 1.0 | 5.0 | 0 | No |
| S62 | 30 | 1 | 1.0 | 1.0 | 5.0 | 5.0 | 5.0 | 1.0 | 5.0 | 0 | No |
| S63 | 30 | 2 | 1.0 | 1.0 | 5.0 | 5.0 | 5.0 | 1.0 | 5.0 | 0 | No |
| S64 | 30 | 3 | 1.0 | 1.0 | 5.0 | 5.0 | 5.0 | 1.0 | 5.0 | 0 | No |
| S65 | 30 | 0 | 2.0 | 2.0 | 5.0 | 5.0 | 5.0 | 1.0 | 5.0 | 0 | No |
| S66 | 30 | 1 | 2.0 | 2.0 | 5.0 | 5.0 | 5.0 | 1.0 | 5.0 | 0 | No |
| S67 | 30 | 2 | 2.0 | 2.0 | 5.0 | 5.0 | 5.0 | 1.0 | 5.0 | 0 | No |
| S68 | 30 | 3 | 2.0 | 2.0 | 5.0 | 5.0 | 5.0 | 1.0 | 5.0 | 0 | No |
| S69 | 30 | 0 | 3.0 | 3.0 | 5.0 | 5.0 | 5.0 | 1.0 | 5.0 | 0 | No |
| S70 | 30 | 1 | 3.0 | 3.0 | 5.0 | 5.0 | 5.0 | 1.0 | 5.0 | 0 | No |
| S71 | 30 | 2 | 3.0 | 3.0 | 5.0 | 5.0 | 5.0 | 1.0 | 5.0 | 0 | No |
| S72 | 30 | 3 | 3.0 | 3.0 | 5.0 | 5.0 | 5.0 | 1.0 | 5.0 | 0 | Yes |
| S73 | 30 | 0 | 4.0 | 4.0 | 5.0 | 5.0 | 5.0 | 1.0 | 5.0 | 0 | No |
| S74 | 30 | 1 | 4.0 | 4.0 | 5.0 | 5.0 | 5.0 | 1.0 | 5.0 | 0 | No |
| S75 | 30 | 2 | 4.0 | 4.0 | 5.0 | 5.0 | 5.0 | 1.0 | 5.0 | 0 | Yes |
| S76 | 30 | 3 | 4.0 | 4.0 | 5.0 | 5.0 | 5.0 | 1.0 | 5.0 | 0 | Yes |
| S77 | 30 | 0 | 5.0 | 5.0 | 5.0 | 5.0 | 5.0 | 1.0 | 5.0 | 0 | No |
| S78 | 30 | 1 | 5.0 | 5.0 | 5.0 | 5.0 | 5.0 | 1.0 | 5.0 | 0 | No |
| S79 | 30 | 2 | 5.0 | 5.0 | 5.0 | 5.0 | 5.0 | 1.0 | 5.0 | 0 | Yes |
| S80 | 30 | 3 | 5.0 | 5.0 | 5.0 | 5.0 | 5.0 | 1.0 | 5.0 | 0 | Yes |
| S81 | 30 | 0 | 1.0 | 1.0 | 5.0 | 5.0 | 5.0 | 3.0 | 5.0 | 0 | No |
| S82 | 30 | 1 | 1.0 | 1.0 | 5.0 | 5.0 | 5.0 | 3.0 | 5.0 | 0 | No |
| S83 | 30 | 2 | 1.0 | 1.0 | 5.0 | 5.0 | 5.0 | 3.0 | 5.0 | 0 | No |
| S84 | 30 | 3 | 1.0 | 1.0 | 5.0 | 5.0 | 5.0 | 3.0 | 5.0 | 0 | No |
| S85 | 30 | 0 | 2.0 | 2.0 | 5.0 | 5.0 | 5.0 | 3.0 | 5.0 | 0 | No |
| S86 | 30 | 1 | 2.0 | 2.0 | 5.0 | 5.0 | 5.0 | 3.0 | 5.0 | 0 | No |
| S87 | 30 | 2 | 2.0 | 2.0 | 5.0 | 5.0 | 5.0 | 3.0 | 5.0 | 0 | No |
| S88 | 30 | 3 | 2.0 | 2.0 | 5.0 | 5.0 | 5.0 | 3.0 | 5.0 | 0 | Yes |
| S89 | 30 | 0 | 3.0 | 3.0 | 5.0 | 5.0 | 5.0 | 3.0 | 5.0 | 0 | No |
| S90 | 30 | 1 | 3.0 | 3.0 | 5.0 | 5.0 | 5.0 | 3.0 | 5.0 | 0 | No |
| S91 | 30 | 2 | 3.0 | 3.0 | 5.0 | 5.0 | 5.0 | 3.0 | 5.0 | 0 | No |
| S92 | 30 | 3 | 3.0 | 3.0 | 5.0 | 5.0 | 5.0 | 3.0 | 5.0 | 0 | Yes |
| S93 | 30 | 0 | 4.0 | 4.0 | 5.0 | 5.0 | 5.0 | 3.0 | 5.0 | 0 | Yes |
| S94 | 30 | 1 | 4.0 | 4.0 | 5.0 | 5.0 | 5.0 | 3.0 | 5.0 | 0 | No |
| S95 | 30 | 2 | 4.0 | 4.0 | 5.0 | 5.0 | 5.0 | 3.0 | 5.0 | 0 | Yes |
| S96 | 30 | 3 | 4.0 | 4.0 | 5.0 | 5.0 | 5.0 | 3.0 | 5.0 | 0 | Yes |
| S97 | 30 | 0 | 5.0 | 5.0 | 5.0 | 5.0 | 5.0 | 3.0 | 5.0 | 0 | No |
| S98 | 30 | 1 | 5.0 | 5.0 | 5.0 | 5.0 | 5.0 | 3.0 | 5.0 | 0 | No |
| S99 | 30 | 2 | 5.0 | 5.0 | 5.0 | 5.0 | 5.0 | 3.0 | 5.0 | 0 | Yes |
| S100 | 30 | 3 | 5.0 | 5.0 | 5.0 | 5.0 | 5.0 | 3.0 | 5.0 | 0 | Yes |
| S101 | 30 | 0 | 1.0 | 1.0 | 5.0 | 5.0 | 5.0 | 5.0 | 5.0 | 0 | Yes |
| S102 | 30 | 1 | 1.0 | 1.0 | 5.0 | 5.0 | 5.0 | 5.0 | 5.0 | 0 | Yes |
| S103 | 30 | 2 | 1.0 | 1.0 | 5.0 | 5.0 | 5.0 | 5.0 | 5.0 | 0 | Yes |
| S104 | 30 | 3 | 1.0 | 1.0 | 5.0 | 5.0 | 5.0 | 5.0 | 5.0 | 0 | Yes |
| S105 | 30 | 0 | 2.0 | 2.0 | 5.0 | 5.0 | 5.0 | 5.0 | 5.0 | 0 | Yes |
| S106 | 30 | 1 | 2.0 | 2.0 | 5.0 | 5.0 | 5.0 | 5.0 | 5.0 | 0 | Yes |
| S107 | 30 | 2 | 2.0 | 2.0 | 5.0 | 5.0 | 5.0 | 5.0 | 5.0 | 0 | Yes |
| S108 | 30 | 3 | 2.0 | 2.0 | 5.0 | 5.0 | 5.0 | 5.0 | 5.0 | 0 | Yes |
| S109 | 30 | 0 | 3.0 | 3.0 | 5.0 | 5.0 | 5.0 | 5.0 | 5.0 | 0 | Yes |
| S110 | 30 | 1 | 3.0 | 3.0 | 5.0 | 5.0 | 5.0 | 5.0 | 5.0 | 0 | Yes |
| S111 | 30 | 2 | 3.0 | 3.0 | 5.0 | 5.0 | 5.0 | 5.0 | 5.0 | 0 | Yes |
| S112 | 30 | 3 | 3.0 | 3.0 | 5.0 | 5.0 | 5.0 | 5.0 | 5.0 | 0 | Yes |
| S113 | 30 | 0 | 4.0 | 4.0 | 5.0 | 5.0 | 5.0 | 5.0 | 5.0 | 0 | Yes |
| S114 | 30 | 1 | 4.0 | 4.0 | 5.0 | 5.0 | 5.0 | 5.0 | 5.0 | 0 | Yes |
| S115 | 30 | 2 | 4.0 | 4.0 | 5.0 | 5.0 | 5.0 | 5.0 | 5.0 | 0 | Yes |
| S116 | 30 | 3 | 4.0 | 4.0 | 5.0 | 5.0 | 5.0 | 5.0 | 5.0 | 0 | Yes |
| S117 | 30 | 0 | 5.0 | 5.0 | 5.0 | 5.0 | 5.0 | 5.0 | 5.0 | 0 | Yes |
| S118 | 30 | 1 | 5.0 | 5.0 | 5.0 | 5.0 | 5.0 | 5.0 | 5.0 | 0 | Yes |
| S119 | 30 | 2 | 5.0 | 5.0 | 5.0 | 5.0 | 5.0 | 5.0 | 5.0 | 0 | Yes |
| S120 | 30 | 3 | 5.0 | 5.0 | 5.0 | 5.0 | 5.0 | 5.0 | 5.0 | 0 | Yes |

Figure 70:
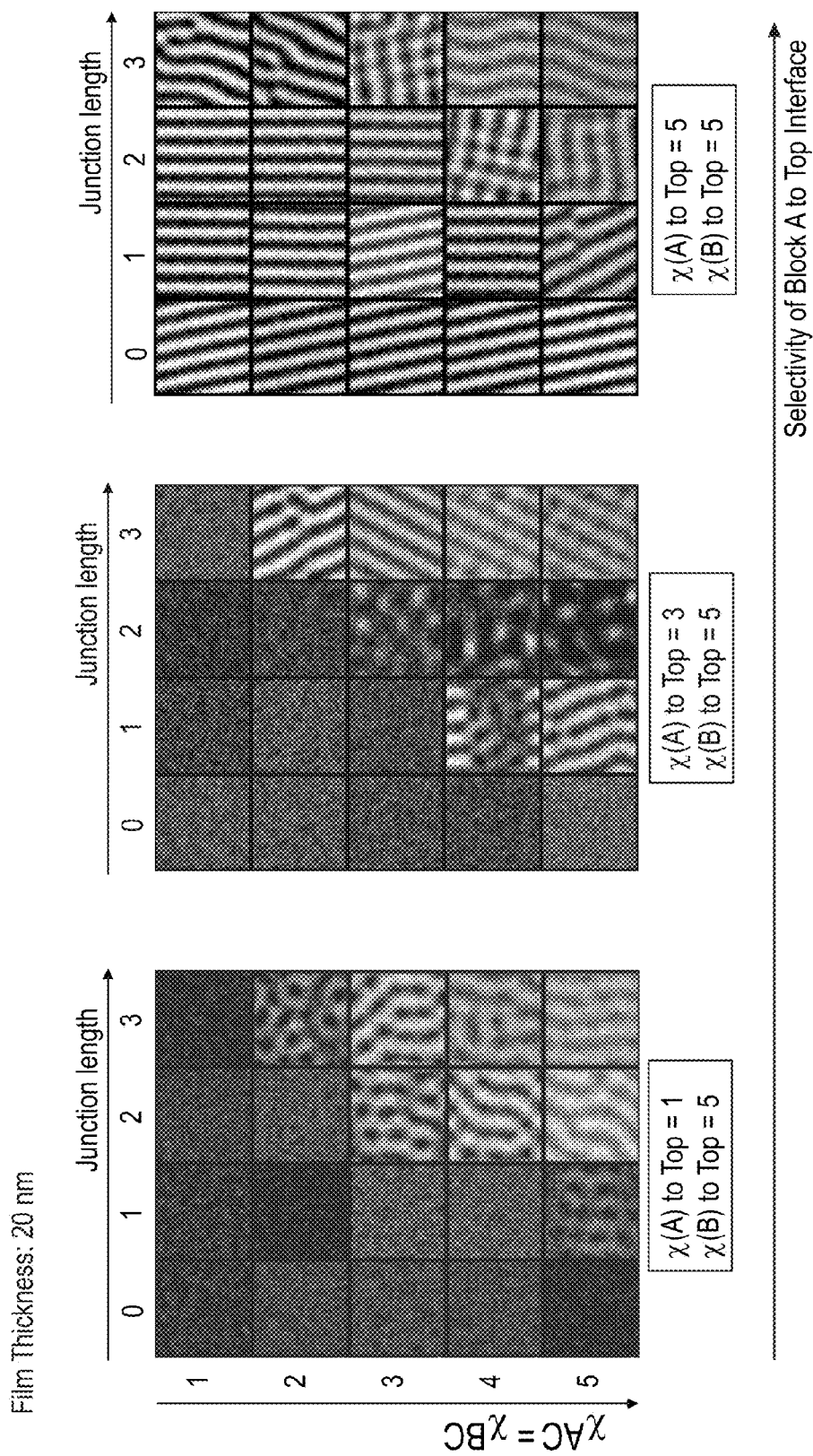
FIG. 70 is a top-down pictorial representation of the Monte Carlo calculations of Examples S1-S60 showing the dependence on selectivity of Block A to the top interface for a BCP film thickness of 20 nm.
Figure 71:
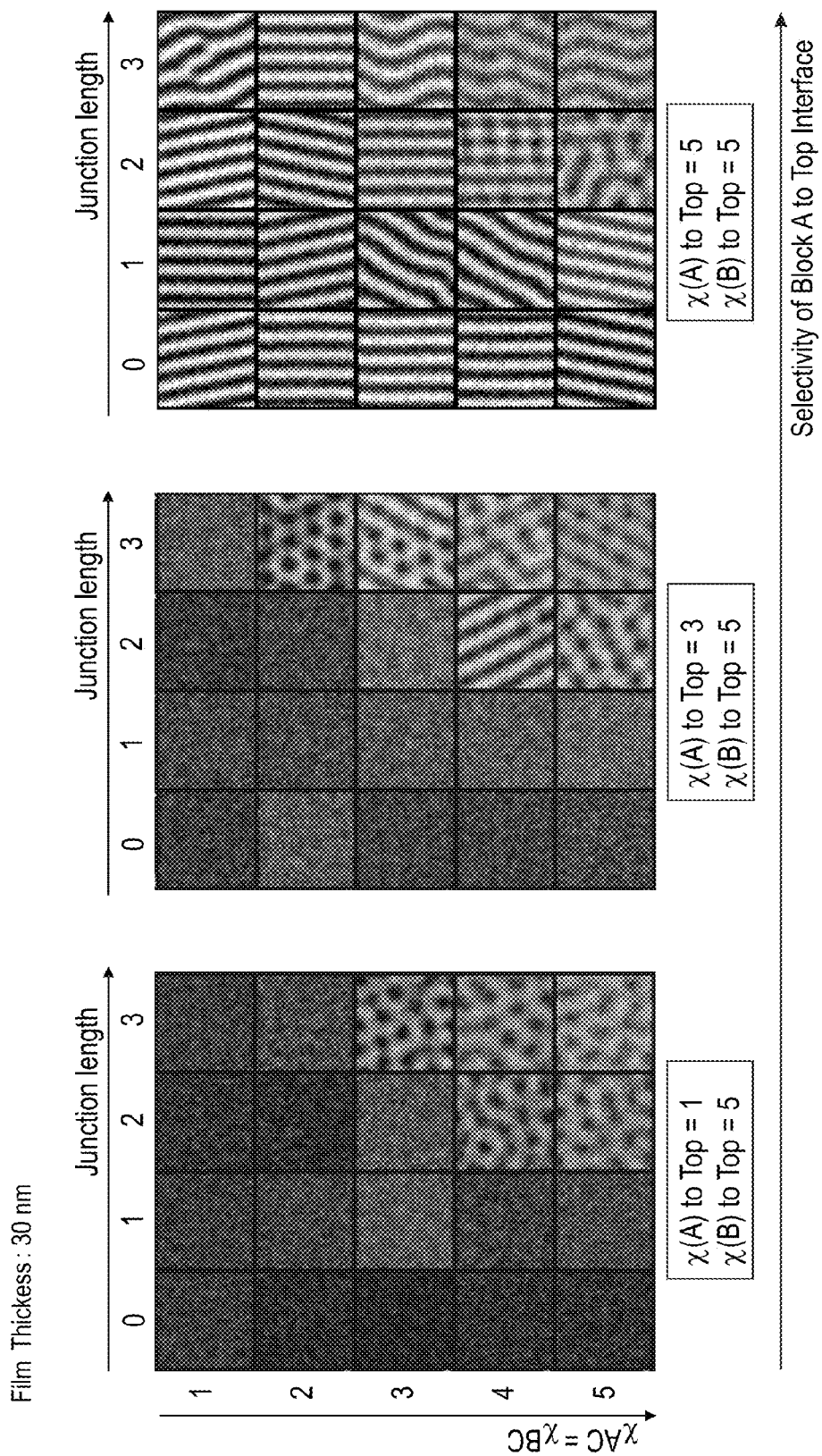
FIG. 71 is a top-down pictorial representation of the Monte Carlo calculations of Examples S61-S120 showing the dependence on selectivity of Block A to the top interface for a BCP film thickness of 30 nm.
Figure 72:
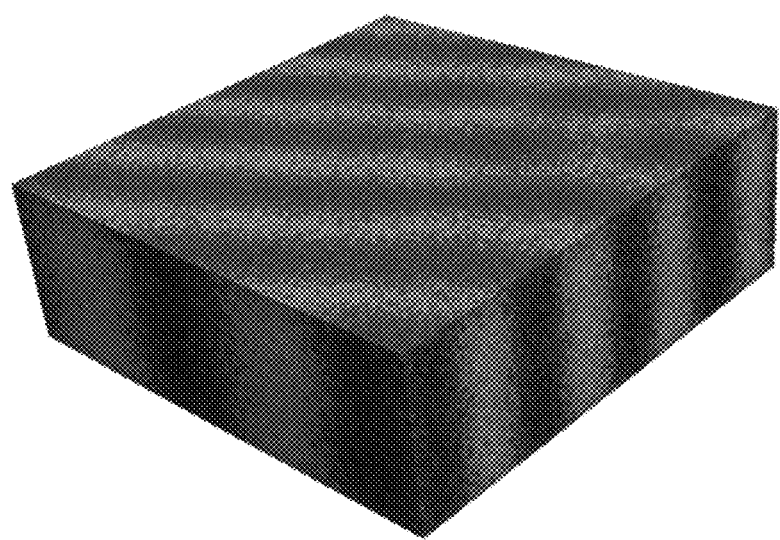
FIG. 72 is a 3D pictorial representation of the Monte Carlo calculations of Example S95 showing the formation of perpendicular lamellae for a BCP film with junction group.
Figure 73:
FIG. 73 is a 3D pictorial representation of the Monte Carlo calculations of Example S93 showing the formation of parallel lamellae for a BCP film without junction group.

The simulations held one interface neutral (non-preferential) while the other interface was varied from preferential to neutral. Also, interaction parameter of block A with the linking group (chi(AC)) was held equal to the interaction parameter of block B with the linking group (chi(BC)) for each change in chi of the blocks at the interfaces (chi(A) or chi(B)) and each change in chi of the linking group at the interfaces (chi(C)). "Length" in Table 12 means number of beads in the linking group. Lengths 0, 1, 2, 3, and 4 correspond to 0, 4, 8, 12, and 16 difluoromethylene groups, respectively, of the linking group. FIG. 70 is a top-down pictorial representation of the Monte Carlo calculations of Examples S1-S60 showing the dependence on selectivity of Block A to the top interface for a BCP film thickness of 20 nm. FIG. 71 is a top-down pictorial representation of the Monte Carlo calculations of Examples 561-5120 showing the dependence on selectivity of Block A to the top interface for a BCP film thickness of 30 nm. FIG. 72 is a 3D pictorial representation of the Monte Carlo calculations of Example S95 showing the formation of perpendicular lamellae for a BCP film with junction group (i.e., L' group). FIG. 73 is a 3D pictorial representation of the Monte Carlo calculations of Example S93 showing the formation of parallel lamellae for a BCP film without junction group.

The results indicate that a longer linking group is needed to obtain perpendicular orientation under the most non-neutral interface conditions, and this appears to be true regardless of interaction parameter between the linking group and the blocks. The results also indicate that as the interface becomes more neutral, the linking group chain length can be reduced until it is zero at neutrality (i.e., the linking group contains no difluoromethylene groups), and this seems to be true also at each interaction parameter value chi between the junction and the blocks. The results also indicate that longer linking groups are needed as the interaction parameter chi between the junction group (linking group L') and the blocks decreases. The results also indicate that a longer linking group is needed as the film thickness increases. These results are in agreement with the observations made on BCP-2 films, and show the general applicability of the fluorinated linking group L'.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A block copolymer, comprising:
   a first polymer block (block A), wherein block A comprises an ethylenic repeat unit of formula (A-1):

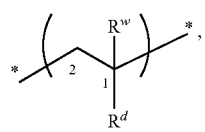

(A-1)

wherein i) backbone carbons of the block copolymer are numbered 1 and 2 in (A-1), ii) $R^w$ is a monovalent radical selected from the group consisting of H, F, methyl, ethyl, and trifluoromethyl (*—$CF_3$), and iii) $R^d$ is a monovalent radical comprising an aromatic ring linked to carbon 1;
   a second polymer block (block B) having a chemical structure different from block A and capable of phase-segregating from block A; and
   a divalent linking group L' covalently linking an end repeat unit of block A to an end repeat unit of block B, wherein L' comprises 1-24 fluorines, wherein each of the fluorines of L' is linked to a backbone carbon of the block copolymer.

2. The block copolymer of claim 1, wherein a film layer comprising the block copolymer is capable of self-assembling spontaneously and/or when thermally treated, thereby forming a pattern of phase-segregated alternating domains comprising respective chemically distinct blocks of the block copolymer.

3. The block copolymer of claim 1, wherein $R^w$ is H.

4. The block copolymer of claim 1, wherein L' has a lower surface energy than block A and a lower surface energy than block B.

5. The block polymer of claim 1, wherein L' has a surface energy between 0 and 30 mN/m.

6. The block polymer of claim 1, wherein L' comprises a fluorinated alkylene group of formula (C-1):

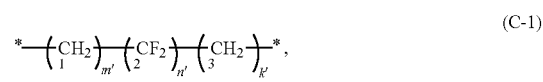

(C-1)

wherein
   backbone carbons of the block copolymer are numbered 1, 2, and 3 in (C-1),
   each carbon linked to a fluorine is a backbone carbon of the block copolymer,
   n' is an integer having a value of 2-12,
   m' is an integer having a value of 1-5, and
   k' is an integer having a value of 1-5.

7. The block copolymer of claim 1, wherein L' comprises a divalent linear fluorinated ethylene oxide group in accordance with formula (C-2):

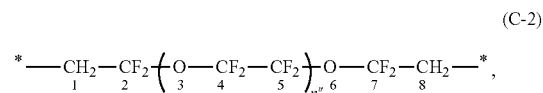

(C-2)

wherein
   backbone atoms of the block copolymer are numbered 1, 2, 3, 4, 5, 6, 7, and 8 in (C-2)
   each carbon linked to a fluorine is a backbone carbon of the block copolymer, and
   n" is an integer having a value of 1-5.

8. The block copolymer of claim 1, wherein block B comprises an aliphatic carbonate repeat unit.

9. The block copolymer of claim 8, wherein the aliphatic carbonate repeat unit comprises a pendent ester group.

10. The block copolymer of claim 9, wherein the aliphatic carbonate repeat unit has a structure according to formula (B-4):

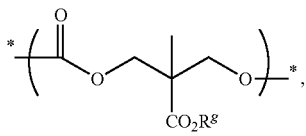

(B-4)

wherein $R^g$ is a monovalent hydrocarbyl group comprising 1-20 carbons.

11. The block copolymer of claim 10, wherein $R^g$ is selected from the group consisting of methyl, ethyl, propyl, butyl, pentyl, hexyl, and benzyl.

12. The block copolymer of claim 1, wherein the block B comprises an aliphatic ester repeat unit.

13. The block copolymer of claim 12, wherein the aliphatic ester repeat unit has a structure selected from the group consisting of

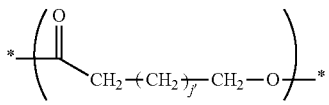

wherein j' is an integer having a value of 0-4, and

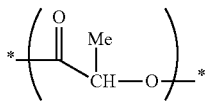

14. The block copolymer of claim 1, wherein block B comprises an aliphatic ether repeat unit.

15. The block copolymer of claim 14, wherein the aliphatic ether repeat unit is selected from the group consisting of ethylene oxide, propylene oxide, ring opened glycidyl ethers, and combinations thereof.

16. The block copolymer of claim 1, wherein block A comprises an ethylenic repeat unit selected from the group consisting of

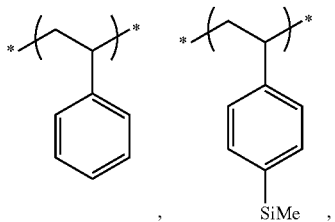

and combinations thereof.

17. The block copolymer of claim 1, wherein block B is a homopolymer comprising a repeat unit selected from the group consisting of

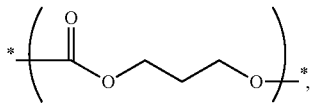

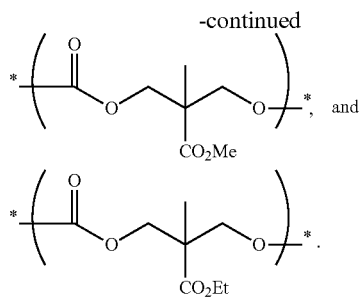

18. A composition, comprising:
a solvent; and
the block copolymer of claim 1;
wherein
the composition is capable of forming a film layer comprising the block copolymer, wherein the film layer is capable of self-assembling spontaneously and/or when thermally treated, thereby forming a pattern of phase-segregated alternating domains comprising respective chemically distinct blocks of the block copolymer.

19. A method, comprising:
providing a substrate which is a first layered structure comprising a top layer (underlayer);
forming a film layer comprising the block copolymer of claim 1 disposed on the underlayer, wherein the film layer has a top surface in contact with an atmosphere interface; and
allowing or inducing the block copolymer of the film layer to self-assemble using a thermal treatment, thereby forming a second layered structure comprising a phase-segregated domain pattern having a characteristic pitch (Lo), the domain pattern comprising perpendicularly oriented alternating domains comprising respective chemically distinct blocks of the block copolymer.

20. The method of claim 19, wherein the domain pattern comprises lamellar domains.

21. The method of claim 19, wherein the domain pattern comprises cylindrical domains.

22. The method of claim 19, wherein the characteristic pitch (Lo) is about 4 nm to about 80 nm.

23. The method of claim 19, wherein the underlayer is preferentially wetted by one of the domains of an otherwise identical self-assembled block copolymer in which all fluorines of L' are replaced by hydrogen.

24. The method of claim 19, wherein the atmosphere interface is preferentially wetted by one of the domains of an otherwise identical self-assembled block copolymer in which all fluorines of L' are replaced by hydrogen.

25. The method of claim 19, comprising selectively etching one of the domains, thereby forming a third layered structure comprising an etched domain pattern comprising one or more remaining domains of the self-assembled block copolymer.

26. The method of claim 25, comprising transferring the etched domain pattern to the substrate.

27. The method of claim 26, wherein said transferring the etched domain pattern to the substrate is performed using a tone inversion process with respect to the etched domain pattern.

28. The method of claim 19, wherein said inducing the block copolymer of the film layer to self-assemble using a thermal treatment comprises baking the film layer at a temperature between about 80° C. and about 250° C. for between about 1 second and about 24 hours.

29. The method of claim 19, wherein the method comprises forming a topographic resist pattern disposed on the underlayer before said disposing the composition of claim 15, wherein the film layer comprising the block copolymer for self-assembly is substantially confined to recessed regions of the topographic resist pattern.

30. A method, comprising:
providing a first multi-layered structure comprising a top surface having a pre-pattern for directing self-assembly of the block copolymer of claim 1;
forming a film layer comprising the block copolymer disposed on the top surface of pre-pattern, the film layer comprising a top surface in contact with an atmosphere interface, and the film layer comprising a bottom surface in contact with the top surface of the pre-pattern; and
allowing or inducing the block copolymer to self-assemble using a thermal treatment, thereby forming a second multi-layered structure comprising a pattern of phase-segregated domains (domain pattern) of the block copolymer, the domain pattern disposed on the top surface of the pre-pattern.

31. The method of claim 30, wherein the top surface of the pre-pattern is preferentially wetted by one of the domains of an otherwise identical self-assembled block copolymer in which all fluorines of L' are replaced by hydrogen, and the domains are oriented perpendicular to a main plane of a bottom layer of the first multi-layered structure.

32. The method of claim 30, comprising selectively removing one of the domains, thereby forming a third multi-layered structure comprising an etched domain pattern, the etched domain pattern comprising one or more remaining domains of the domain pattern.

33. The method of claim 32, comprising transferring the etched domain pattern to one or more underlying layers of the third multi-layered structure.

34. The method of claim 32, wherein said transferring the etched domain pattern is performed using a tone inversion process.

35. The method of claim 30, wherein the pre-pattern is a graphoepitaxial pre-pattern comprising topographical features having sidewall heights greater than or equal to the thickness of the film layer, and wherein the film layer is substantially confined to recessed regions of the pre-pattern.

36. The method of claim 30, wherein the pre-pattern is a chemo-epitaxial pre-pattern comprising topographical features having sidewall heights less than the thickness of the film layer, and wherein the film layer is disposed on the top-most and bottom-most surfaces of the pre-pattern.

37. A diblock copolymer of formula (D-1):

$$E^1\text{-}P'\text{-}L'\text{-}P''\text{-}E^2 \qquad (D\text{-}1),$$

wherein
$E^1$ is a monovalent first end group,
$E^2$ is a monovalent second end group,
P' is a first polymer chain representing a first block (block A) of the block copolymer, wherein block A comprises an ethylenic repeat unit of formula (A-1):

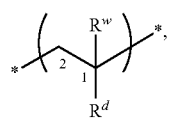

(A-1)

wherein i) backbone carbons of the block copolymer are numbered 1 and 2 in (A-1), ii) $R^w$ is a monovalent radical selected from the group consisting of H, F, methyl, ethyl, and trifluoromethyl (*—$CF_3$), and iii) $R^d$ is a monovalent radical comprising an aromatic ring linked to carbon 1,
P'' is a second polymer chain representing a second block (block B) of the block copolymer, and
L' is a divalent linking group joining an end repeat unit of P' to an end repeat unit of P'', wherein L' comprises 1-24 fluorines, and each of the fluorines of L' is linked to a backbone carbon of the block copolymer.

38. The diblock copolymer of claim 37, wherein the first block comprises a copolymer of styrene and trimethylsilylstyrene.

39. The diblock copolymer of claim 37, wherein L' is

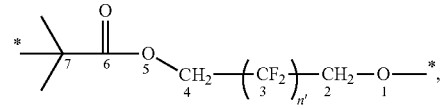

wherein backbone atoms of the block copolymer are numbered 1, 2, 3, 4, 5, 6, and 7 in L', and n' is an integer having a value of 1-12.

40. The diblock copolymer of claim 37, wherein L' is

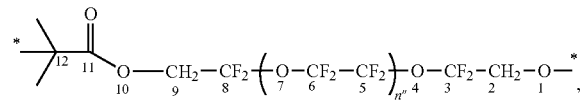

wherein backbone atoms of the block copolymer are numbered 1, 2, 3, 4, 5, 6, 7, 8, 9, 10, 11, and 12 in L', and n'' is an integer having a value of 1-5.

41. A block copolymer, comprising:
a first polymer block (block A);
a second polymer block (block B) having a chemical structure different from block A and capable of phase-segregating from block A, wherein block B comprises an aliphatic carbonate repeat unit; and
a divalent linking group L' covalently linking an end repeat unit of block A to an end repeat unit of block B, wherein L' comprises 1-24 fluorines, wherein each of the fluorines of L' is linked to a backbone carbon of the block copolymer.

42. The block copolymer of claim 41, wherein the aliphatic carbonate repeat unit comprises a pendent ester group.

43. The block copolymer of claim 42, wherein the aliphatic carbonate repeat unit has a structure according to formula (B-4):

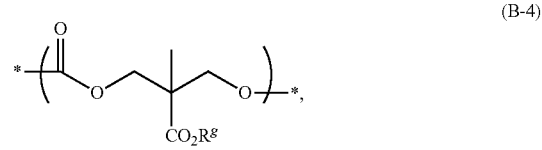

(B-4)

wherein $R^g$ is a monovalent hydrocarbyl group comprising 1-20 carbons.

44. The block copolymer of claim 43, wherein $R^g$ is selected from the group consisting of methyl, ethyl, propyl, butyl, pentyl, hexyl, and benzyl.

45. The block copolymer of claim 41, wherein block B is a homopolymer comprising a repeat unit selected from the group consisting of

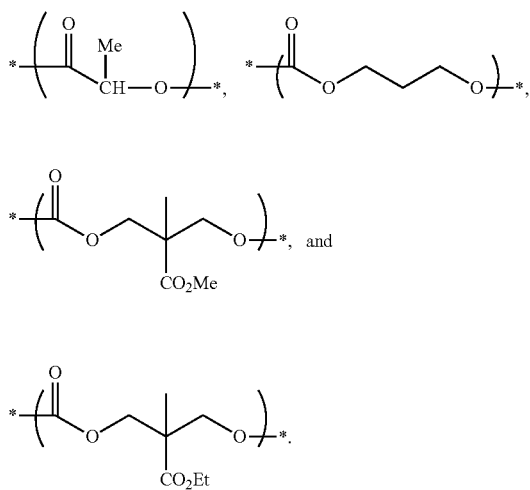

46. A diblock copolymer of formula (D-1):

$$E^1\text{-}P'\text{-}L'\text{-}P''\text{-}E^2 \qquad (D\text{-}1),$$

wherein
- $E^1$ is a monovalent first end group,
- $E^2$ is a monovalent second end group,
- P' is a first polymer chain representing a first block (block A) of the block copolymer,
- P'' is a second polymer chain representing a second block (block B) of the block copolymer, and
- L' is a divalent linking group joining an end repeat unit of P' to an end repeat unit of P'', wherein L' is

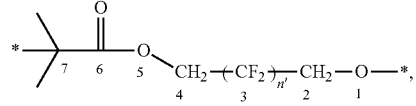

wherein backbone atoms of the block copolymer are numbered 1, 2, 3, 4, 5, 6, and 7 in L', and n' is an integer having a value of 1-12.

* * * * *